(12) United States Patent
Yamazaki et al.

(10) Patent No.: US 7,503,975 B2
(45) Date of Patent: *Mar. 17, 2009

(54) SEMICONDUCTOR DEVICE AND FABRICATION METHOD THEREFOR

(75) Inventors: Shunpei Yamazaki, Tokyo (JP); Toru Mitsuki, Kanagawa (JP); Kenji Kasahara, Kanagawa (JP); Taketomi Asami, Kanagawa (JP); Tamae Takano, Kanagawa (JP); Takeshi Shichi, Kanagawa (JP); Chiho Kokubo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/892,225

(22) Filed: Jun. 25, 2001

(65) Prior Publication Data

US 2002/0043660 A1 Apr. 18, 2002

(30) Foreign Application Priority Data

Jun. 27, 2000 (JP) ............................. 2000-193523
Jun. 27, 2000 (JP) ............................. 2000-193612

(51) Int. Cl.
*C30B 1/00* (2006.01)

(52) U.S. Cl. ..................... 117/4; 117/7; 117/8; 117/9; 117/904; 438/795

(58) Field of Classification Search ................ 117/4, 117/7, 8, 9, 904; 438/795
See application file for complete search history.

(56) References Cited

U.S. PATENT DOCUMENTS

| 4,569,894 | A |   | 2/1986  | Saitoh et al.          |
|-----------|---|---|---------|------------------------|
| 5,225,371 | A | * | 7/1993  | Sexton et al. ... 117/43 |
| 5,241,214 | A |   | 8/1993  | Herbots et al.         |
| 5,461,250 | A | * | 10/1995 | Burghartz et al. ... 257/347 |
| 5,578,520 | A | * | 11/1996 | Zhang et al. ... 438/487 |
| 5,591,653 | A |   | 1/1997  | Sameshima et al.       |
| 5,619,044 | A |   | 4/1997  | Makita et al.          |
| 5,643,826 | A |   | 7/1997  | Ohtani et al.          |

(Continued)

FOREIGN PATENT DOCUMENTS

JP          04-168769        6/1992

(Continued)

OTHER PUBLICATIONS

Patent Abstracts of Japan. English Abstract of JP 64-053408 (1989).*

(Continued)

*Primary Examiner*—Robert M Kunemund
*Assistant Examiner*—Matthew J Song
(74) *Attorney, Agent, or Firm*—Fish & Richardson P.C.

(57) ABSTRACT

In a crystalline silicon film fabricated by a related art method, the orientation planes of its crystal randomly exist and the orientation rate relative to a particular crystal orientation is low. A semiconductor material which contains silicon as its main component and 0.1-10 atomic % of germanium is used as a first layer, and an amorphous silicon film is used as a second layer. Laser light is irradiated to crystallize the amorphous semiconductor films, whereby a good semiconductor film is obtained. In addition, TFTs are fabricated by using such a semiconductor film.

48 Claims, 45 Drawing Sheets

U.S. PATENT DOCUMENTS

| | | | |
|---|---|---|---|
| 5,670,798 A * | 9/1997 | Schetzina | 257/96 |
| 5,712,191 A | 1/1998 | Nakajima et al. | |
| 5,726,487 A * | 3/1998 | Sameshima et al. | 257/616 |
| 5,753,541 A * | 5/1998 | Shimizu | 438/161 |
| 5,773,847 A | 6/1998 | Hayakawa | |
| 5,789,284 A | 8/1998 | Yamazaki et al. | |
| 5,879,976 A * | 3/1999 | Fujiwara | 438/163 |
| 5,888,858 A | 3/1999 | Yamazaki et al. | |
| 5,904,567 A | 5/1999 | Yamazaki | |
| 5,923,962 A | 7/1999 | Ohtani et al. | |
| 5,923,966 A * | 7/1999 | Teramoto et al. | 438/162 |
| 5,932,893 A | 8/1999 | Miyanaga et al. | |
| 5,943,560 A | 8/1999 | Chang et al. | |
| 5,977,560 A | 11/1999 | Banerjee et al. | |
| 6,048,780 A | 4/2000 | Hayakawa | |
| 6,066,547 A * | 5/2000 | Maekawa | 438/486 |
| 6,071,766 A | 6/2000 | Yamazaki et al. | |
| 6,087,679 A | 7/2000 | Yamazaki et al. | |
| 6,107,654 A | 8/2000 | Yamazaki | |
| 6,118,151 A * | 9/2000 | Tsutsu | 257/347 |
| 6,180,439 B1 | 1/2001 | Yamazaki et al. | |
| 6,287,944 B1 | 9/2001 | Hara et al. | |
| 6,307,214 B1 | 10/2001 | Ohtani et al. | |
| 6,307,220 B1 | 10/2001 | Yamazaki | |
| 6,335,541 B1 | 1/2002 | Ohtani et al. | |
| 6,346,716 B1 | 2/2002 | Yamazaki | |
| 6,388,270 B1 | 5/2002 | Yamazaki et al. | |
| 6,399,454 B1 | 6/2002 | Yamazaki | |
| 6,444,390 B1 | 9/2002 | Yamazaki et al. | |
| 6,452,211 B1 | 9/2002 | Ohtani et al. | |
| 6,475,840 B1 | 11/2002 | Miyanaga et al. | |
| 6,479,333 B1 | 11/2002 | Takano et al. | |
| 6,482,684 B1 * | 11/2002 | Yamazaki | 438/158 |
| 6,495,886 B1 | 12/2002 | Yamazaki et al. | |
| 6,551,907 B2 | 4/2003 | Ohtani | |
| 6,605,497 B2 | 8/2003 | Yamazaki et al. | |
| 6,610,996 B2 | 8/2003 | Yamazaki et al. | |
| 6,620,711 B2 | 9/2003 | Yamazaki | |
| RE38,266 E | 10/2003 | Yamazaki et al. | |
| 6,690,068 B2 | 2/2004 | Yamazaki et al. | |
| 6,693,044 B1 | 2/2004 | Yamazaki et al. | |
| 6,703,265 B2 | 3/2004 | Asami et al. | |
| 6,727,124 B2 | 4/2004 | Nakajima et al. | |
| 6,743,700 B2 | 6/2004 | Asami et al. | |
| 6,787,407 B2 | 9/2004 | Nakamura et al. | |
| 6,787,807 B2 | 9/2004 | Yamazaki et al. | |
| 6,803,296 B2 | 10/2004 | Miyairi | |
| 6,808,968 B2 | 10/2004 | Yamazaki et al. | |
| 6,812,081 B2 | 11/2004 | Yamazaki et al. | |
| 6,821,828 B2 | 11/2004 | Ichijo et al. | |
| 6,828,179 B2 | 12/2004 | Yamazaki et al. | |
| 6,828,587 B2 | 12/2004 | Yamazaki et al. | |
| 6,855,584 B2 | 2/2005 | Yamazaki et al. | |
| 6,867,077 B2 | 3/2005 | Nakazawa et al. | |
| 6,890,805 B2 | 5/2005 | Yamazaki et al. | |
| 6,913,956 B2 | 7/2005 | Hamada et al. | |
| 6,939,755 B1 | 9/2005 | Ohtani et al. | |
| 6,956,235 B2 | 10/2005 | Yamazaki et al. | |
| 6,962,837 B2 | 11/2005 | Yamazaki | |
| 6,974,732 B2 | 12/2005 | Ohtani et al. | |
| 6,991,997 B2 | 1/2006 | Takayama et al. | |
| 7,015,079 B2 | 3/2006 | Miyairi et al. | |
| 7,015,083 B2 | 3/2006 | Yamazaki et al. | |
| 7,022,589 B2 | 4/2006 | Yamazaki | |
| 7,026,197 B2 | 4/2006 | Nakajima et al. | |
| 7,037,811 B1 | 5/2006 | Yamazaki et al. | |
| 7,052,943 B2 | 5/2006 | Yamazaki et al. | |
| 7,115,452 B2 | 10/2006 | Yamazaki et al. | |
| 7,115,453 B2 | 10/2006 | Nakamura et al. | |
| 7,129,120 B2 | 10/2006 | Yamazaki | |
| 7,141,491 B2 | 11/2006 | Yamazaki et al. | |
| 7,141,822 B2 | 11/2006 | Nakamura et al. | |
| 7,199,027 B2 | 4/2007 | Ichijo et al. | |
| 7,306,982 B2 | 12/2007 | Yamazaki et al. | |
| 7,316,947 B2 | 1/2008 | Yamazaki et al. | |
| 2002/0008286 A1 | 1/2002 | Yamazaki et al. | |
| 2002/0038889 A1 | 4/2002 | Yamazaki et al. | |
| 2002/0043662 A1 | 4/2002 | Yamazaki et al. | |
| 2002/0151120 A1 | 10/2002 | Yamazaki et al. | |
| 2003/0001098 A1 | 1/2003 | Stoddart et al. | |
| 2003/0010980 A1 | 1/2003 | Yamazaki et al. | |
| 2004/0108576 A1 | 6/2004 | Yamazaki et al. | |
| 2004/0201022 A1 | 10/2004 | Yamazaki et al. | |

FOREIGN PATENT DOCUMENTS

| | | | |
|---|---|---|---|
| JP | 04163910 A * | 6/1992 | |
| JP | 04168769 A * | 6/1992 | |
| JP | 07-130652 | 5/1995 | |
| JP | 08-078329 | 3/1996 | |
| JP | 11-204435 | 7/1999 | |
| JP | 11340473 A * | 12/1999 | |

OTHER PUBLICATIONS

Patent Abstracts of Japan. Engilsh abstract of JP 04-168769 (1992).*
Patent Abstracts of Japan. Engilsh Abstract of JP 03-284882 (1991).*
Patent Abstracts of Japan. Engilsh Abstract of JP 59-129859 (1984).*
FLS, Inc., English Translation of JP 04-0168769. Feb. 2005, p. 1-11.*
Patent abstracts of Japan. English Abstract of JP 04-163910 (1992).*
Patent Abstracts of Japan. English Abstract of JP 11-340473 (1999).*
U.S. Appl. No. 09/227,577, filed Jan. 8, 1999.
Ishihara, et al., "Microtexture Analysis of Location Controlled Large Si Grain Formed by Excimer-Laser Crystallization Method", AM-LCD 99, Digest of Technical Papers, pp. 99-102, Jul. 1999, Tokyo, Japan.
U.S. Appl. No. 09/874,204, filed Jun. 6, 2001 entitled "Thin Film Transistors and Semiconductor Device", Specification 44 pages; 132 Claims; Abstract 1 page; Drawings 24 Figs.
U.S. Appl. No. 09/880,089, filed Jun. 14, 2001 entitled "Semiconductor Device", Specification 65 pages; 50 Claims; Abstract 1 page; Drawings 45 Figs.
U.S. Appl. No. 09/882,265, filed Jun. 18, 2001 entitled "Semiconductor Device", Specification 100 pages; 52 Claims; Abstract 1 page; Drawings 32 Figs.
Sasaki et al., "A New Low-Temperature Poly-Si TFT Technology Realizing Mobility above 500 $cm^2$/Vs by Using CW Laser Lateral Crystallization (CLC)", Journal of Institute of Electronics, Information and Communication Engineers, C, vol. J85-C, No. 8, pp. 601-608, Aug. 2002. [Partial Translation Enclosed].
Haji et al., "Mode of Growth and Microstructure of Polycrystalline Silicon Obtained by Solid-Phase Crystallization of an Amorphous Silicon Film," J. Appl. Phys. 75 (8), Apr. 15, 1994, pp. 3944-3952.
Hayzelden et al., "Silicide Formation and Silicide-Mediated Crystallization of Nickel-Implanted Amorphous Silicon Thin Films," J. Appl. Phys. 73 (12), Jun. 15, 1993, pp. 8279-8289.

* cited by examiner

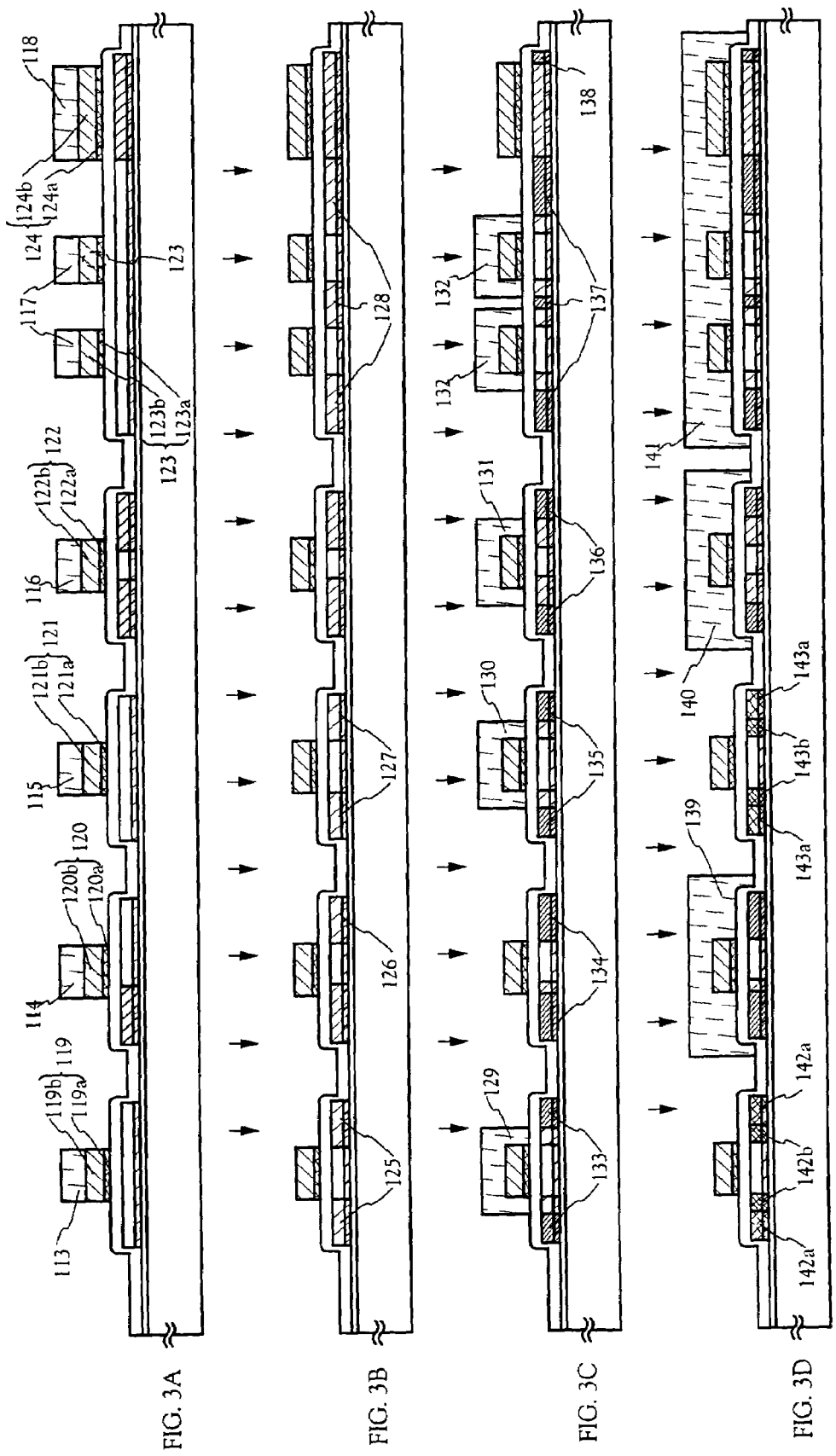

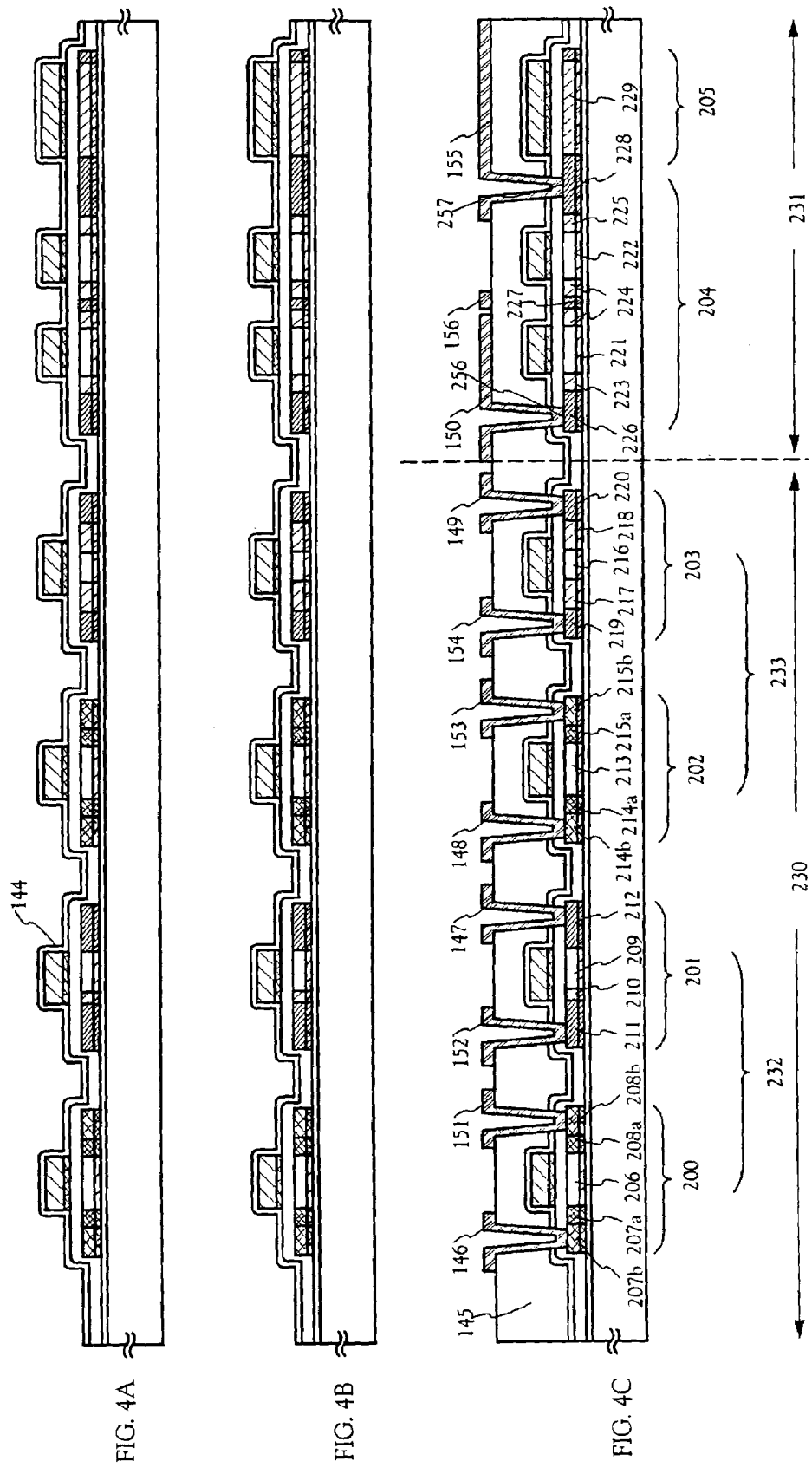

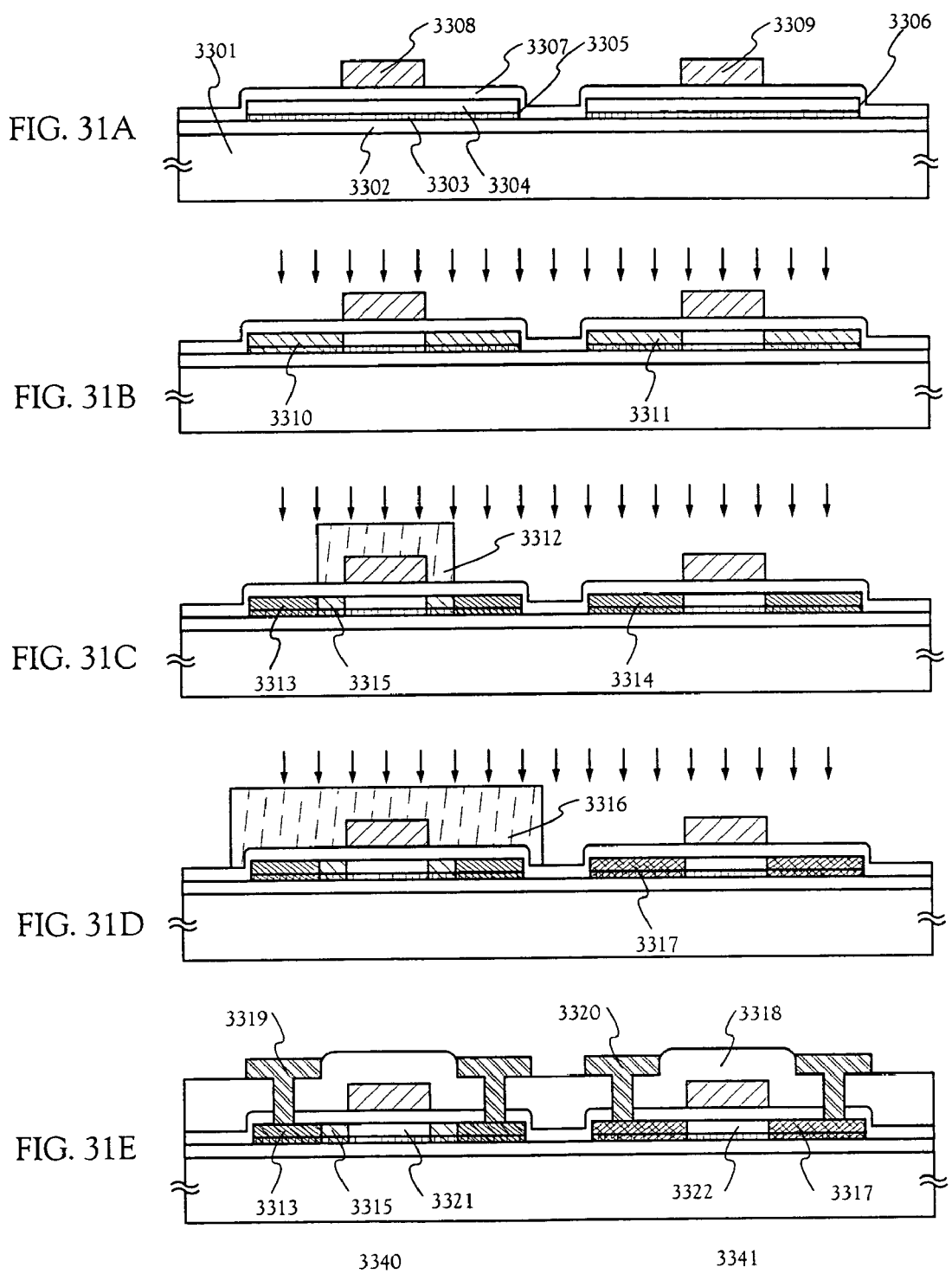

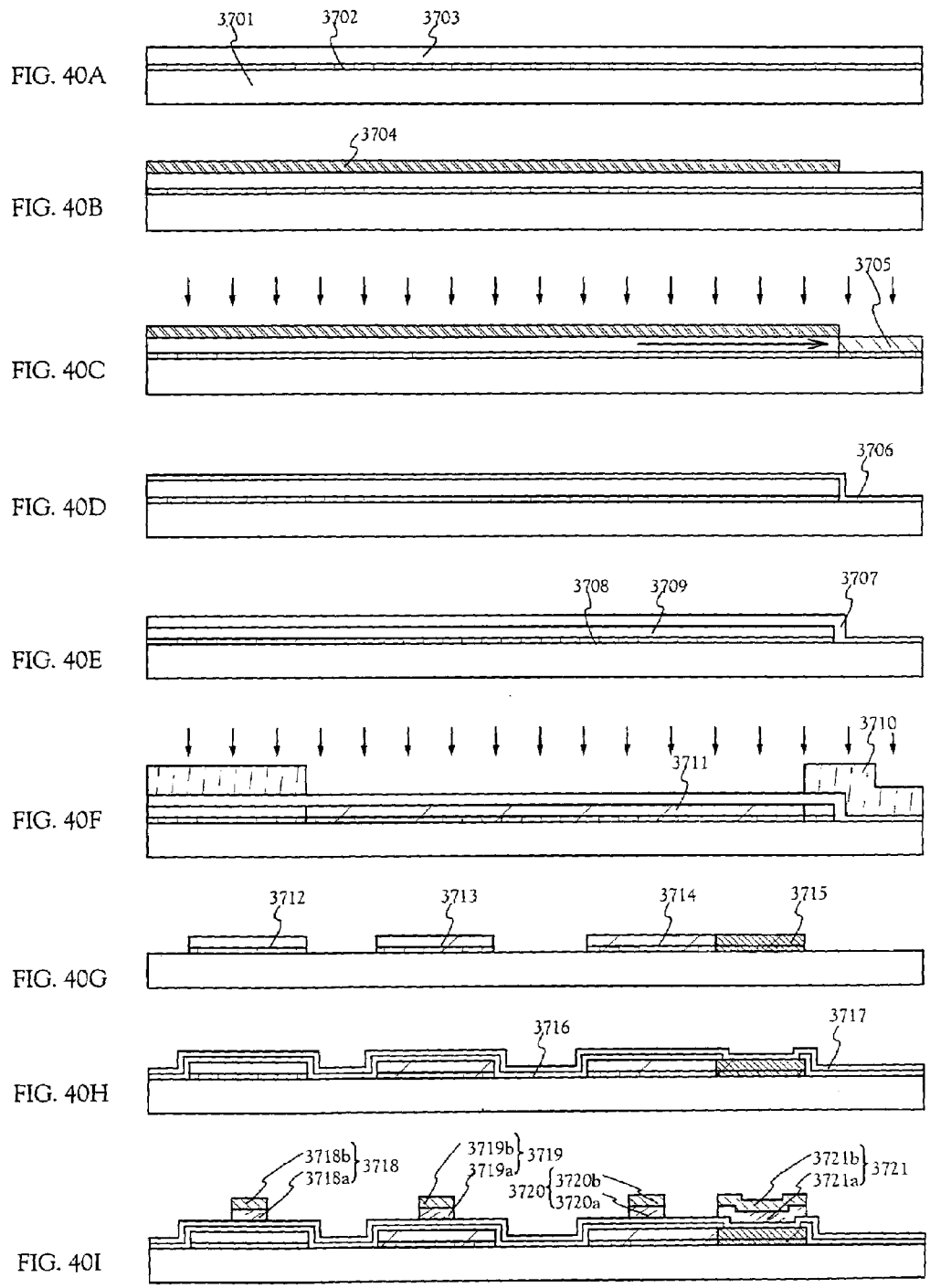

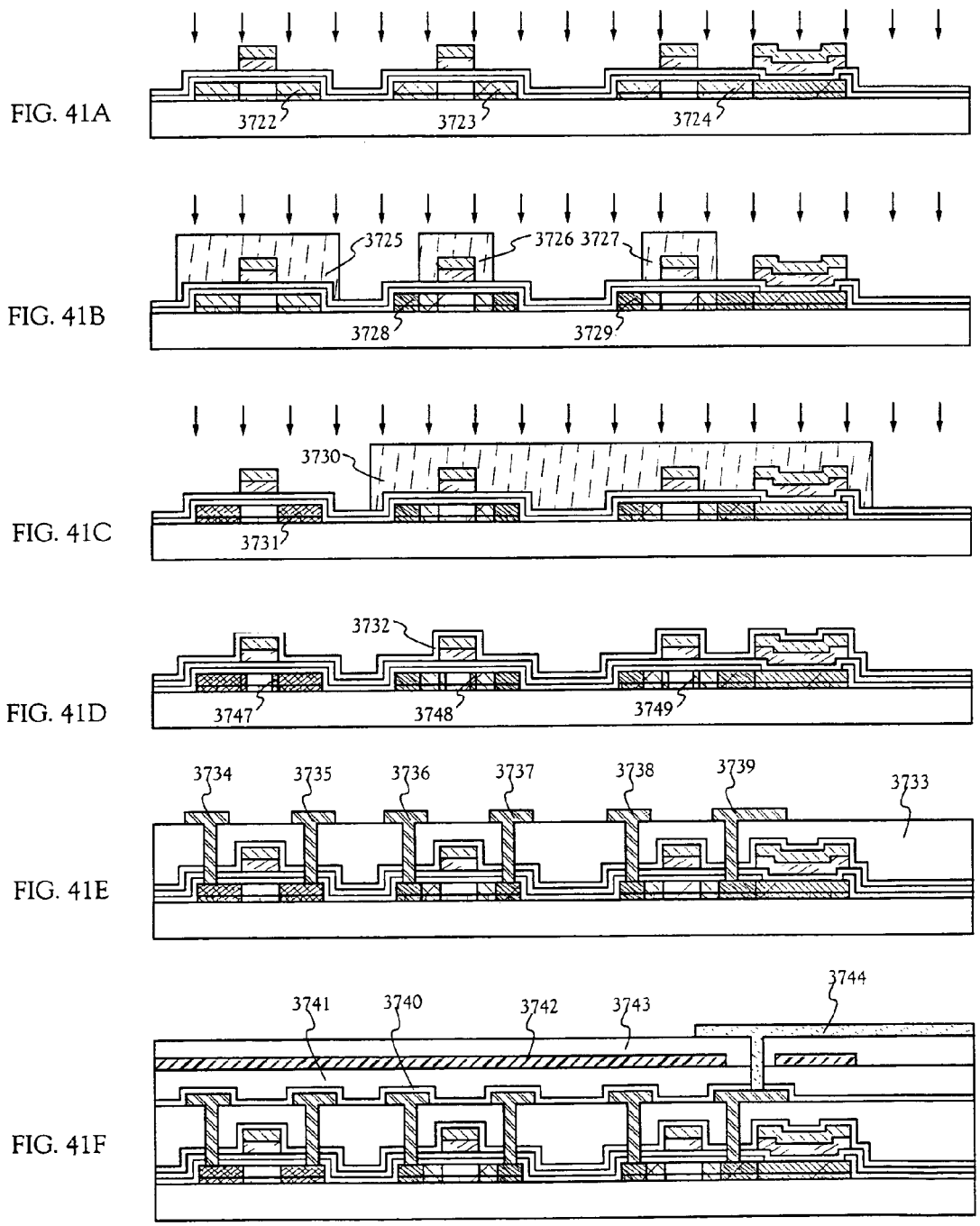

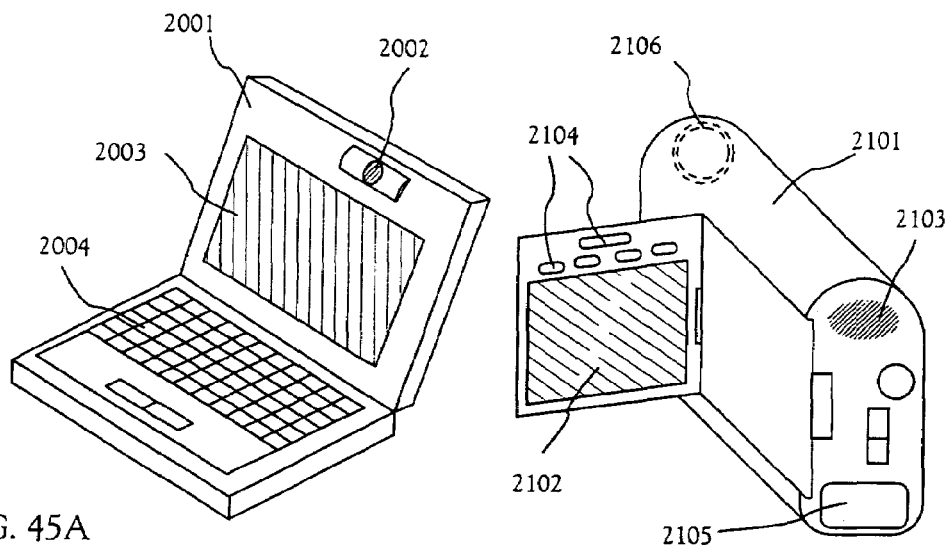
FIG. 45A
FIG. 45B
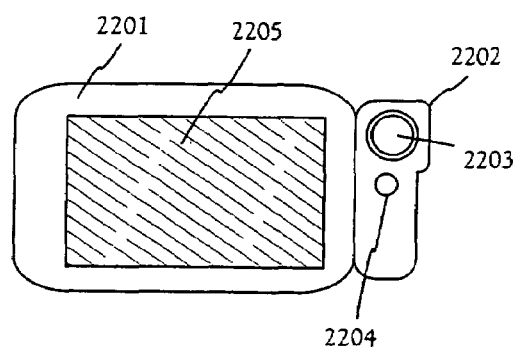
FIG. 45C
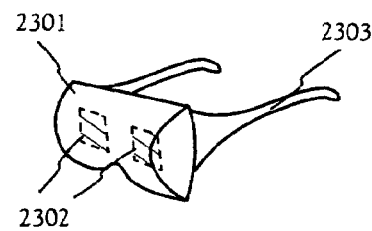
FIG. 45D
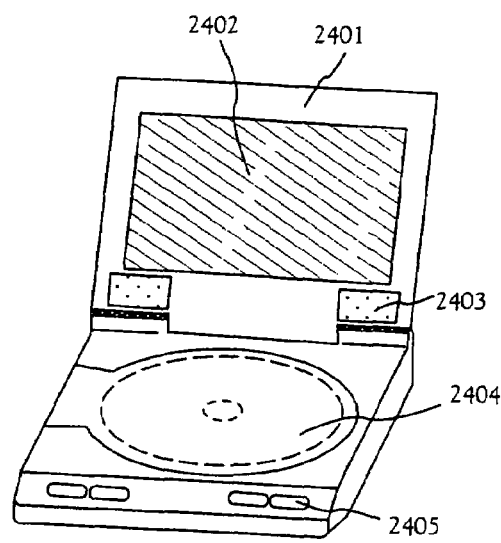
FIG. 45E
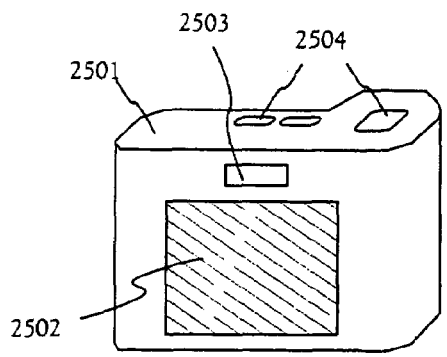
FIG. 45F

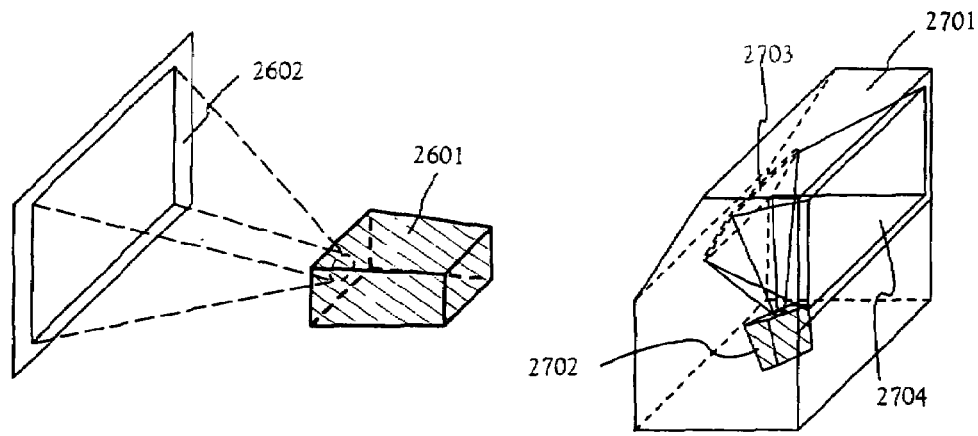
FIG. 46A
FIG. 46B
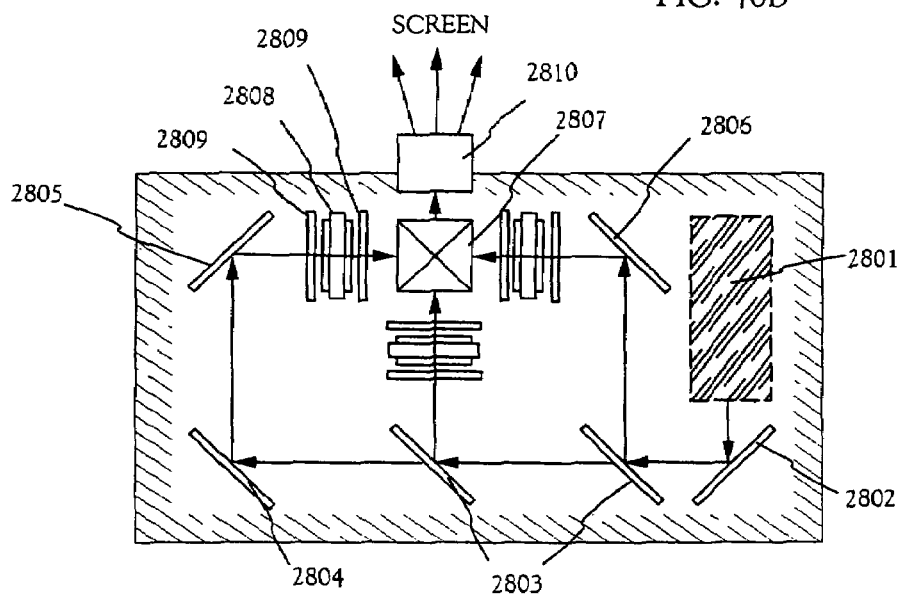
FIG. 46C
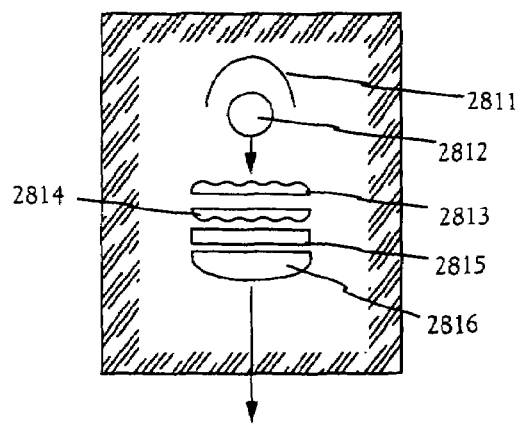
FIG. 46D

SEMICONDUCTOR DEVICE AND FABRICATION METHOD THEREFOR

BACKGROUND OF THE INVENTION

1. Field of the Invention

The present invention relates to a semiconductor device in which channel formation regions are formed of a semiconductor film having a crystalline structure. More particularly, the invention relates to a semiconductor device having a circuit made of thin film transistors (hereinafter referred to as TFTs) as well as to a fabrication method for such a semiconductor device. For example, the invention relates to an electrooptical device represented by a liquid crystal display panel as well as to electronic apparatus provided with such an electrooptical device as a component.

Incidentally, the term "semiconductor device" used herein generally denotes devices which function by using semiconductor characteristics, and encompasses semiconductor integrated circuits and electrooptical devices as well as electronic apparatus provided with semiconductor integrated circuits and electrooptical devices.

2. Prior Art

In recent years, the art of fabricating thin film transistors (hereinafter referred to as TFTs) by using a semiconductor film having a crystalline structure with a thickness of about several nm to about several hundred nm (hereinafter referred to as a crystalline semiconductor film) has been developed. The practical application of TFTs to switching elements for use in liquid crystal display devices has proceeded, and it has recently been possible to form semiconductor integrated circuits on a glass substrate by using TFTs.

Silicon is mainly used as the material of a crystalline semiconductor film which is used for TFTs. A silicon film having a crystalline structure (hereinafter referred to as crystalline silicon film) has been fabricated by applying heat treatment or irradiation with laser light (hereinafter referred to as laser treatment) to an amorphous silicon film deposited on a substrate such as glass or quartz by a plasma CVD method or a reduced-pressure CVD method.

For example, in the case of heat treatment, to crystallize the amorphous silicon film, heat treatment needs to be performed at a temperature of 600° C. or more for 10 hours or more. These treatment temperature and treatment time are not necessarily regarded as an appropriate method in terms of productivity of TFTs. Referring to a liquid crystal display device as a product using TFTs by way of example, a larger-sized heat treatment furnace is needed to cope with larger areas of substrates, so that not only does energy consumption increase in a production process, but an uniform crystal is difficult to form over a wide area.

TFTs using a crystalline silicon film fabricated by a conventional art are still inferior in characteristic to MOS transistors using single-crystal silicon substrates. Even if a semiconductor film having a thickness of about several nm to about several hundred nm is crystallized on a different kind of material such as glass or quartz, it is only possible to obtain a polycrystalline structure made of an aggregation of plural crystal grains. In the polycrystalline structure, carriers are trapped by multiple defects present in the crystal grains and grain boundaries, and the performance of TFTs is confined by the trapped carriers.

A representative crystalline semiconductor material to be applied to TFTs is silicon, and a silicon film having a crystalline structure (hereinafter referred to as a crystalline silicon film) is fabricated by crystallizing the amorphous silicon film by applying heat treatment or irradiation with laser light (hereinafter referred to as laser treatment) to an amorphous silicon film deposited on a substrate such as glass or quartz by a plasma CVD method or a reduced-pressure CVD method. However, the semiconductor-film thickness required for TFTs is approximately 10-100 nm, and with this semiconductor-film thickness, it is difficult to form a high-quality crystalline semiconductor film on a substrate made of different kinds of materials such as glass and quartz.

In the case of heat treatment, to crystallize the amorphous silicon film, heat treatment needs to be performed at a temperature of 600° C. or more for 10 hours or more. These treatment temperature and treatment time are not necessarily regarded as an appropriate method in terms of productivity of TFTs. Referring to a liquid crystal display device as a applied product using TFTs, a larger-sized heat treatment furnace is needed to cope with larger areas of substrates, so that not only does energy consumption increase in a production process, but an uniform crystal is difficult to form over a wide area. In the case of laser treatment, an uniform crystal is difficult to obtain, because of the instability of the output of a laser oscillator. Nonuniformity in the quality of crystals causes nonuniformity in the characteristics of TFTs.

As another technique for forming a crystalline silicon film, there is disclosed the art of introducing a metal element which promotes crystallization of silicon, into an amorphous silicon film and fabricating a crystalline silicon film at a heat treatment temperature lower than conventional temperatures. For example, in accordance with Japanese Patent Laid-Open Nos. 7-130652 and 8-78329, a metal element such as nickel is introduced into an amorphous silicon film and a crystalline silicon film is obtained by a 4-hour heat treatment of 550° C.

The crystalline semiconductor film fabricated by any of the above-described related art methods has the property that since crystallization is influenced by a substrate or an undercoat insulating film, plural crystal grains are precipitated and are apt to be oriented with respect to a {111} plane, but the proportion at which the crystal grains are oriented with respect to the orientation plane is low.

A first aspect of the invention is to solve the above-described problem as well as to improve the characteristics of a crystalline semiconductor film obtained by crystallizing an amorphous silicon film and provide a TFT which uses the crystalline semiconductor layer as an active layer.

If an amorphous semiconductor film on a substrate such as glass or quartz is crystallized by either of the above-described methods (Japanese Patent Laid-Open Nos. 7-130652 and 8-78329), a polycrystalline structure is normally obtained. It is considered that the crystallization of the amorphous semiconductor film proceeds on the basis of crystal nuclei which naturally occur at the interface between the amorphous semiconductor film and the substrate. Individual crystal grains in the polycrystalline structure are precipitated with respect to arbitrary crystal planes, but the probability that a crystal is precipitated on a (111) plane where the interfacial energy between the semiconductor film and an underlying silicon oxide is smallest.

If an amorphous silicon film is to be crystallized by introducing an element which promotes crystallization of silicon into the amorphous silicon film, silicides of the element introduced at a temperature lower than the temperature at which natural nuclei occur are formed, and crystal growth based on the silicides occurs. For example, the resultant $NiSi_2$ has no particular orientation, but if the thickness of the amorphous silicon film is made 20-100 nm, $NiSi_2$ is allowed to grow only in a direction parallel to the substrate surface. In this case, since the interfacial energy at which $NiSi_2$ and the (111) plane of crystalline silicon are in contact with each other is smallest, a plane parallel to the surface of the crystalline silicon film is a (110) plane, and crystal grains are oriented in a preferred manner with respect to this (110) lattice plane. If a crystal grows in a columnar shape in a direction parallel to the substrate surface, the degree of freedom exists in the direction of rotation about the columnar crystal, so that the (110) plane is not necessarily oriented and the other planes are also precipitated. The proportion at which the crystal grains are oriented with respect to the (110) plane is not more than 20% of the entirety.

In the case of a low orientation ratio, at a grain boundary where crystals of different orientations meet, it is nearly impossible to retain the continuity of a lattice, so that it can readily be inferred that a large number of unpaired bonds are formed. The unpaired bonds formed at the grain boundary become recombination centers or trapping centers, and lower the transport characteristics of carriers (electrons or holes). As a result, carriers vanish due to recombination or trapped in defects, so that even if TFTs are fabricated with this crystalline semiconductor film, it is impossible to expect TFTs having high field effect mobilities.

In addition, it is nearly impossible to intentionally control the positions of crystal grains, and crystal grains randomly exist, so that the channel formation regions of TFTs cannot be formed with crystal grains having a particular crystal orientation. This fact is considered to be a very serious problem in that the uniformity of the electrical characteristics of TFTs is impaired.

SUMMARY OF THE INVENTION

A first aspect of the invention is to solve the above-described problems as well as to improve the orientation rate of a crystalline semiconductor film obtained by crystallizing an amorphous silicon film and a second aspect of the invention is to provide a TFT which uses such a crystalline semiconductor layer.

To achieve the first aspect, the invention disclosed herein provides a semiconductor device having a semiconductor layer on an insulating surface, and the semiconductor layer has a first crystalline semiconductor layer 15 which contains germanium, and a second crystalline semiconductor film 16 which is in contact with the first crystalline semiconductor layer.

In the above constitution, the first crystalline semiconductor layer 15 comprises germanium in the range of 0.1 atomic % to less than 10 atomic %, more preferably 1 to 5 atomic %. In the above constitution, the second crystalline semiconductor film 16 contains silicon as its main component. Each of the concentrations of nitrogen and carbon contained in each of the crystalline silicon films 15 and 16 is less than $5\times10^{18}/cm^3$, while the concentration of oxygen contained in each of the crystalline silicon films 15 and 16 is less than $1\times10^{19}/cm^3$.

In the above constitution, the first crystalline semiconductor layer 15 and the second crystalline semiconductor film 16 are crystallized by laser light.

To achieve the above constitution, the invention provides a method of fabricating a semiconductor device, and as shown in FIGS. 1A-1C, the method comprises: a first step of forming a first amorphous semiconductor film 11 which contains germanium, on an insulating surface; a second step of forming a second amorphous semiconductor film 12 in contact with the first amorphous semiconductor film 11; and a third step of crystallizing the first amorphous semiconductor film 11 and the second amorphous semiconductor film 12 by irradiation with laser light.

To achieve another constitution, the invention provides a method of fabricating a semiconductor device, and as shown in FIGS. 6A-6D, the method comprises: a first step of forming insulating films 403a and 403b which cover electrodes (gate electrodes 401 and 402) on an insulating surface; a second step of forming a first amorphous semiconductor film which contains germanium, on the insulating surface; a third step of forming a second amorphous semiconductor film on the first amorphous semiconductor film; and a fourth step of crystallizing the first amorphous semiconductor film and the second amorphous semiconductor film by irradiation with laser light.

In the above constitution, the first amorphous semiconductor film contains germanium in the range of 0.1 atomic % to less than 10 atomic %, more preferably 1 to 5 atomic %. In the above constitution, the second amorphous semiconductor film contains silicon as its main component. Each of the concentrations of nitrogen and carbon contained in each of the amorphous semiconductor films 11 and 12 is less than $5\times10^{18}/cm^3$, while the concentration of oxygen contained in amorphous semiconductor films 11 and 12 is less than $1\times10^{19}/cm^3$.

To achieve the second aspect, the invention provides a semiconductor device in which a channel formation region is formed of a semiconductor layer having a crystalline structure, and the semiconductor layer is made of a first semiconductor film which contains silicon as its main component and germanium, and a second semiconductor film which contains silicon as its main component. Each of the concentrations of nitrogen and carbon contained in each of the first and second semiconductor layers is less than $5\times10^{18}/cm^3$, while the concentration of oxygen contained in each of the first and second semiconductor layers is less than $1\times10^{19}/cm^3$.

The invention provides a semiconductor device in which a channel formation region is formed of a semiconductor layer having a crystalline structure, and the semiconductor layer is made of a first semiconductor film which contains silicon as its main component as well as an element which is larger in atomic radius than silicon; and a second semiconductor film which contains silicon as its main component. Each of the concentrations of nitrogen and carbon contained in each of the first and second semiconductor layers is less than $5\times10^{18}/cm^3$, while the concentration of oxygen contained in each of the first and second semiconductor layers is less than $1\times10^{19}/cm^3$.

To achieve another constitution, the invention provides a fabrication method comprising: a first step of forming a first amorphous semiconductor film which contains silicon as its main component as well as germanium, on an insulating surface; a second step of forming a second amorphous semiconductor film which contains silicon as its main component, on the first amorphous semiconductor film; a third step of adding an element which promotes crystallization of silicon, to the first amorphous semiconductor film or the second amorphous semiconductor film; and a fourth step of crystallizing the first amorphous semiconductor film and the second amorphous semiconductor film through heat treatment, thereby forming a first crystalline silicon film and a second crystalline silicon film.

The invention also provides a fabrication method comprising: a first step of forming on an insulating surface a first amorphous semiconductor film which contains silicon as its main component as well as an element which is larger in atomic radius than silicon; a second step of forming a second amorphous semiconductor film which contains silicon as its main component, on the first amorphous semiconductor film; a third step of adding an element which promotes crystallization of silicon, to the first amorphous semiconductor film or the second amorphous semiconductor film; and a fourth step of crystallizing the first amorphous semiconductor film and the second amorphous semiconductor film through heat treatment, thereby forming a first crystalline silicon film and a second crystalline silicon film.

The distribution of a crystal orientation can be obtained from an electron backscatter diffraction pattern (EBSP). EBSP is a technique for analyzing crystal orientations from the backscattering of primary electrons by means of a scanning electron microscope (SEM) to which a dedicated detector is fitted (this technique will be hereinafter called the EBSP method for the sake of convenience). The evaluation of crystalline semiconductor films through EBSP is introduced in "Microtexture Analysis of Location Controlled Large Si Grain Formed by Exciter-laser Crystallization Method: R. Ishihara and P. F. A. Alkemade, AMLCD '99 Digest of Technical Papers 1999 Tokyo Japan, pp.99-102".

In this measurement method, when an electron beam is made incident on a specimen having a crystalline structure, inelastic scattering occurs backwardly as well, and a linear pattern (generally called a Kikuchi pattern) peculiar to the crystal orientation, which results from Bragg diffraction in the specimen, is also observed in the inelastic scattering. The EBSP method finds the crystal orientation of the specimen by analyzing a Kikuchi pattern displayed on the detector screen. By repeating an orientation analysis while moving the location on the specimen to be irradiated with an electron beam (mapping measurement), it is possible to obtain information on the crystal orientations of the planar specimen. The thicknesses of incident electron beams differ according to the types of electron guns of scanning electron microscopes, and in the case of a Schottky type field emission electron gun, an electron beam as thin as 10-20 nm is irradiated. In mapping measurements, as the number of measurement points is larger and a measurement area is wider, more average information on crystal orientations can be obtained. Actually, measurements on the order of 10,000 points (1 µm apart) to 40,000 points (0.5 µm apart) are performed on an area of 100×100 µm$^2$.

If the crystal orientation of each crystal grain is found from mapping measurements, the states of the crystal orientations of the film can be statistically displayed. FIG. 42A shows an example of an inverse pole figure obtainable from the EBSP method. Inverse pole figures are widely used for representing the preferred orientations of polycrystals, and collectively represents which lattice plane corresponds to a particular face of a specimen (in FIG. 42A, a surface of a film).

The fan-shaped frame shown in FIG. 42A is generally called a standard triangle, and all indices in a cubic crystal system are contained in this standard triangle. In this triangle, individual lengths correspond to angles in the crystal orientations. For example, the length between {001} and {101} is 45 degrees, the length between {101} and {111} is 35.26 degrees, and the length between {111} and {001} is 54.74 degrees. White dashed lines indicate the ranges of deviation angles of 5 degrees and 10 degrees from {101}, respectively.

In FIG. 42A, all measurement points in mapping (in this example, 11,655 points) are plotted in the standard triangle. It is seen that the density of points is high near {101}. FIG. 42B is a view representing the degree of concentration of these points in contour. Each numerical value shown in FIG. 42B represents magnification as a dimensionless number, with respect to the case where it is assumed that each crystal grain has a completely chaotic orientation, i.e., the points are uniformly distributed in the standard triangle.

In this manner, if it is discovered that the crystal grains oriented in a preferred manner with respect to a particular index (in this example, {101}), the degree of the preferred orientation can be readily imagined by numerically expressing a ratio indicative of the extent to which the crystal grains are concentrated near the index. In the inverse pole figure shown in FIG. 42A by way of example, the ratio of the number of points present in each of the ranges of the deviation angles of 5 degrees and 10 degrees (shown by the respective white dashed lines in FIG. 4A) to the total number of points present in the entire area can be found as an orientation ratio from the following equation:

[Equation 1]

This ratio can also be described in the following manner. In the case where the distribution is concentrated near {101} as shown in FIG. 42A, the <101> orientation of each grain in an actual film is approximately perpendicular to the substrate, but it is expected that the <101> orientation of each grain appears with a small fluctuation relative to the perpendicular line. The allowable values of 5 degrees and 10 degrees are set for the angle of this fluctuation, and the proportion of crystal grains having fluctuation angles smaller than those allowable values is numerically represented. As described above, the allowable deviation angles are defined as 5 degrees and 10 degrees and the proportions of crystal grains which satisfy those allowable deviation angles are represented, whereby the orientation rate can be found.

BRIEF DESCRIPTION OF THE DRAWINGS

FIGS. 3A to 3D are views showing the process of fabricating the AM-LCD of Embodiment 1;

FIGS. 4A to 4C are views showing the process of fabricating the AM-LCD of Embodiment 1;

FIGS. 31A to 31E are cross-sectional views for explaining the process of fabricating a CMOS circuit using a crystalline semiconductor film according to Embodiment 18;

FIG. 40 is a cross-sectional view for explaining the process of fabricating TFTs of a driver circuit and a pixel section by using a crystalline semiconductor film according to Embodiment 23;

FIGS. 41A to 41F are cross-sectional views for explaining the process of fabricating TFTs of a driver circuit and a pixel section by using a crystalline semiconductor film according to Embodiment 23;

FIGS. 45A to 45F are views showing different examples of electronic apparatus of Embodiment 26;

FIGS. 46A to 46D are views showing different examples of electronic apparatus of Embodiment 26.

DETAILED DESCRIPTION OF THE INVENTION

Embodiment Mode 1 of the invention will be described below.

Embobiment Mode 1

Figure 1A:
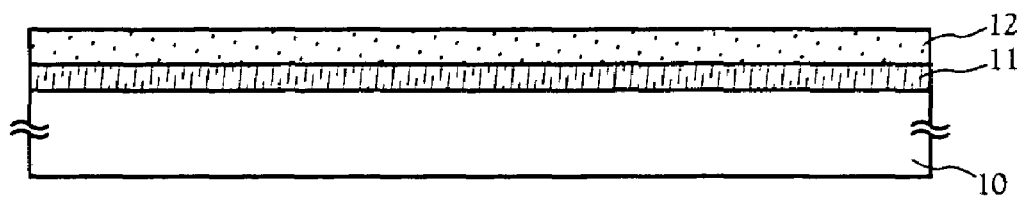
FIGS. 1A to 1C are views showing a crystallization method according to the invention.

First of all, a first amorphous semiconductor film 11 and a second amorphous semiconductor film 12 are formed in a stacked manner (laminated) on a substrate 10 having an insulating surface (FIG. 1A). The first amorphous semiconductor film (also called a germanium-containing silicon film) 11 contains silicon as its main component as well as germanium, while the second amorphous semiconductor film (also called a silicon film) 12 contains silicon as its main component.

The substrate 10 having the insulating surface can use a glass substrate represented by alumina boro-silicate glass or barium boro-silicate glass, a quartz substrate or a sapphire substrate. Otherwise, the substrate 10 may also use a substrate of the type in which an insulating film is formed on a surface of a semiconductor substrate made of silicon, germanium, gallium, arsenic or the like, or on a surface of a metal substrate or a stainless substrate. Otherwise, a plastic substrate having a heat resistance which can withstand treatment temperatures may also be used.

The first amorphous semiconductor film 11 is not limited to a particular material, but may use $Si_XGe_{1-X}(0<X<1)$, preferably an amorphous semiconductor film (a germanium-containing amorphous silicon film) which contains silicon as its main component and germanium in the range of 0.1 atomic % to less than 10 atomic %, more preferably 1 to 5 atomic %. Each of the concentrations of nitrogen and carbon contained in the amorphous semiconductor film is preferably made less than $5 \times 10^{18}/cm^3$, while the concentration of oxygen contained in the amorphous semiconductor film is preferably made less than $1 \times 10^{19}/cm^3$, in order to prevent an adverse influence from being exerted on the electrical characteristics of a crystalline semiconductor film to be fabricated in a later process of crystallization of the amorphous semiconductor film.

The first amorphous semiconductor film 11 may be formed by, but not limited to, a deposition method such as a plasma CVD method, a reduced-pressure CVD method, or a sputtering method using a target made of silicon containing germanium, or may be formed by implanting germanium ions into a silicon film obtained by a plasma CVD method, a reduced-pressure CVD method or a sputtering method.

If a plasma CVD method is used, a reaction gas made of $SiH_4$ and $GeH_4$ or a reaction gas made of $GeH_4$ diluted with $SiH_4$ and $H_2$ is introduced into a reaction chamber, and the reaction gas is decomposed by a high-frequency discharge of 1-200 MHz, thereby depositing the first amorphous semiconductor film 11 on the substrate. In the reaction gas, $Si_2H_6$ or $SiF_4$ may be adopted instead of $SiH_4$, and $GeF_4$ may be adopted instead of $GeH_4$. In the case of a reduced-pressure CVD method as well, a similar reaction gas can be applied. Preferably, the reaction gas is diluted with He and the first amorphous semiconductor film 11 is deposited on the substrate at a temperature of 400-500° C. Incidentally, the content of germanium in the first amorphous semiconductor film 11 can be appropriately adjusted according to the mixture ratio of the reaction gas.

Figure 17:
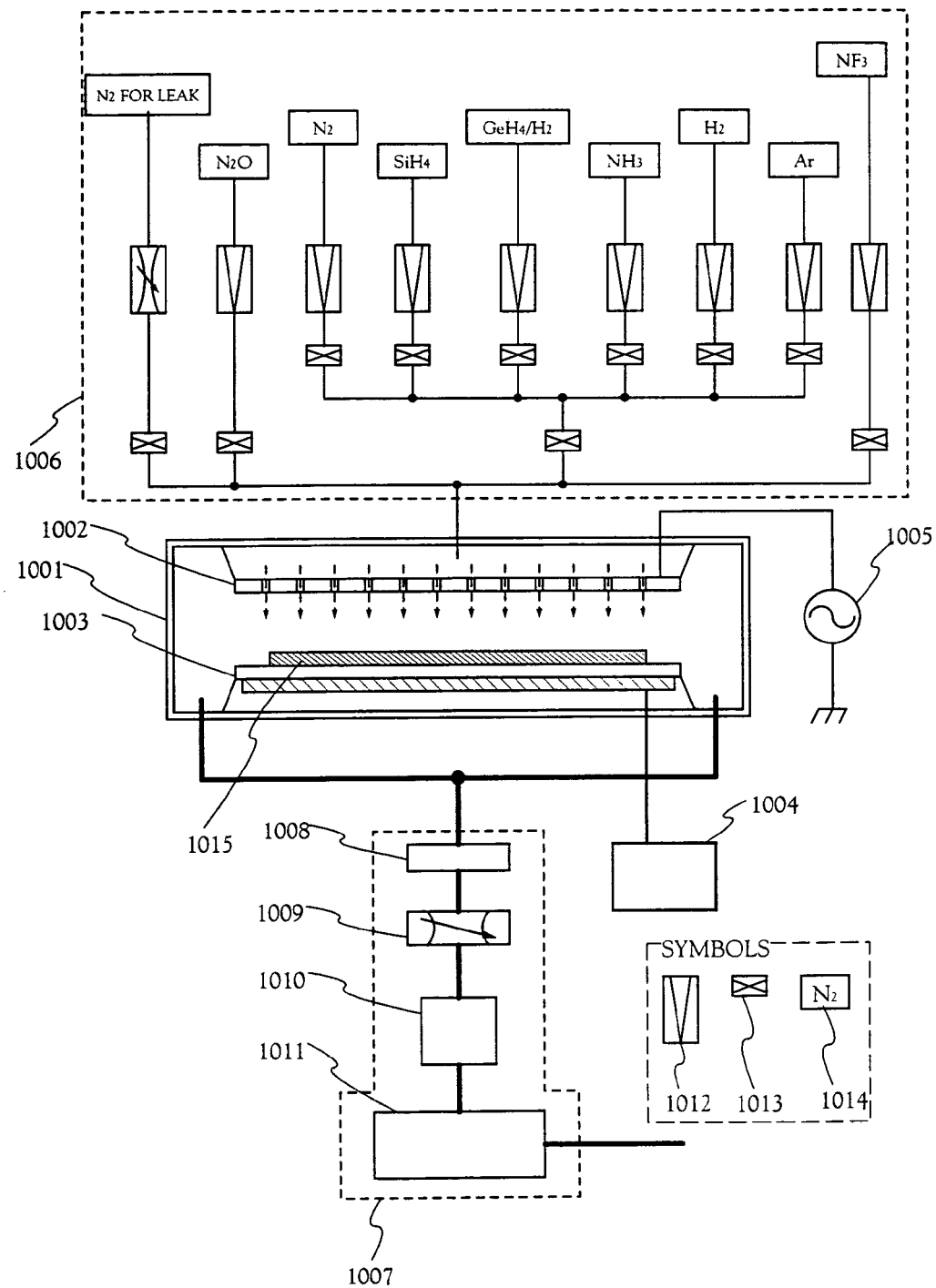
FIG. 17 is a view showing one example of a manufacturing apparatus of the present invention.

FIG. 17 is a view for explaining one example of the construction of a plasma CVD apparatus to be used for forming the first amorphous semiconductor film 11 and the second amorphous semiconductor film 12. The plasma CVD apparatus is of the parallel-plate type in which a negative electrode (cathode) 1002 to which a high-frequency power source 1005 is connected and a positive electrode (anode) 1003 are provided in a reaction chamber 1001. The negative electrode 1002 is made of a shower plate, and the reaction gas from gas supply means 1006 is supplied to the reaction chamber 1001 through this shower plate. The positive electrode 1003 is provided with heating means such as sheath heater, and a substrate 1015 is disposed on the positive electrode 1003. Although not shown in detail, a gas supply system is made of cylinders 1014 each filled with $SiH_4$, $GeH_4$ or the like, master flow controllers 1012 for controlling the flow rates of such gases, stop valves 1013 and the like. Exhaust means 1007 is made of a gate valve 1008, an automatic pressure control valve 1009, a turbo molecular pump (or a compound molecular pump) 1010 and a dry pump 1007. The turbo molecular pump (or a compound molecular pump) 1010 and the dry pump 1007 are of the types which do not use lubricating oil, and completely prevent contamination of the interior of the reaction chamber 1001 due to the diffusion of the lubricating oil. With respect to the reaction chamber 1001 having a volume of 13 L, the turbo molecular pump 1010 provided as the first-stage pump has an exhaust speed of 300 L/sec, and the dry pump 1007 provided as the second-stage pump has an exhaust speed of 40 $m^3$/hr, whereby organic vapor is prevented from being inversely diffused from an exhaust-system side, and the ultimate vacuum of the reaction chamber 1001 is increased to prevent as completely as possible impurity elements from being incorporated into an amorphous semiconductor film during formation thereof.

The respective contents of nitrogen, carbon and oxygen contained in the amorphous semiconductor film fabricated by the above-described apparatus were measured by secondary ion mass spectroscopy (SIMS). Under any deposition condition, each of the contents of nitrogen and carbon was less than $5 \times 10^{18}/cm^3$ and the content of oxygen was less than $1 \times 10^{19}/cm^3$.

The second amorphous semiconductor film 12 uses an amorphous semiconductor film (amorphous silicon film) which contains silicon as its main component. Similarly to the first amorphous semiconductor film 11, it is preferable that each of the concentrations of nitrogen and carbon contained in the amorphous semiconductor film be made less than $5 \times 10^{18}/cm^3$, while the concentration of oxygen contained in the amorphous semiconductor film be made less than $1 \times 10^{19}/cm^3$.

The deposition of the second amorphous semiconductor film 12 may use a plasma CVD method, a reduced-pressure CVD method, a sputtering method or other appropriate methods.

In addition, it is preferable that the thickness of the first amorphous semiconductor film 12 be made half or less of the thickness of the second amorphous semiconductor film 11, and it is desirable that the total thickness of a laminated film made of the first amorphous semiconductor film 11 and the second amorphous semiconductor film 12 be made 20-100 nm (preferably 30-60 nm).

In addition, to prevent contamination of the first and second amorphous semiconductor films 11 and 12, it is preferable to continuously deposit the first amorphous semiconductor film 11 and the second amorphous semiconductor film 12 without exposing them to the air.

In addition, to prevent the first and second amorphous semiconductor films 11 and 12 from being contaminated with impurities from the substrate, an undercoat insulating film may be formed on the substrate before the first amorphous semiconductor film 11 is formed. The undercoat insulating film may use a single-layer film selected from silicon oxide film, silicon nitride film and silicon nitride oxide film, or a stacked film in which films selected from these films are stacked in two or more layers. To prevent contamination of the first and second amorphous semiconductor films 11 and 12, it is preferable to continuously deposit the first amorphous semiconductor film 11 and the second amorphous semiconductor film 12 without exposing them to the air.

Figure 1B:
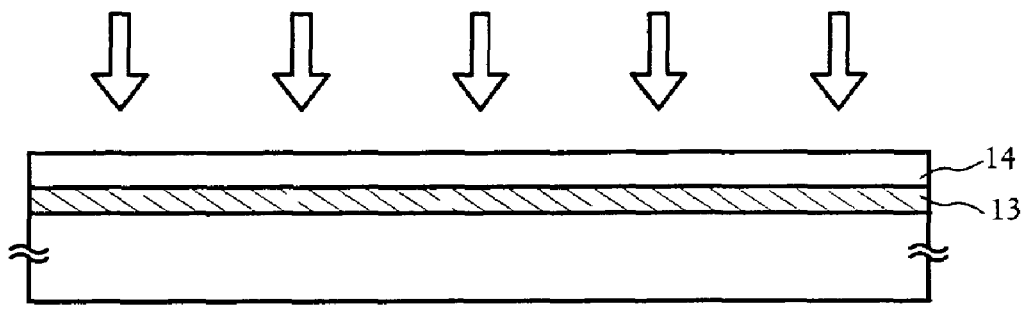

Then, laser treatment is performed to crystallize the first amorphous semiconductor film 11 and the second amorphous semiconductor film 12, thereby forming a first crystalline semiconductor film 13 and a second crystalline semiconductor film 14 (FIG. 1B).

The laser treatment uses as a light source an excimer laser of wavelength 400 nm or less, or the second harmonic (wavelength 532 nm) to the fourth harmonic (wavelength 266 nm) of a YAG or $YVO_4$ laser. Such laser light is condensed into a linear shape or a spot-like shape by an optical system, and is irradiated with an energy density of 100-700 mJ/$cm^2$. The laser beam condensed in this manner is made to scan a predetermined area of the substrate to effect the laser treatment. Although FIG. 1B shows an example in which the substrate is irradiated with the laser beam from its obverse side, the substrate may be irradiated from both sides. Instead of such a laser, a halogen lamp, a xenon lamp, a mercury lamp, a metal halide lamp or the like may be used as the light source. In addition, after the laser treatment, the substrate may be irradiated with light from a halogen lamp, a xenon lamp, a mercury lamp, a metal halide lamp or the like.

Incidentally, it is preferable that the first amorphous semiconductor film 11 and second amorphous semiconductor film 12 be made to emit their contained hydrogen before the laser treatment is performed. Specifically, it is preferable to crystallize the first and second amorphous semiconductor films 11 and 12 by laser treatment after reducing the content of hydrogen to 5 atom % or less by performing heat treatment at 400-500° C. for about one hour, because it is possible to prevent occurrence of a rough film surface.

Crystal growth occurs due to the above-described laser treatment, whereby it is possible to obtain crystalline semiconductor films having good film quality.

Then, the laminated film made of the first crystalline semiconductor film 13 and the second crystalline semiconductor film 14 is subjected to known patterning treatment, thereby forming a semiconductor layer of desired shape (having a stacked structure made of a first crystalline semiconductor layer 15 and a second crystalline semiconductor layer 16).

The semiconductor layer having the laminated structure is obtained from the above-described process.

A device such as a TFT using the semiconductor layer having the stacked structure obtained in this manner has superior electrical characteristics.

A mechanism which enables crystal grown to occur due to the laser treatment has not yet been made fully apparent, but can be schematically inferred in the following manner.

In the case where a semiconductor film (silicon film) to be subjected to laser treatment has a single layer, during the process of the phase change of silicon from liquid phase to solid phase after irradiation with laser light, the heat of molten liquid-phase silicon is dissipated into the substrate, so that the liquid-phase silicon is cooled at the interface between the liquid-phase silicon and the substrate and proceeds to the solid phase followed by crystallization. Therefore, crystal growth occurs in the direction perpendicular to the film surfaces. The semiconductor film crystallized in this manner receives the influence of an undercoat insulating film ($SiO_2$) formed on the substrate, and strongly tends to be oriented with respect to a [111] plane where grains are easily stable in terms of energy.

On the other hand, in the case where a semiconductor film to be subjected to laser treatment has a stacked layer (a stacked layer made of a germanium-containing silicon film and a silicon film), as can be seen from the fact that the melting point of germanium is 937° C. and is lower than 1415° C. which is the melting point of silicon), there is a small difference in the temperature at which silicon starts a phase change to its solid phase, between the first amorphous semiconductor film (the germanium-containing silicon film) and the second amorphous semiconductor film (the silicon film), and the silicon film starts a phase change to the solid phase at a higher temperature. Therefore, even after part of the silicon film has started a phase change to the solid phase, the germanium-containing silicon film remains in a molten liquid phase for a while. The semiconductor film crystallized in this manner does not receive the influence of the undercoat insulating film ($SiO_2$) formed on the substrate. During the process of the phase change to the solid phase after irradiation with laser light, the molten liquid-phase silicon is considered to be easily overcooled near the interface between the molten liquid-phase silicon film and the germanium-containing silicon film which is in the molten liquid-phase state.

Figure 19A:
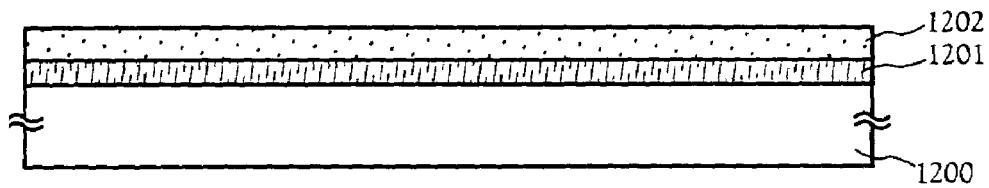
FIGS. 19A to 19C are views showing a crystallization method according to Embodiment 6.
Figure 19B:
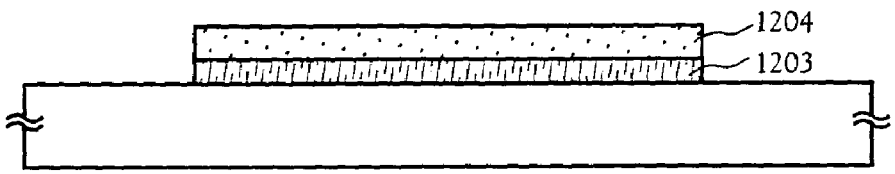
Figure 19C:
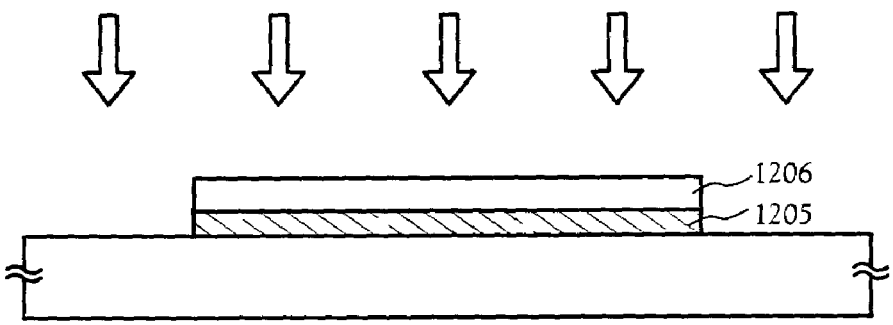

Otherwise, as shown in FIGS. 19A to 19C, after the patterning of the amorphous semiconductor films, crystals may be grown in the lateral direction by performing laser treatment to generate crystal nuclei from end portions.

Figure 20A:
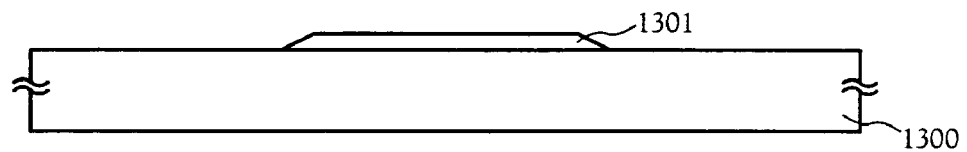
FIGS. 20A to 20C are views showing a crystallization method according to Embodiment 7.
Figure 20B:
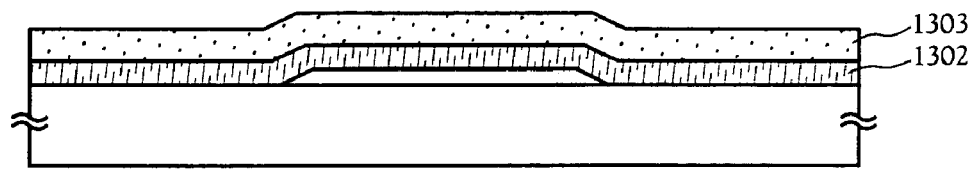
Figure 20C:
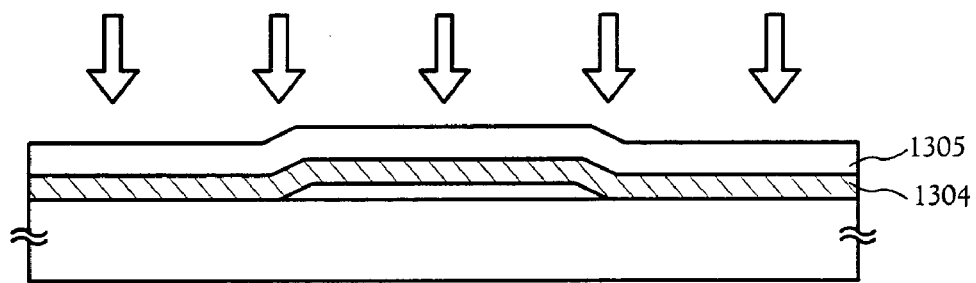

Otherwise, as shown in FIGS. 20A to 20C, crystals may be grown in the lateral direction by spatially modulating the intensity of laser light by means of a patterned insulating layer to form an appropriate temperature gradient.

In Embodiment Mode 1, as the above-described amorphous semiconductor films, it is possible to use amorphous semiconductor films, microcrystalline semiconductor films, or compound semiconductor films having amorphous structures.

Embodiment Mode 2

A crystalline semiconductor film having a high orientation ratio with respect to its {101} plane according to the invention is characterized by containing silicon as its main component. A typical embodiment of the crystalline semiconductor film is made of a first crystalline semiconductor film which contains silicon as its main component and germanium, and a second crystalline semiconductor film which contains silicon as its main component. Each of the first crystalline semiconductor film and the second crystalline semiconductor film can be obtained by forming an amorphous semiconductor film on an insulating surface by a plasma CVD method or a reduced-pressure CVD method and then crystallizing the amorphous semiconductor film by adding an element which promotes crystallization of silicon.

A non-alkali glass substrate such as alumina boro-silicate glass or barium boro-silicate glass or a quartz substrate is suited to a substrate on which to form these crystalline semiconductor films. Otherwise, an insulating film is formed on the surface of a semiconductor substrate made of silicon, germanium, gallium, arsenic or the like, and this substrate may also be used as the above-described substrate.

In the case where the above-described glass substrate is used as the substrate, a blocking layer such as silicon nitride, silicon oxide or silicon nitride oxide is formed between the amorphous semiconductor film and the glass substrate. In this manner, an impurity element such as an alkali metal element contained in the glass substrate is prevented from being diffused in the semiconductor film. For example, in the case of a plasma CVD method, $SiH_4$, $NH_3$ and $N_2$ are used as reaction gases to form a silicon nitride film. Otherwise, $SiH_4$, $N_2O$ and $NH_3$ are used as reaction gases to form a silicon nitride oxide film. The blocking layer is formed to a thickness of 20-200 nm.

The amorphous semiconductor film formed on such an insulating surface has a laminated structure made of a first amorphous semiconductor film which contains silicon as its main component and germanium, and a second amorphous semiconductor film which contains silicon as its main component. The first amorphous semiconductor film uses an amorphous semiconductor film which contains silicon as its main component and germanium in the range of 0.1 or more atomic % and less than 75 atomic %. The content of germanium can be adjusted according to the mixture ratio of $SiH_4$ to $GeH_4$ which are used as representative reaction gases. Each of the concentrations of nitrogen and carbon contained in each of the first and second amorphous semiconductor films is made less than $5\times10^{18}/cm^3$, while the concentration of oxygen contained in each of the first and second amorphous semiconductor films is made less than $1\times10^{19}/cm^3$, in order to prevent an adverse influence from being exerted on the electrical characteristics of the crystalline semiconductor film to be fabricated, in the process of crystallization of the amorphous semiconductor films.

The formation of the first and second amorphous semiconductor films may use a plasma CVD method, a reduced-pressure CVD method, or other appropriate methods. If a plasma CVD method is used, a reaction gas made of $SiH_4$ and $GeH_4$ or a reaction gas made of $GeH_4$ diluted with $SiH_4$ and $H_2$ is introduced into a reaction chamber, and the reaction gas is decomposed by a high-frequency discharge of 1-200 MHz, thereby depositing the amorphous semiconductor films on the substrate. In the reaction gas, $Si_2H_6$ or $SiF_4$ may be adopted instead of $SiH_4$, and $GeF_4$ may be adopted instead of $GeH_4$. In the case of a reduced-pressure CVD method as well, a similar reaction gas can be applied. Preferably, the reaction gas is diluted with He and the amorphous semiconductor films are deposited on the substrate at a temperature of 400-500° C. In any case, the reaction gases used in the invention are of the type which is refined at a high purity to decrease the concentrations of impurity elements such as oxygen, nitrogen and carbon to be incorporated into the amorphous semiconductor film to be deposited. The thickness of the amorphous semiconductor film to be deposited is made 20-100 nm.

During crystallization, a metal element which promotes the crystallization of amorphous semiconductor film is introduced into the surface of the second amorphous semiconductor film. The metal element uses one or plural kinds of metal elements selected from among iron (Fe), nickel (Ni), cobalt (Co), ruthenium (Ru), rhodium (Rh), palladium (Pd), osmium (Os), iridium (Ir), platinum (Pt), copper (Cu) and gold (Au). These metal elements can be used as a metal element which promotes the crystallization of the amorphous semiconductor film in any aspect of the invention disclosed in the present specification. If any of the above-noted metal elements is used, similar advantages can be achieved, but nickel is representatively used.

Locations at which to introduce these metal elements may be the entire surface of the second amorphous semiconductor film or the entire surface of the first amorphous semiconductor film. Such locations may also be slit-like surfaces or dot-like surfaces at appropriate locations on the surface of the second amorphous semiconductor film. In the latter case, preferably, an insulating film is formed on the amorphous semiconductor film, and the metal elements can be introduced through openings formed in the insulating film. Although the size of each of the openings is not particularly limited, the width can be made 10-40 µm. The longitudinal length may be arbitrarily determined, and can be made several tens µm to several tens cm.

The method of introducing these metal elements is not particularly limited, and can be selected from among various techniques for enabling the metal film to exist on the surface of or in the interior of the amorphous semiconductor film which contains the metal elements. For example, sputtering, vacuum evaporation, a plasma treatment method (including a plasma CVD method), an adsorption method, a method of applying a solution of metallic salt can be used. The plasma treatment method uses the metal element which is sputtered from a negative electrode in a glow discharge atmosphere with an inert gas. In addition, the method of applying a metallic salt is simple and is useful in that the concentration of the metal element can easily be adjusted.

Various kinds of metallic salts can be used as the metallic salt, and water, alcohol, aldehyde, ether or other organic solvents or a mixture of water and any of these organic solvents can be used as a solvent. The solution of such a metallic salt is not limited to only a solution in which a metallic salt is completely solved, and a solution in which part or the whole of a metallic salt exists in a suspended state. If any of these methods is adopted, the metal element is introduced in the state of being dispersed in the surface or the interior of the amorphous semiconductor film.

After the metal element which promotes the crystallization of silicon has been introduced by any of the aforementioned methods, the crystallization of the amorphous semiconductor film is performed by using the metal element. The crystallization is performed by heat treatment or irradiation with strong light such as laser light, ultraviolet rays or infrared rays. A crystalline silicon film which is oriented in a preferred manner with respect to $\{101\}$ can be obtained only by heat treatment, but it is preferable to use a method of performing heat treatment and then irradiation with strong light such as laser light. The laser treatment after the heat treatment can restore and vanish crystal defects remaining in crystal grains, and offers measures useful for the purpose of improving the quality of a crystal to be fabricated.

The dehydrogenation treatment of causing the first and second amorphous semiconductor films to emit their contained hydrogen is performed before the heat treatment for crystallization. The dehydrogenation treatment is performed under the conditions of heating at 400 to 500° C. for 0.5-5 hours, representatively, at 500° C. for 1 hour.

The heat treatment for crystallization can be performed within the range of 450 to 1,000° C., but the highest temperature that a substrate to be used can withstand is taken into account as one upper-limit temperature. For example, quartz substrates can withstand heat treatment of 1,000° C., but in the case of glass substrates, their strain points or less provide a basis for upper-limit temperatures. For example, with respect to a glass substrate of strain point 667° C., approximately 660° C. should be regarded as the upper limit. The required time is appropriately set according to heating temperature and subsequent processing conditions (for example, the presence or absence of the processing of irradiating the substrate with laser light), and heat treatment is suitably performed at 550-600° C. for 4-24 hours. If the subsequent laser treatment is to be performed, heat treatment is performed at 500-550° C. for 4-8 hours. The above-described heat treatment may be performed in the air or an hydrogen atmosphere, but is suitably performed in a nitrogen or inert gas atmosphere.

The laser treatment uses as a light source an excimer laser of wavelength 400 nm or less, or the second harmonic (wavelength 532 nm) to the fourth harmonic (wavelength 266 nm) of a YAG or $YVO_4$ laser. Such laser light is condensed into a linear shape or a spot-like shape by an optical system, and is irradiated with an energy density of 100-700 $mJ/cM^2$. The laser beam condensed in this manner is made to scan a predetermined area of the substrate to effect the laser treatment. Instead of such a laser, a halogen lamp, a xenon lamp, a mercury lamp, a metal halide lamp or the like may be used as the light source.

A mechanism which provides a crystalline semiconductor film having a high orientation ratio with respect to its $\{101\}$ plane according to the invention through the above-described process has not yet been made fully apparent, but can be schematically inferred in the following manner.

A metal element which promotes the crystallization of silicon introduced into the first and second amorphous semiconductor films is rapidly diffused in the amorphous semiconductor films during the dehydrogenation treatment. Then, nonuniform formation of nuclei begins. Then, the metal element and silicon react with each other to form a silicide, and this silicide becomes crystal nuclei and contributes to the subsequent crystal growth. For example, if nickel is used as a representative metal element, nickel silicide (hereinafter denoted by $NiSi_2$) is formed. In the first amorphous semiconductor film, since germanium is hardly solidified in $NiSi_2$, nuclei are formed in the state of being surrounded by germanium in the amorphous semiconductor film.

$NiSi_2$ does not have a particular orientation, but if the thickness of the amorphous semiconductor film is 20-100 nm, $NiSi_2$ is hardly allowed to grow in any direction other than a direction parallel to the surface of the substrate. In this case, since the interfacial energy at the interface of contact between $NiSi_2$ and the (111) plane of crystal silicon is the smallest, the (110) plane becomes a plane parallel to the surface of the crystalline semiconductor film, and this (110) lattice plane is oriented in a preferred manner. In the case where the direction of crystal growth is the direction parallel to the surface of the substrate and the crystal grows into a columnar shape, the degree of freedom exists in the direction of rotation about the columnar crystal, so that the (110) plane is not necessarily oriented. It is considered, therefore, that another lattice plane is also precipitated.

As viewed from $NiSi_2$, since germanium of large atomic radius exists in only the amorphous semiconductor surrounding $NiSi_2$, the occurrence of a large strain (tensile stress) is expected. This strain energy acts to increase the critical radius of nucleation. Moreover, this strain (tensile stress) restricts the crystal orientation of nuclei due to $NiSi_2$, so that it is inferred that the strain has the effect of increasing an orientation rate with respect to a particular crystal plane (specifically, a $\{101\}$ plane).

The structure of $NiSi_2$ is a fluorite structure in which nickel atoms are arranged in a silicon lattice of diamond structure. If the nickel atoms disappear from $NiSi_2$, the crystal structure of silicon remains. From numerous experiments, it has been discovered that nickel atoms move toward amorphous silicon, and the reason for this is considered to be that the solid solubility in amorphous silicon is higher that in crystal silicon. Therefore, it is possible to make a model in which nickel forms crystal silicon while moving in amorphous silicon.

In addition, it is considered that the diffusion speed of nickel in the amorphous semiconductor film is faster when germanium is contained in the amorphous semiconductor film than when germanium is not contained in it. In the case of the invention, it is considered that the crystal growth due to $NiSi_7$ is faster in the first amorphous semiconductor film than in the second amorphous semiconductor film.

From the above considerations, it can be seen that in the first amorphous semiconductor film, a crystal having a high orientation ratio with respect to the {101} plane grows owing to heat treatment, so that a crystal having an orientation with respect to the same plane grows epitaxially in the second amorphous semiconductor film.

To increase the {101} plane orientation of a crystalline semiconductor film which contains silicon as its main component, the invention adopts the method of sequentially forming the first amorphous semiconductor film which contains silicon as its main component and germanium, and the second amorphous semiconductor film which contains silicon as its main component, adding an element which promotes crystallization of silicon, and crystallizing silicon by performing heat treatment or both heat treatment and laser treatment.

Figure 36A:
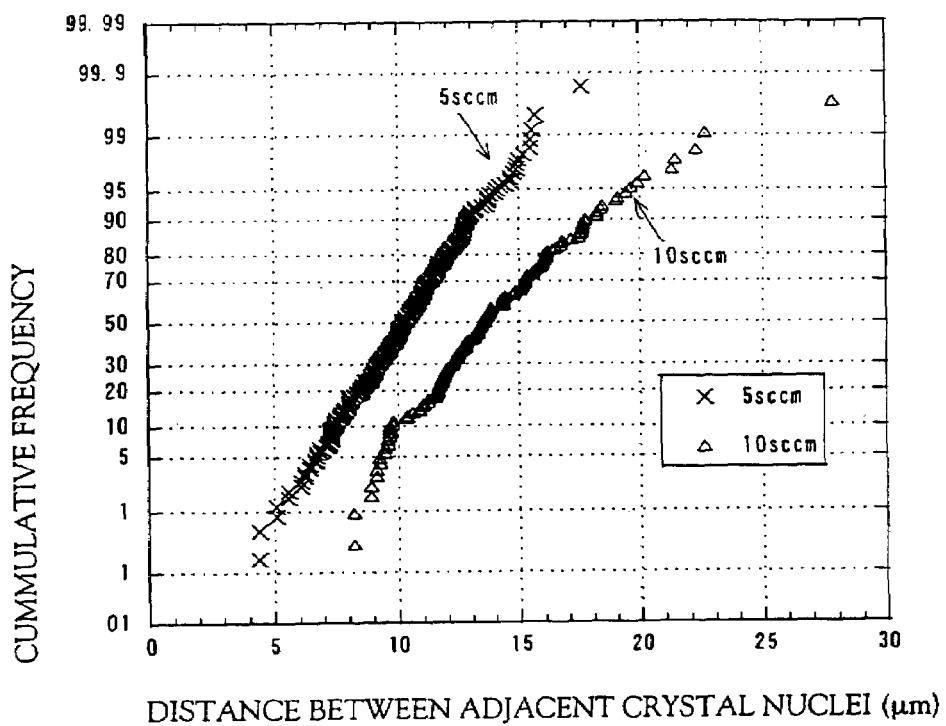
FIGS. 36A and 36B are cumulative frequency graphs showing the distance between adjacent crystal nuclei of the present invention.
Figure 36B:
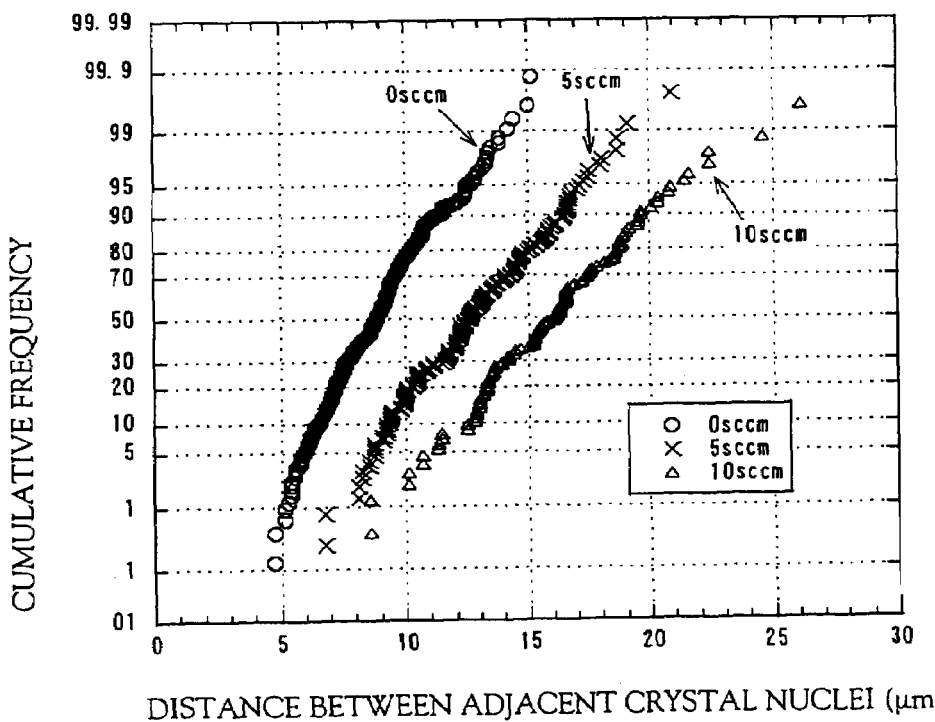
Figure 37:
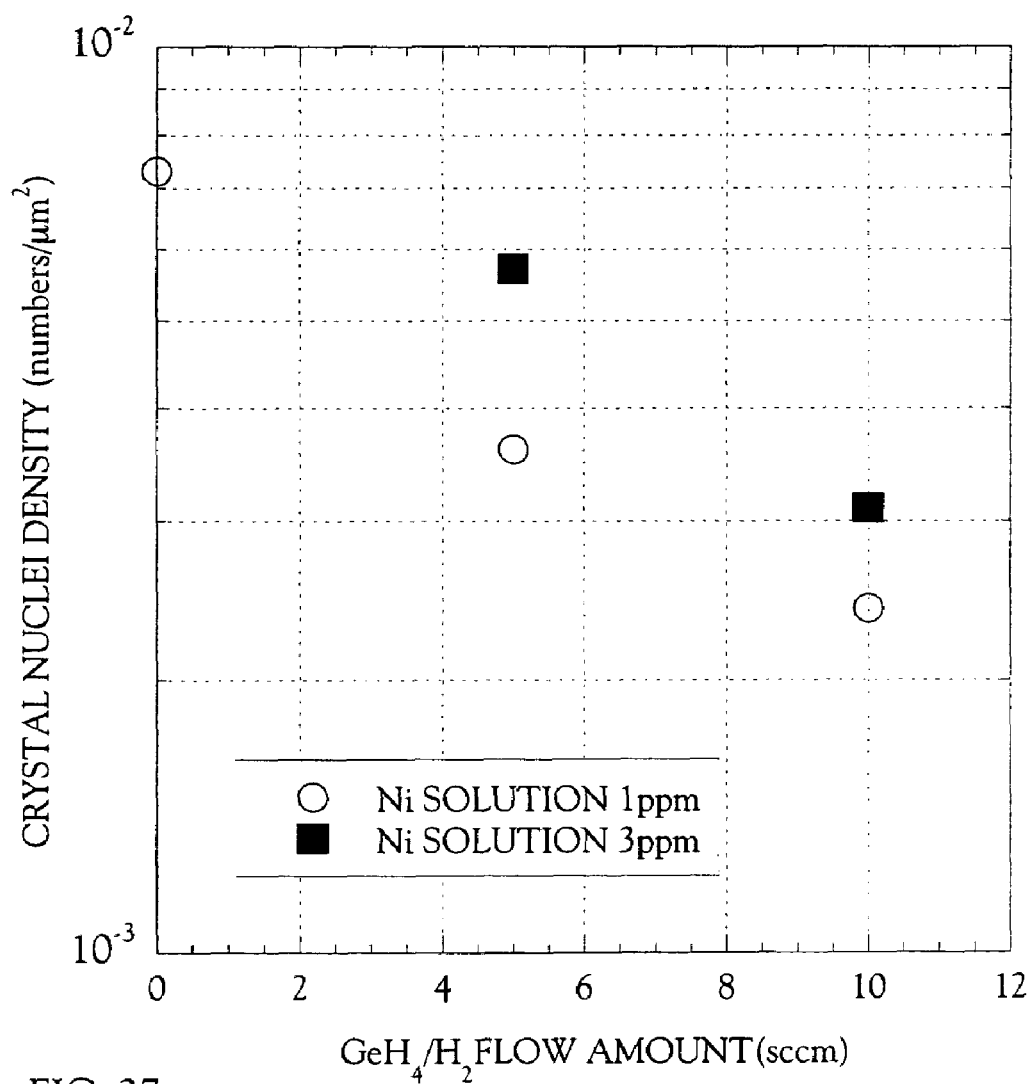
FIG. 37 is a view showing the relationship between the amount of addition of $GeH_4$ and the generation density of crystal nuclei of the present invention.

If amorphous silicon contains 0.1-10 atomic % of germanium, the generation density of crystal nuclei lowers. FIGS. 36A and 36B show the results of measurement of the dependence of the distance between adjacent crystal nuclei on the amount of addition of $GeH_4$, and the vertical axis of each of FIGS. 36A and 36B indicates cumulative frequency. FIG. 36A shows the measurement results obtained when an aqueous solution of 3 ppm nickel acetate was used as an element which promoted crystallization of silicon, while FIG. 36B shows the measurement results obtained in the case of an aqueous solution of 1 ppm nickel acetate. An increase in the amount of addition of $GeH_4$ means a corresponding increase in the concentration of germanium contained in amorphous silicon. The results shown in each of FIGS. 36A and 36B show that as the amount of addition of $GeH_4$ increases, the distance between adjacent crystal nuclei becomes longer. FIG. 37 shows the density of crystal nuclei with respect to the amount of addition of $GeH_4$ on the basis of the measurement results. FIG. 37 shows that as the amount of $GeH_4$ increases, the density of crystal nuclei tends to lower. This result supports the aforesaid consideration that the presence of germanium in the amorphous semiconductor film acts to increase the critical radius of nucleation.

Regarding a crystalline semiconductor film to be fabricated on the basis of the above-described invention, one example of its fabrication conditions will be described below. Table 1 shows the fabrication conditions of each of the first and second amorphous semiconductor films to be fabricated by a plasma CVD method. $GeH_4$ gases respectively diluted with $SiH_4$ and $H_2$ to 10% are used as reaction gases. To decrease the concentrations of impurities such as oxygen, nitrogen and carbon contained in each of the first and second amorphous semiconductor films to be fabricated, these reaction gases use $SiH_4$ of purity 99.9999% or more and $GeH_4$ which is a high purity product which contains 1 ppm or less of nitrogen and hydrocarbon compounds and 2 ppm or less of $CO_2$. In the first amorphous semiconductor film, to change the content of germanium with respect to silicon, the mixture ratio of the flow rates of the $GeH_4$ gases diluted with $SiH_4$ and $H_2$ to 10% are changed so that the total flow rate is kept constant. Common conditions are as follows: a high-frequency power of 0.35 W/cm² (27 MHz) is modulated into a pulse discharge of repetition frequency 10 kHz (duty ratio 30%) and is fed to the negative electrode of a parallel-plate type of plasma CVD apparatus. The other fabrication conditions are as follows: reaction pressure =33.25 Pa, substrate temperature=300° C. and electrode gap=35 mm.

[Table 1]

Figure 35:
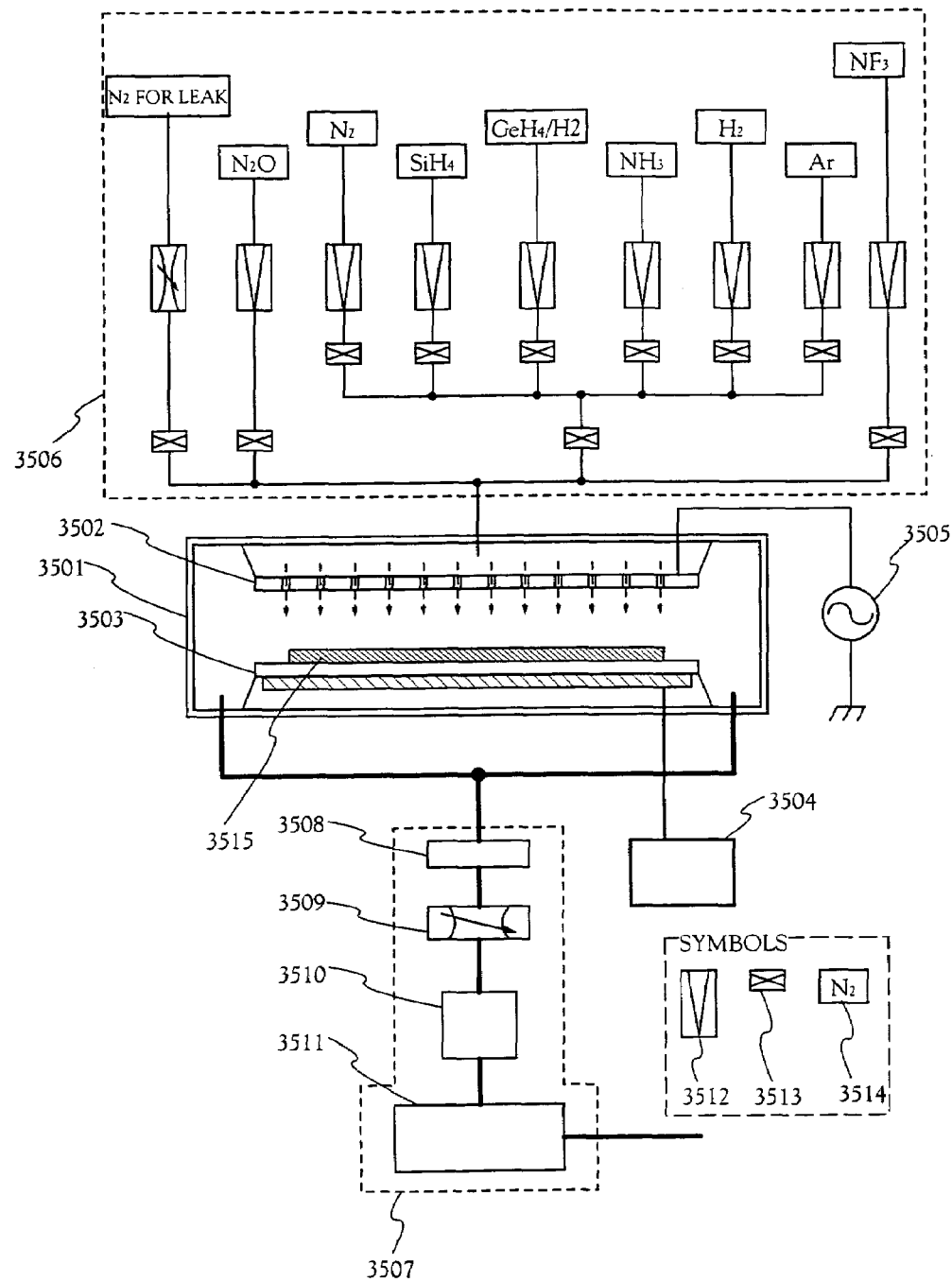
FIG. 35 is a view showing the construction of a plasma CVD device for use in the invention.

FIG. 35 is a view for explaining one example of the construction of a plasma CVD apparatus to be used for forming the first amorphous semiconductor film and the second amorphous semiconductor film. The plasma CVD apparatus is of the parallel-plate type in which a negative electrode (cathode) 3502 to which a high-frequency power source 3505 is connected and a positive electrode (anode) 3503 are provided in a reaction chamber 3501. The negative electrode 3502 is made of a shower plate, and the reaction gas from gas supply means 3506 is supplied to the reaction chamber 3501 through this shower plate. The positive electrode 3503 is provided with heating means such as sheath heater, and a substrate 3515 is disposed on the positive electrode 3503. Although not shown in detail, a gas supply system is made of cylinders 3514 each filled with $SiH_4$, $GeH_4$ or the like, master flow controllers 3512 for controlling the flow rates of such gases, stop valves 3513 and the like. Exhaust means 3507 is made of a gate valve 3508, an automatic pressure control valve 3509, a turbo molecular pump (or a compound molecular pump) 3510 and a dry pump 3507. The turbo molecular pump (or a compound molecular pump) 3510 and the dry pump 3507 are of the types which do not use lubricating oil, and completely prevent contamination of the interior of the reaction chamber 3501 due to the diffusion of the lubricating oil. With respect to the reaction chamber 3501 having a volume of 13 L, the turbo molecular pump 3510 provided as the first-stage pump has an exhaust speed of 300 L/sec, and the dry pump 3507 provided as the second-stage pump has an exhaust speed of 40 m³/hr, whereby organic vapor is prevented from being inversely diffused from an exhaust-system side, and the ultimate vacuum of the reaction chamber 3501 is increased to prevent as completely as possible impurity elements from being incorporated into an amorphous semiconductor film during formation thereof.

Figure 38:
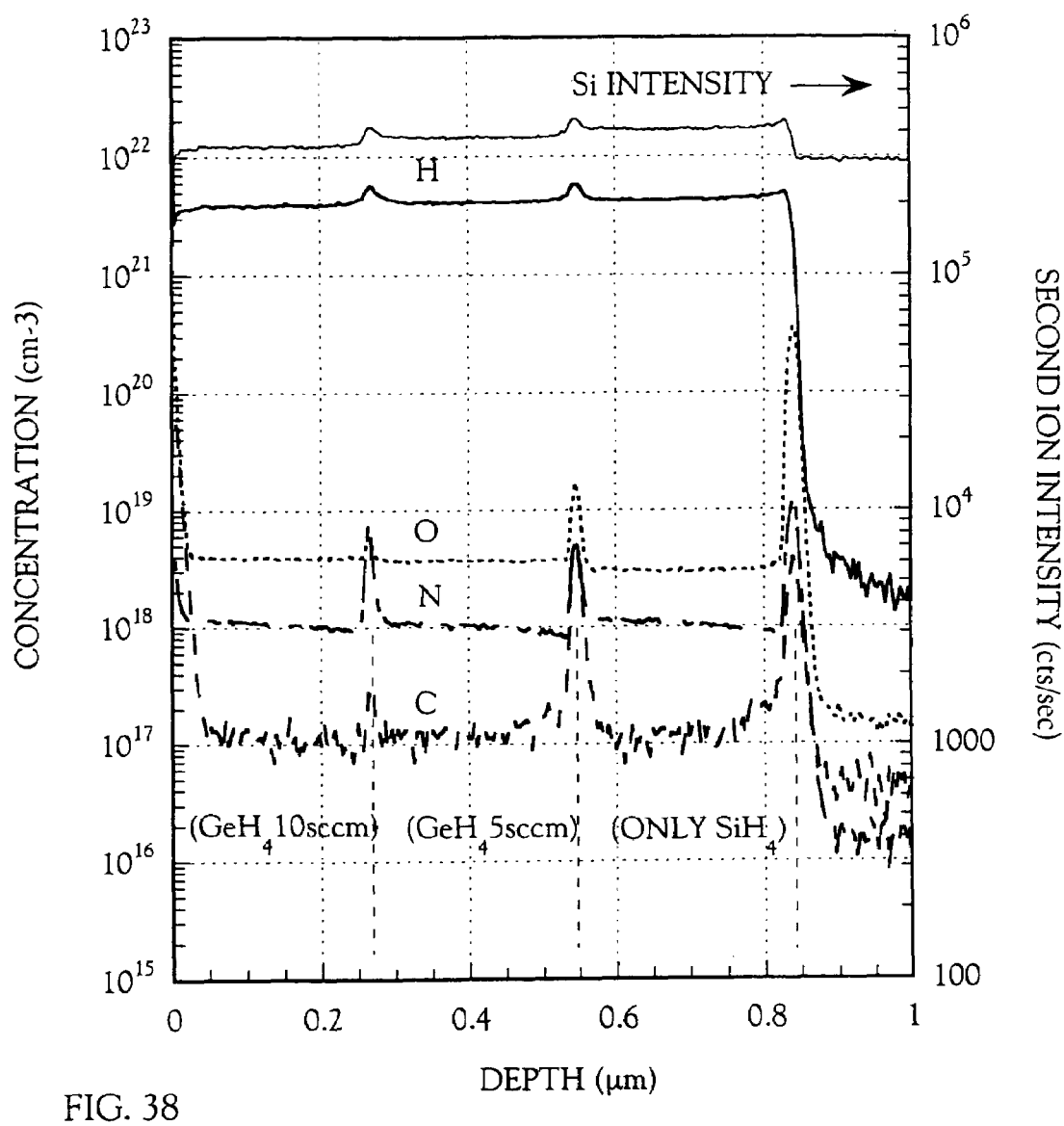
FIG. 38 is a SIMS data graph showing the C, N and O concentrations in amorphous semiconductor films fabricated from $SiH_4$, $GeH_4$ and $H_2$ gases of the present invention.

The respective contents of nitrogen, carbon and oxygen contained in the amorphous semiconductor film fabricated by the above-described apparatus were measured by secondary ion mass spectroscopy (SIMS). FIG. 38 shows the results of the measurement. The sample used for the measurement was obtained by stacking only $SiH_4$ on a silicon substrate under the condition that $GeH_4$ diluted with $H_2$ to 10% was added at the rate of 5 SCCM and then at the rate of 10 SCCM. Under any of the deposition conditions, each of the contents of nitrogen and carbon is less than $5 \times 10^{18}$/cm³ and the content of oxygen is less than $1 \times 10^{19}$/cm³.

The thickness of the first amorphous semiconductor film formed on the insulating film is made 5-30 nm, while the thickness of the second amorphous semiconductor film formed on the first amorphous semiconductor film is made 15-70 nm, so that the first amorphous semiconductor film is made thinner than the second amorphous semiconductor film. The first amorphous semiconductor film contains germanium of larger atomic radius than that of silicon so that the generation density of crystal nuclei can be made small. As described above, during crystallization, the first amorphous semiconductor film is used as a seed layer for crystallizing the second amorphous semiconductor film and increasing the orientation of a particular crystal plane, and therefore, it is desirable that the first amorphous semiconductor film be formed to be thinner than the second amorphous semiconductor film.

The crystallization of the first and second amorphous semiconductor films uses nickel as an element which promotes crystallization of silicon, and needs heat treatment of 500-600° C. or both heat treatment and laser treatment. The fabrication conditions of a representative method are heat treatment at 550° C. for 4 hours in a nitrogen atmosphere as well as laser treatment. For nickel, an aqueous solution containing nickel acetate at a concentration of 10 ppm is used, and is coated with the aqueous solution by means of a spinner. The laser treatment uses a XeCl excimer laser (of wavelength 308 nm), and performs irradiation with laser light at an irradiation energy density of 300-600 mJ/cm$^2$ and with an overlap percentage of 90-95%. The laser treatment is performed for crystallizing an uncrystallized portion of the film crystallized by the heat treatment or for fixing defects in the crystal grains.

Defects remaining in the first or second amorphous semiconductor film can be effectively reduced by the hydrogen treatment of adding approximately 0.01-1 atomic % of hydrogen to the first or second amorphous semiconductor film. The hydrogen treatment can be performed by heat treatment at 350-500° C. in a hydrogen-containing atmosphere. Otherwise, the hydrogen treatment can be performed by using hydrogen generated from plasma. If the first amorphous semiconductor film is formed of a fluoride such as $SiF_4$ or $GeF_4$, approximately 0.001-1 atomic % of fluorine is left in the film and serves as an element which compensates for defects.

In this manner, such a crystalline semiconductor film which exhibits a high orientation with respect to the {101} plane is achieved not only by the addition of germanium at a concentration which is in the range of 0.1-10 atomic %, but also by the synergistic effect of the processing of adjusting the concentration of each element such as oxygen, nitrogen and carbon contained in the film to less than $1\times10^{19}/cm^3$ and the processing of setting the thickness of the crystalline semiconductor film within the range of 20-100 nm so that crystal growth predominates in a direction parallel to the substrate surface.

Such a crystalline semiconductor film having a high orientation rate with respect to the {110} plane can be suitably used in channel formation regions which determine the characteristics of elements, such as the channel formation regions of TFTs and the photoelectric conversion layers of photovoltaic elements.

The invention having the above-described construction will be described below in further detail with reference to the following embodiments.

Embodiment 1

In the description of Embodiment 1, a method of fabricating a pixel section and TFTs (n-channel type TFTs and p-channel type TFTs) for a driver circuit to be disposed at the periphery of the pixel section, on the same substrate at the same time will be described in detail with reference to FIGS. 2A to 5.

Figure 1C:
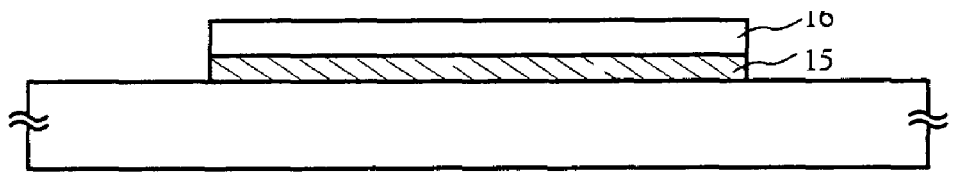

First of all, in accordance with Embodiment 1, island-shaped semiconductor layers 101a-105b which constituted laminated structures were formed on a substrate 100a. Among the island-shaped semiconductor layers (FIG. 2A), the lower layers 101a-105a are silicon films (containing germanium) which correspond to the first crystalline semiconductor layer 15 shown in FIG. 1C, while the upper layers 101b-105b are silicon films which correspond to the second crystalline semiconductor layer 16 shown in FIG. 1C. An undercoat insulating film 100b made of an insulating film such as silicon oxide film, silicon nitride film and silicon nitride oxide film was formed on the substrate 100a.

In Embodiment 1, a two-layer structure is used as the undercoat insulating film 100b, but a signal-layer film or a stacked film made of two or more layers may also be used. As the first layer (the lower layer) of the undercoat insulating film 100b, a silicon nitride oxide film of thickness 10-200 nm (preferably, 50-100 nm) is formed by a plasma CVD method using $SiH_4$, $NH_3$ and $N_2O$ as reaction gases. In Embodiment 1, a silicon nitride oxide film of thickness 50 nm was formed (composition ratio: Si=32%, O=27%, N=24% and H=17%). Then, as the second layer (the upper layer) of the undercoat insulating film 100b, a silicon nitride oxide film of thickness 50-200 nm (preferably, 100-150 nm) is formed to be stacked on the first layer, by a plasma CVD method using $SiH_4$ and $N_2O$ as reaction gases. In Embodiment 1, a silicon nitride oxide film of thickness 100 nm was formed (composition ratio: Si=32%, O=59%, N=7% and H=2%).

Figure 2A:
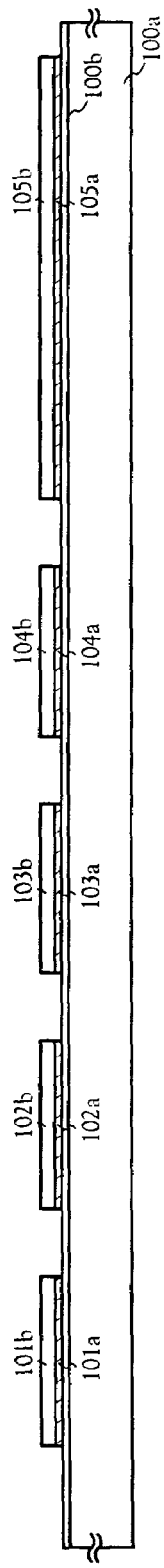
FIGS. 2A to 2E are views showing the process of fabricating an AM-LCD of Embodiment 1.
Figure 2B:
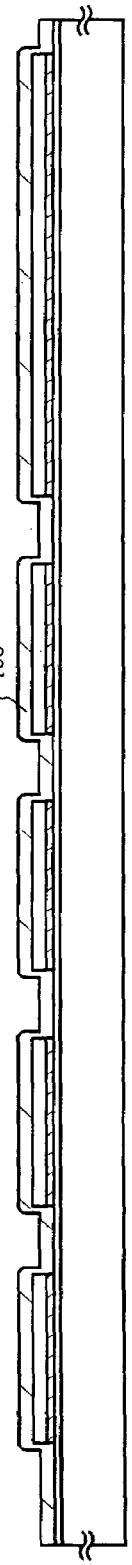

Then, a mask layer 106 made of silicon oxide of thickness 50-100 nm was formed by a plasma CVD method or a sputtering method. In this state, an impurity element (in this embodiment, boron) to impart p-type conductivity for the purpose of controlling the threshold voltages (Vth) of TFTs was added to the entire surfaces of the semiconductor layers at a concentration of approximately 133 $10^{16}$ to $5\times10^{17}$ atoms/cm$^3$ (FIG. 2B). Although in Embodiment 1 the addition of boron was performed after the formation of the mask layer, the process sequence is not particularly limited, and the addition of boron may also be performed, for example, before the semiconductor layers are formed by patterning.

Group XIII elements of the periodic table, such as boron (B), aluminum (Al) and gallium (Ga), are known as impurity elements which impart p-type conductivity to semiconductors. As a method of adding such an impurity, it is possible to use an ion implantation method or an ion doping method. The ion doping method is suited to treat large-area substrates. In the ion doping method, boron (B) is added by using diborane ($B_2H_6$) as a source gas to add. The implantation of this impurity is not necessarily needed and may be omitted, but it is a technique particularly suitable for use in accommodating the threshold voltages of n-channel type TFTs in a predetermined range. If such implantation is omitted, the formation of the mask layer 106 is not needed.

Then, the mask layer 106 was removed by etching with a solution of hydrofluoric acid or the like.

Figure 2C:
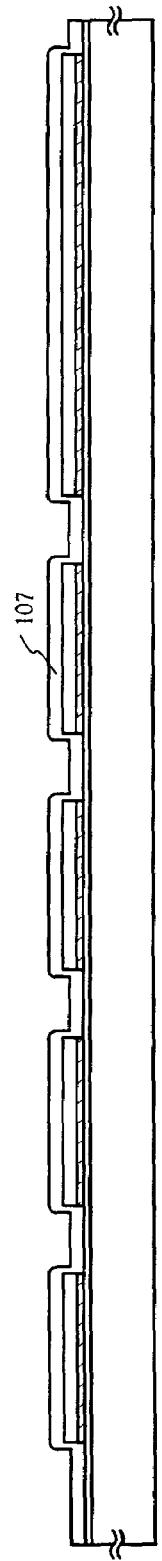

Then, a gate insulating film 107 of thickness 10-200 nm was formed out of an insulating film containing silicon (FIG. 2C). The gate insulating film 107 can use a film having a thickness of 100-400 nm, such as a silicon oxide film, a silicon nitride film, a silicon nitride oxide film ($SiO_xN_y$), an organic-resin film (BCB (benzodiclobutene)), or a film in which some of them are stacked. The formation of the gate insulating film 107 can use a forming method such as a thermal CVD method, a plasma CVD method, a reduced-pressure thermal CVD method, a vacuum evaporation method, a sputtering method or an application method. Otherwise, the gate insulating film 107 may be formed by a thermal oxidation process.

In addition, it is desirable to clean the surfaces of the semiconductor layers before the gate insulating film 107 is formed. The removal of contaminant impurities (represented by C, Na and the like) from the coat surface may be performed by cleaning the coat surface with pure water in which ozone is dissolved, and then etching the surface of the coat by using an acid solution containing fluorine.

Figure 2D:
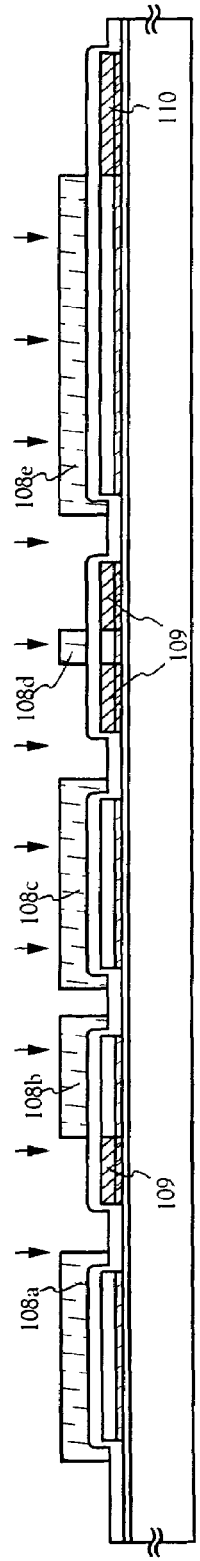

Then, to form the LDD regions of n-channel type TFTs for the driver circuit, an impurity element which imparts n-type conductivity is selectively added to the semiconductor layers 102a, 102b, 104a and 104b. For this purpose, resist masks 108a to 108e were formed in advance. Phosphorus (P) or arsenic (As) may be employed as the impurity element which imparts n-type conductivity. In Embodiment 1, an ion doping method using phosphine ($PH_3$) was applied for the purpose of adding phosphorus (P). Impurity regions are formed as low-concentration n-type impurity regions 109, in which the concentration of phosphorus (P) contained in the regions 109 is preferably in the range of $2\times10^{16}$ to $5\times10^{19}$ atoms/cm$^3$. In the present specification, symbol (n$^-$) denotes the concentration of an impurity element which imparts n-type conductivity included in the impurity region 109 in this step. An impurity region 110 is a semiconductor layer in which to form a storage capacitor for the pixel section. Phosphorus (P) was also added to this region at the same concentration (FIG. 2D).

Then, the step of activating the added impurity elements is performed. The activation can be performed by laser activation treatment or by heat treatment in an inert atmosphere, for example, in a nitrogen atmosphere at 600-900° C. for 1-4 hours. Both treatments may also be used together.

Figure 2E:
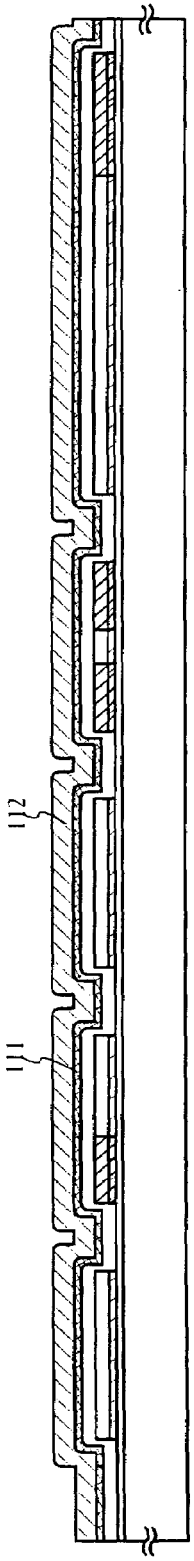

Then, as shown in FIG. 2E, a heat-resisting conductive layer in which to form gate electrodes is formed on the gate insulating film 107. The heat-resisting conductive layer may be formed as a single layer, but may also be formed as a stacked structure made of plural layers such as two or three layers as required. It is preferable that these heat-resisting conductive materials be used to form a structure in which, for example, a conductive layer (A) 111 made of a conductive nitride metal film and a conductive layer (B) 112 made of a metal film are stacked. The conductive layer (B) 112 is preferably formed out of an element selected from among tantalum (Ta), titanium (Ti), molybdenum (Mo) and tungsten (W), or an alloy containing the element as its main component, or an alloy film formed by a combination of arbitrary ones of the elements (representatively, Mo—W alloy film or Mo—Ta alloy film). The conductive layer (A) 111 is preferably formed of tantalum nitride (TaN), tungsten nitride (WN), titanium nitride (TiN), molybdenum nitride (MoN) or the like. Otherwise, tungsten silicide, titanium silicide or molybdenum silicide may be applied to the conductive layer (A) 111.

The conductive layer (A) 111 may be 10-50 nm thick (preferably 20-30 nm thick), and the conductive layer (B) 112 may be 200-400 nm thick (preferably 250-350 nm thick). In Embodiment 1, by using a sputtering method using a W target (of purity 99.9999%), argon (Ar) gas and nitrogen ($N_2$) gas were introduced and the conductive layer (A) 111 was formed as a 50-nm-thick layer made of tungsten nitride (WN) and the conductive layer (B) 112 was formed as a 250-nm-thick layer made of tungsten (W). Such W films may also be formed by another method such as a thermal CVD method Incidentally, although not shown, it is advantageous that a silicon film which is approximately 2-20 nm thick and doped with phosphorus (P) is formed under the conductive layer (A) 111. It is possible to promote a further improvement in adherence and the prevention of oxidation of the conductive film formed on the doped silicon film, and at the same time an alkali metal element contained by a trace quantity in the conductive layer (A) 111 or the conductive layer (B) 112 can be prevented from being diffused in the gate insulating film 107. In any case, it is preferable that the resistivity of each of the conductive layer (A) 111 and the conductive layer (B) 112 be in the range of 10-50 μΩcm.

Then, resist masks 113-118 were formed by using a photomask, and the conductive layer (A) 111 and the conductive layer (B) 112 were etched to form gate electrodes 119-123 and a capacitance line 124. The gate electrodes 119-123 and the capacitance line 124 are respectively formed of layers 119a-124a of the conductive layer (A) and layers 119b-124b of the conductive layer (B) (FIG. 3A).

Then, to form LDD regions in the respective n-channel type TFTs of pixel TFTs, the step (n$^{--}$ doping step) of adding an impurity element which imparts n-type conductivity is performed. An impurity element to impart n-type conductivity was added in a self-aligned manner by an ion doping method using the gate electrodes 119-123 as masks. The concentration of phosphorus (P) added as the impurity element to impart n-type conductivity was in the range of $1\times10^{16}$ to $5\times10^{19}$ atoms/cm$^3$. In this manner, low-concentration n-type impurity regions 125-128 were formed in the semiconductor layers as shown in FIG. 3B.

Then, high-concentration n-type impurity regions to function as a source region or a drain region in the n-channel type TFT was performed (n$^+$ doping step). First, photomasks were used to form resist masks 129-132, and high-concentration n-type impurity regions 133-138 were formed by adding an impurity element to impart n-type conductivity. Phosphorus (P) was employed as the impurity element to impart n-type conductivity, and an ion doping method using phosphine ($PH_3$) was performed so that the concentration of phosphorus (P) may be in the range of $1\times10^{20}$ to $1\times10^{21}$ atoms/cm$^3$ (FIG. 3C).

Then, high-concentration p-type impurity regions 142 and 143 to constitute source regions and drain regions were formed in the semiconductor layers 101a, 101b, 103a and 103b in which to form p-channel type TFTs. In Embodiment 1, an impurity element to impart p-type conductivity was added by using the gate electrodes 119 and 121 as masks, and the high-concentration p-type impurity regions 142 and 143 were formed in a self-aligned manner. At this time, resist masks 139-141 were formed by using a fourth photomask, to cover the whole surfaces of the semiconductor layers 102a, 102b, 104 and 105 to form n-channel type TFTs. The high-concentration p-type impurity regions 142 and 143 were formed by an ion doping method using diborane ($B_2H_6$). The concentration of boron (B) in each of these regions was in the range of $3\times10^{20}$ to $3\times10^{21}$ atoms/cm$^3$ (FIG. 3D).

In the previous step, phosphorus (P) is added to the high-concentration p-type impurity regions 142 and 143, so that each of the high-concentration p-type impurity regions 142a and 143a contains phosphorus (P) at a concentration of $1\times10^{20}$ to $1\times10^{21}$ atoms/cm$^3$, while each of the high-concentration p-type impurity regions 142b and 143b contains phosphorus (P) at a concentration of $1\times10^{16}$ to $5\times10^{19}$ atoms/cm$^3$. In this step, however, since the concentration of boron (B) is made 1.5 to 3 times as large, there is no problem as to the functions of the source regions and the drain regions of the p-channel type TFTs.

After that, as shown in FIG. 4A, a protective insulating film 144 was formed over the gate electrodes and the gate insulating film. The protective insulating film may be formed of a silicon oxide film, a silicon nitride film or a silicon nitride oxide film, or a stacked film formed by a combination of arbitrary ones of these films. In any case, the protective insulating film 144 is formed of an inorganic insulating material. The thickness of the protective insulating film 144 is made 100-200 nm.

After that, the step of activating the impurity elements added at the respective concentrations to impart n-type conductivity and p-type conductivity is performed. This step is performed with a thermal annealing method using an annealing furnace. Another method such as a laser annealing method or a rapid thermal annealing method (RTA method) can also be applied. In Embodiment 1, 4-hour heat treatment was performed at 550° C. (FIG. 4B).

Moreover, after the activation step, heat treatment of 300-450° C. for 1-12 hours was performed in an atmosphere containing 3-100% hydrogen, thereby performing the step of hydrogenating the semiconductor layers. This step is the step of terminating dangling bonds of $10^{16}$-$10^{28}$/cm$^3$ which lie in the semiconductor layers, by means of thermally excited hydrogen. Plasma hydrogenation (using hydrogen excited by plasma) may be performed as another hydrogenation means.

After the completion of the activation and hydrogenation steps, an interlayer insulating film 145 having an average thickness of 1.0-2.0 µm is formed out of an organic insulating material. The organic insulating material can use polyimide, acrylic, polyamide, polyimide amide, BCB (benzocyclobutene) and the like.

By forming the interlayer insulating film 145 out of the organic insulating material in this manner, it is possible to flatten the surface. In general, since organic resin materials are low in dielectric constant, parasitic capacitance can be reduced. However, since the organic resin materials have hygroscopic characteristics and are not suited to protective film, the organic resin materials need to be used in combination with a silicon oxide film, a silicon nitride film or a silicon nitride oxide film formed as the protective insulating film 144.

After that, a photomask is used to form a resist mask having a predetermined pattern, thereby forming contact holes each of which reaches either of the source and drain regions formed in a respective one of the semiconductor layers. In Embodiment 1, the interlayer insulating film 145 formed of the organic resin material is etched by a dry etching method using a mixture of CF$_4$, O$_2$ and He as an etching gas, and then the protective insulating film 144 is etched by using CF$_4$ and O$_2$ as an etching gas.

Then, a conductive metal film is formed by a sputtering method or a vacuum evaporation method, and a resist mask pattern is formed with a photomask, and source lines 146-150 and drain lines 151-155 are formed by etching. The drain line 155 functions as a pixel electrode. Although not shown, in Embodiment 1, a Ti film is formed to a thickness of 50-150 nm, thereby forming contact with a semiconductor film which forms the source regions or the drain regions of the semiconductor layers, and an aluminum film of thickness 300-400 nm which serves as a line is formed to be stacked on the Ti film.

When hydrogenation treatment was performed in this state, results suitable for an improvement in the characteristics of TFTs were obtained. For instance, heat treatment of 300-450° for 1-12 hours is preferably performed in an atmosphere containing 3-100% hydrogen. Otherwise, a similar advantage was obtained by using a plasma hydrogenation method (FIG. 4C).

In this manner, it is possible to finish the TFTs for the driver circuit 230 and the pixel TFTs in the pixel section 231 on the same substrate. A first p-channel type TFT 200, a first n-channel type TFT 201, a second p-channel type TFT 202 and a second n-channel type TFT 203 are formed in the driver circuit, while a pixel TFT 204 and a storage capacitor 205 are formed in the pixel section. In the driver circuit are formed a logic circuit 232 and a sampling circuit 233. In the present specification, this substrate is called an active matrix substrate for the sake of convenience.

The first p-channel type TFT 200 of the driver circuit has a single-drain structure in which a semiconductor layer having a stacked structure made of the germanium-containing silicon film 101a and the silicon film 101b has a channel formation region 206, source regions 207a and 207b, and drain regions 208a and 208b, the source and drain regions being formed of high-concentration p-type impurity regions. The first n-channel type TFT 201 is made of a semiconductor layer which has a stacked structure made of the germanium-containing silicon film 102a and the silicon film 102b and has a channel formation region 209, an LDD region 211 on which the gate electrode 120 is superposed, a source region 212 and a drain region 211.

In this LDD region, letting $L_{OV}$ be this LDD region 210 on which the gate electrode 120 is superposed, the channel length of the LDD region $L_{OV}$ is made 0.5-3.0 µm, preferably 1.0-2.0 µm. By setting the length of the LDD region of the n-channel type TFT in this manner, it is possible to reduce a high electric field occurring near the drain region, thereby prevent the occurrence of hot carriers and preventing the degradation of the TFT.

The second p-channel type TFT 202 of the driver circuit 230 similarly has a single-drain structure in which a semiconductor layer having a stacked structure made of the germanium-containing silicon film 103a and the silicon film 103b has a channel formation region 213, source regions 214a and 214b, and drain regions 215a and 215b, the source and drain regions being formed of high-concentration p-type impurity regions.

The second n-channel type TFT 203 of the driver circuit 230 is made of a semiconductor layer which has a stacked structure made of the germanium-containing silicon film 104a and the silicon film 104b and has a channel formation region 216, LDD regions 217 and 218 on which the gate electrode 122 is partly superposed, a source region 220, and a drain region 219. The length of the region $L_{OV}$ which is superposed on the gate electrode 122 of this TFT is also made 0.5-3.0 µm, preferably 1.0-2.0 µm. The channel-direction length of an LDD region $L_{OFF}$ which is not superposed on the gate electrode 122 is made 0.5-4.0 µm, preferably 1.0-2.0 µm.

The pixel TFT 204 is made of a semiconductor layer which has a stacked structure made of the germanium-containing silicon film 105a and the silicon film 105b and has channel formation regions 221 and 222, LDD regions 223-225, and source or drain regions 226-228. The channel-direction length of an LDD region ($L_{OFF}$) is 0.5-4.0 µm, preferably 1.5-2.5 µm.

The storage capacitor 205 is formed of the capacitance line 124, an insulating film made of the same material as the gate insulating film, and a semiconductor layer 229 connected to the drain region 228 of the pixel TFT 204. Incidentally, although FIG. 4C shows the pixel TFT 204 having a double-gate structure, the pixel TFT 204 may have a single-gate structure or a multi-gate structure having plural gate electrodes.

The above-described TFT construction makes it possible to optimize the structure of TFTs which constitute individual circuits according to the required specifications of pixel TFTs and a driver circuit, thereby improving the operating performance and reliability of semiconductor devices.

This active matrix substrate can be applied to a reflection type of liquid crystal display device without modification. If a transparent type of liquid crystal display device is needed, a pixel electrode to be disposed in each pixel of the pixel section may be formed of a transparent electrode.

The process of fabricating an active matrix liquid crystal display device from the above-described active matrix substrate will be described below.

Figure 5:
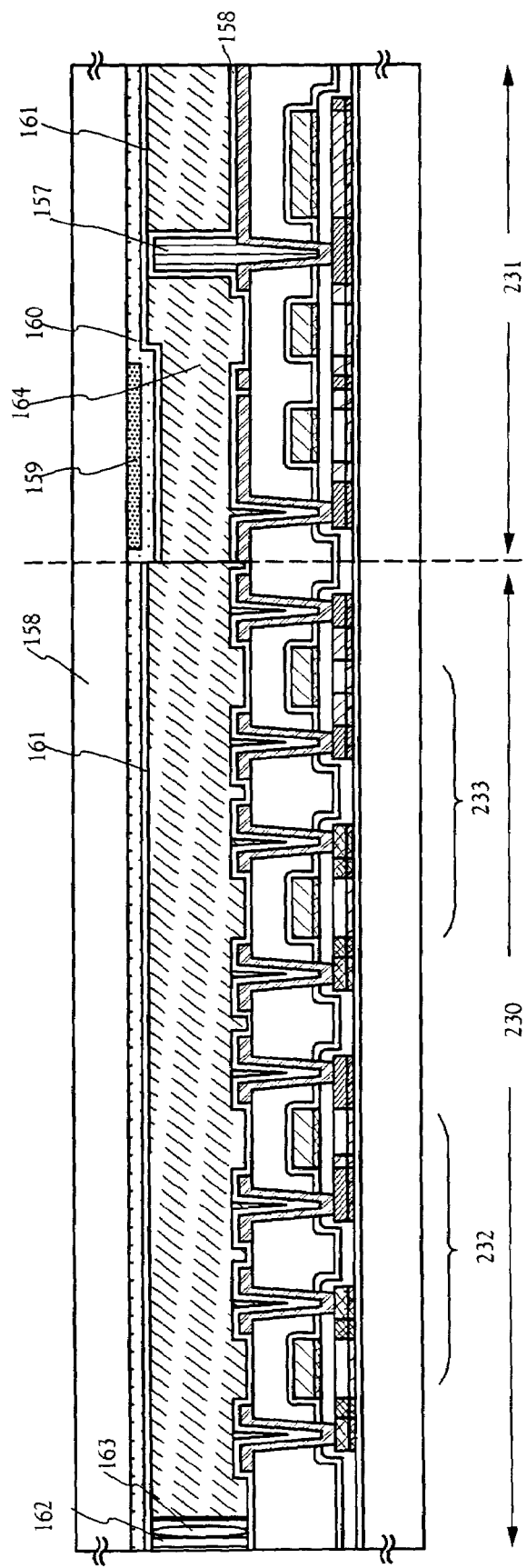
FIG. 5 is a view showing a cross-sectional structure of an active matrix type of display device of Embodiment 1.

First, as shown in FIG. 5, spacers are formed on the active matrix substrate which is in the state shown in FIG. 4C. The spacers may be provided by the method of scattering grains having a grain size of several µm, but Embodiment 1 adopts the method of forming a resin film on the entire surface of the substrate and patterning the resin film to form a columnar spacer 157.

The arrangement of the columnar spacer 157 may be arbitrarily determined, but it is preferable that the columnar spacer 157 be formed to be superposed on and cover the contact portion of the drain line 155 (pixel electrode) in the pixel section 231, as shown in FIG. 5. The flatness of the contact portion is impaired, so that liquid crystal is not correctly oriented in this portion. Since the columnar spacer 157 is formed by filling the contact portion with a spacer-forming resin, disclination or the like can be prevented.

After that, an alignment film 158 was formed. Ordinarily, a polyimide resin is used for the alignment film of a liquid crystal display device. After the alignment film 158 has been formed, the alignment film 158 is subjected to rubbing treatment to align liquid crystal molecules at a certain constant pretilt angle. In rubbing treatment, the occurrence of static electricity often becomes a problem, but if the columnar spacers 157 are also formed on the TFTs of the driver circuit, it is possible to realize the role of the spacer and the effect of protecting the TFTs from static electricity.

A light-shielding film 159, a transparent conductive film 160 and an alignment film 161 are formed on a counter substrate 158 disposed on a counter side. The light-shielding film 159 is formed of Ti, Cr, Al or the like, and has a thickness of 150-300 nm. The active matrix substrate on which the pixel section and the driver circuit are formed and the counter substrate are stuck to each other with a sealing material 162. The sealing material 162 contains a filler 163, and the two substrates are stuck together in the state of being spaced a uniform distance apart from each other, by the filler 163 and the columnar spacer 157. After that, a liquid crystal material 164 is filled into the gap between both substrates, and is completely sealed between the substrates by a sealing material (not shown). A known liquid crystal material may be used as the liquid crystal material. In this manner, the active matrix liquid crystal display device shown in FIG. 5 is completed.

Embodiment 2

In the following description of Embodiment 2, reference will be made to a method of fabricating an active matrix substrate and an active matrix liquid crystal display device, both of which differ from those of Embodiment 1. In the following description, an example of fabricating an N-channel type inverted stagger type TFT 420 and a P-channel type inverted stagger type TFT 421 will be described below with reference FIGS. 6A to 7C.

First of all, a substrate 400 is prepared. The substrate 400 can use an insulating substrate such as a glass substrate, a quartz substrate or a crystalline glass substrate. Incidentally, it is also preferable to adopt a construction in which an undercoat insulating film is provided for preventing the diffusion of impurities from the substrate 400 and improving the electrical characteristics of TFTs. The undercoat insulating film can use a film having a thickness of 100-500 nm, such as a silicon oxide film, a silicon nitride film, silicon nitride oxide film (SiOxNy). The formation of the undercoat insulating film can use a forming method such as a thermal CVD method, a plasma CVD method, a vacuum evaporation method, a sputtering method or a reduced-pressure thermal CVD method. Otherwise, the substrate 400 may also use a substrate of the type in which an insulating film is formed on a surface of a semiconductor substrate made of silicon, germanium, gallium, arsenic or the like. In addition, a plastic substrate having may also be used.

Then, gate lines (containing gate electrodes) 401 and 402 each having a single-layer film or a stacked film is formed. Each of the gate lines 401 and 402 are formed by forming a conductive film having a thickness of 10-1000 nm, preferably 30-300 nm, by using a forming method such as a thermal CVD method, a plasma CVD method, reduced-pressure thermal CVD method a vacuum evaporation method or a sputtering method, and then applying known patterning techniques to the conductive film. The material of each of the gate lines 401 and 402 may be selected from, but not limited to, materials which contain conductive materials or semiconductor materials as their main components, for example, high melting point metal materials such as Ta (tantalum), Mo (molybdenum), Ti (titanium), W (tungsten) and Cr (chromium), or silicides which are compounds of such high melting point metal materials and silicon, or materials such as polysilicon having N— or P-type conductivity, or materials containing low resistance metal materials such as Cu (copper) and Al (aluminum). Each of the gate lines 401 and 402 can use, but not limited to, a structure having at least one material layer made of a material selected from among the aforesaid materials. Incidentally, it is desirable that each of the gate lines 401 and 402 have a stacked structure which are formed of a lower layer made of a low resistance metal material and an upper layer made of a high melting point metal material, for example, a stacked structure of Al (lower layer) and Ta (upper layer), a stacked structure of Al (lower layer) and W (upper layer), or a stacked structure of Al (lower layer) and Cu (upper layer). In addition, an anodic oxide film or an oxide film may be formed to protect the gate lines 401 and 402.

Figure 6A:
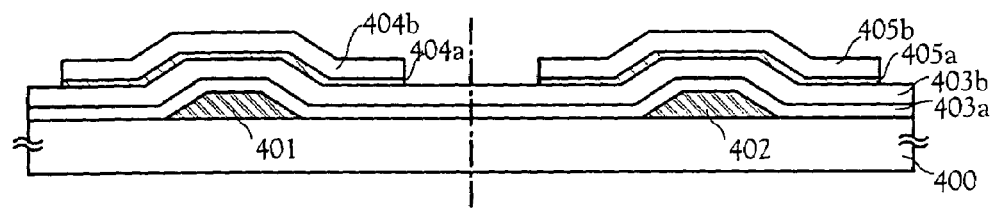
FIGS. 6A to 6D are views showing the process of fabricating an AM-LCD of Embodiment 2.

Then, a gate insulating film is formed. The gate insulating film may use a film having a thickness of 100-400 nm, such as a silicon oxide film, a silicon nitride film, a silicon nitride oxide film (SiOxNy), an organic-resin film (BCB (benzocyclobutene)), or a film in which some of them are stacked. The formation of the gate insulating film can use a forming method such as a thermal CVD method, a plasma CVD method, a reduced-pressure thermal CVD method, a vacuum evaporation method, a sputtering method or an application method. As shown in FIG. 6A, Embodiment 2 uses a stacked structure made of gate insulating films 403a and 403b. As the lower gate insulating film 403a, a silicon nitride film for effectively preventing the diffusion of impurities from the substrate or the gate line is formed to a thickness of 10 nm to 60 nm.

Then, a laminated film made of a germanium-containing silicon film and a silicon film is formed. The germanium-containing silicon film which constitutes the lower layer uses a film which contains silicon as its main component and germanium in the range of 0.1 atomic % to less than 10 atomic %, preferably 1 to 5 atomic %. Each of the concentrations of nitrogen and carbon contained in the germanium-containing silicon film is preferably made less than $5\times10^{18}/cm^3$, while the concentration of oxygen contained in the germanium-containing silicon film is preferably made less than $1\times10^{19}/cm^3$.

The formation of the germanium-containing silicon film is not limited to a particular method. The germanium-containing silicon film may be formed by a plasma CVD method or a reduced-pressure thermal CVD method, or by a sputtering method using a target made of germanium-containing silicon, or by implanting germanium ions into a silicon film obtained from a plasma CVD method, a reduced-pressure CVD method or a sputtering method.

In the silicon film which constitutes the upper layer, each of the concentrations of nitrogen and carbon contained in the silicon film is preferably made less than $5\times10^{18}/cm^3$, while the concentration of oxygen contained in the silicon film is preferably made less than $1\times10^{19}/cm^3$. The formation of the silicon film is not limited to a particular method, and can use a known technique such as a plasma CVD method, a reduced-pressure thermal CVD method or a sputtering method.

Incidentally, if the gate insulating films 403a and 403b and the amorphous semiconductor films (the germanium-containing silicon film and the silicon film) are continuously deposited without exposing them to the air, impurities do not enter any of the interfaces between the gate insulating films and the amorphous semiconductor films, whereby good interfacial characteristics can be obtained.

Then, after the crystallization treatment of the amorphous semiconductor films has been performed to form crystalline semiconductor films, the obtained crystalline semiconductor films are patterned into the desired shapes, thereby forming crystalline semiconductor layers one of which has a stacked structure made of the germanium-containing silicon film 404a and the silicon film 404b and the other of which has a stacked structure made of the germanium-containing silicon film 404b and the silicon film 405b (FIG. 6A). The crystallization treatment may use the laser treatment described above in Embodiment Mode 1.

Figure 6B:
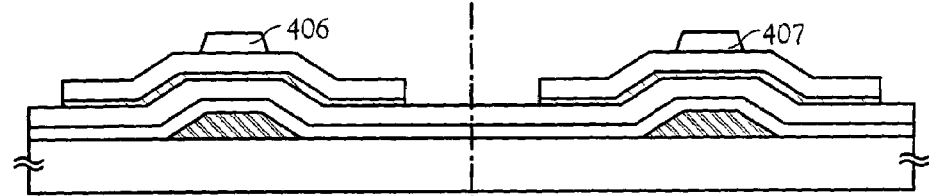

Then, insulating layers 406 and 407 are formed on the crystalline semiconductor layers. The respective insulating layers 406 and 407 protect channel formation regions during the step of adding impurity elements. Each of the insulating layers 406 and 407 can use a film having a thickness of 100-400 nm, such as a silicon oxide film, a silicon nitride film, a silicon nitride oxide film (SiOxNy), an organic-resin film (BCB film), or a film in which some of them are stacked. Each of the insulating layers 406 and 407 is formed by using a known patterning technique such as ordinary exposure or reverse face exposure. (FIG. 6B)

Figure 6C:
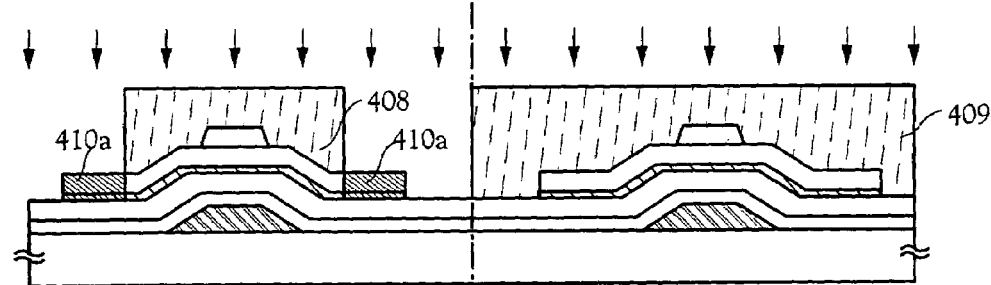

Then, a resist mask 408 which covers part of a semiconductor layer which constitutes an N-channel type TFT and a resist mask 409 which covers part of a semiconductor layer which constitutes a P-channel type TFT are formed by using a photomask, and the doping step of adding an impurity element which imparts n-type conductivity to the semiconductor layers is performed, thereby forming a first impurity region ($n^+$ region) 410a. (FIG. 6C)

Figure 6D:
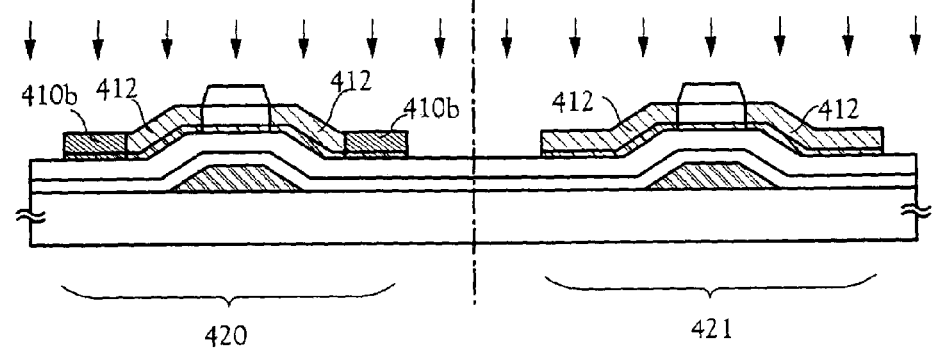

Then, after the resist masks 408 and 409 have been removed, the second doping step of adding an impurity element which imparts n-type conductivity to the semiconductor layers is performed by using the insulating layers 406 and 407 as masks, thereby forming a second impurity region ($n^-$ region) 412 (FIG. 6D). In this step, an impurity is further added to form a first impurity region 410b.

Figure 7A:
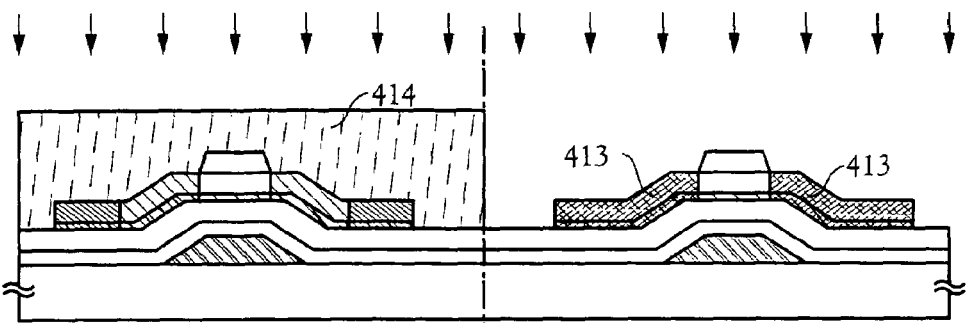
FIGS. 7A to 7C are views showing the process of fabricating an AM-LCD of Embodiment 2.

Then, a resist mask 414 which covers the N-channel type TFT is formed by using a photomask, and the step of adding an impurity element which imparts p-type conductivity to the semiconductor layers is performed, thereby forming a third impurity region ($p^+$ region) 413 (FIG. 7A).

Then, after the resist mask 414 has been removed, the activation of impurity ions and recovery of damages due to ion doping are promoted by furnace anneal, laser anneal or lamp anneal.

Through the above-described steps, the source region, the drain region, the low-concentration impurity region and the channel formation region of the N-channel type TFT 420 are formed, and the source region, the drain region and the channel formation region of the P-channel type TFT 421 are formed.

Figure 7B:
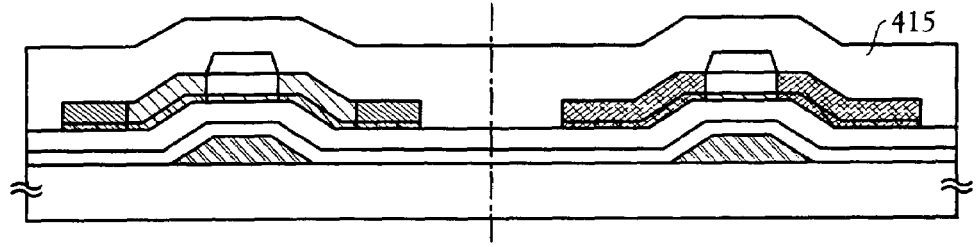

Then, an interlayer insulating film 415 is formed over the entire surface of the substrate 400 in accordance with Embodiment 1 (FIG. 7B).

Figure 7C:
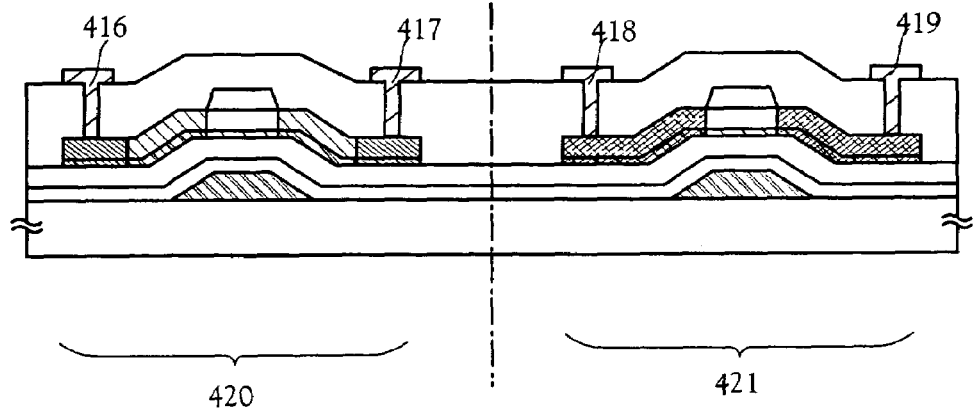

Then, after contact holes have been formed by using known techniques, lines 416-419 are formed to obtain the state shown in FIG. 7C. These lines 416-419 function as source lines or drain lines. Finally, in a hydrogen atmosphere, heat treatment is performed to hydrogenate the whole of the substrate, thereby finishing the N-channel type TFT 420 and the P-channel type TFT 421.

Incidentally, the doping sequence ($n^+$ region→$n^-$ region→$p^+$ region) of Embodiment 2 is not limitative, and it is possible to adopt another doping sequence, for example, $p^+$ region→$n^-$ region→$n^+$ region.

In addition, the process of Embodiment 2 may also include the step of adding a slight amount of impurity element to the channel formation regions and controlling the thresholds of the TFTs (also called a channel-doping step).

A circuit in which the N-channel type TFT and the P-channel type TFT mentioned above in the description of Embodiment 2 are complementarily coupled to each other is called a CMOS circuit, which is a basic circuit which constitutes a semiconductor circuit.

Figure 8A:
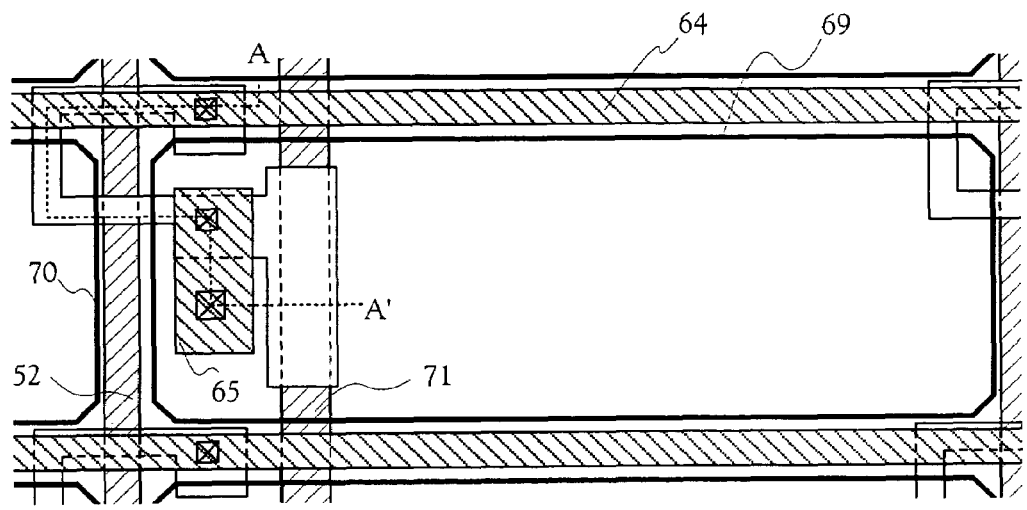
FIGS. 8A and 8B are a top plan view and a cross-sectional view of a pixel, respectively, of Embodiment 2.
Figure 8B:
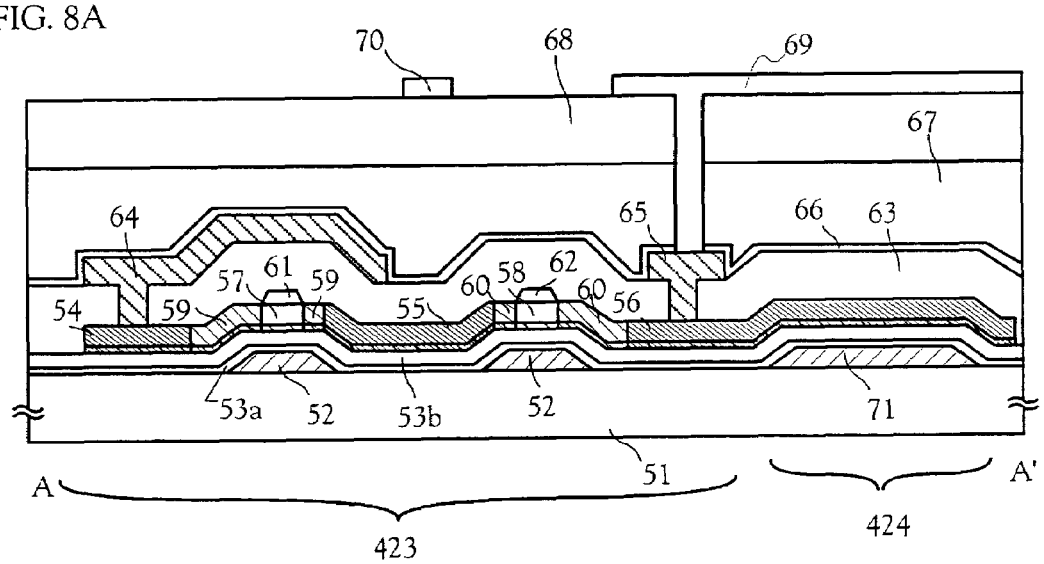

In addition, it is possible to form pixel TFTs for a pixel section by using N-channel type TFTs of the type mentioned above in the description of Embodiment 2. FIG. 8A is a magnified top plan view of one pixel of a pixel section, and a portion taken along line A-A' of FIG. 8A corresponds to the cross-sectional structure of the pixel section shown in FIG. 8B.

In the pixel section, a pixel TFT portion 403 is made of N-channel type TFTs. Gate electrodes 52 are formed on a substrate 51, and a first insulating film 53a made of silicon nitride and a second insulating film 53b made of silicon oxide are provided to overlie the gate electrodes 52. On the second insulating film 53b, $n^+$ regions 54-56 (which serve as active layers) and channel formation regions 57 and 58 are formed, and an $n^-$-type region 59 is formed between each of the $n^+$-type regions 54 and 55 and the channel formation region 57, while an $n^-$-type region 60 is formed between each of the $n^+$-type regions 55 and 56 and the channel formation region 58. The active layers are semiconductor layers each having a stacked structure formed of a lower layer made of germanium-containing silicon film and an upper layer made of silicon film. The respective channel formation regions 57 and 58 are protected by insulating layers 61 and 62. After contact holes have been formed in a first interlayer insulating film 63 which covers the insulating layers 61 and 62 and the active layers, a line 64 is formed to be connected to the $n^+$ region 54 and a line 65 is formed to be connected to the n+ region 56, and a passivation film 66 is formed to overlie the lines 64 and 65 as well as the first interlayer insulating film 63. A second interlayer insulating film 67 is formed on the passivation film 66 and a third interlayer insulating film 68 is formed on the second interlayer insulating film 67, and a pixel electrode 69 is connected to the line 65 made of a transparent conductive film such as ITO or $SnO_2$. In FIG. 8A, reference numeral 70 denotes a pixel electrode which is adjacent to the pixel electrode 69.

In addition, a capacitor portion 424 is formed of a conductive layer 71 same as the gate electrode 52 and the $n^+$ region 56 having the first insulating film 53a and the second insulating film 53b interposed therebetween.

In the description of Embodiment 2, reference has been made to an example of a transparent type of liquid crystal display device, but Embodiment 2 is not limited to a particular example. For instance, if a metal material having reflectivity is used as the material of pixel electrodes and the manner of patterning of the pixel electrodes is altered or several steps are added or omitted, it is possible to fabricate a reflection type of liquid crystal display device.

Embodiment 3

Embodiment 3 will be described below with reference to FIG. 9 which shows the construction of an active matrix type liquid crystal display device fabricated according to Embodiment 1 or Embodiment 2.

Figure 9:
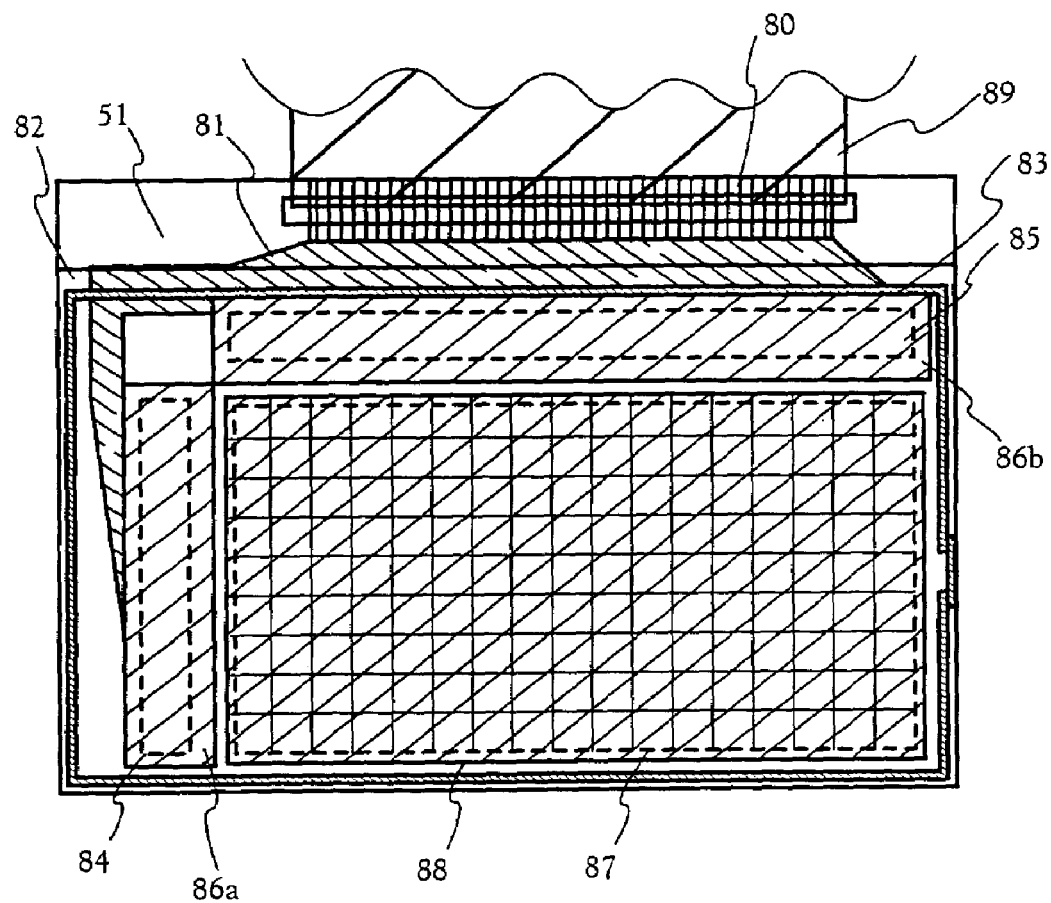
FIG. 9 is a top plan view showing the external appearance of an AM-LCD of Embodiment 3.

In the top plan view of FIG. 9, an active matrix substrate and a counter substrate 82 are stuck to each other by a sealing material 83. The active matrix substrate has a pixel section 87, a driver circuit, an external input terminal to which an FPC (flexible printed circuit board: Flexible Printed Circuit) is stuck, lines 81 which connect the external input terminal and the input parts of individual circuits, and others, while the counter substrate 82 has a color filter and others.

A light-shielding layer 86a is disposed on the counter substrate 82 in such a manner as to be superposed on a gate-side driver circuit 84, and a light-shielding layer 86b is disposed on the counter substrate 82 in such a manner as to be superposed on a source-side driver circuit 85. In addition, a color filter 88 which is disposed on the counter substrate 82 over a pixel section 87 has a light-shielding layer as well as colored layers of red (R), green (G) and blue (B) which correspond to individual pixels. During actual display, color display is formed by three colors provided by the respective colored layers of red (R), green (G) and blue (B). The arrangement of these colored layers may be arbitrary.

In Embodiment 3, the color filter 88 is disposed on the counter substrate 82 for the purpose of realizing color display, but Embodiment 3 is not limited to a particular example. For instance, in the fabrication of an active matrix substrate, a color filter may also be formed on the active matrix substrate.

The color filter 88 has the light-shielding layer at the position between each adjacent pixel so that the portions other than display regions are shielded from light. In Embodiment 3, the light-shielding layers 86a and 86b are respectively disposed in regions which cover the driver circuit, but no particular light-shielding layers may be formed in the regions which cover the driver circuit, because the regions are covered with a cover in a later step of incorporating the liquid crystal display device as a display section of an electronic apparatus. In the fabrication of an active matrix substrate, such a light-shielding layer may also be formed on the active matrix substrate.

Otherwise, instead of the above-described light-shielding layers, a stacked layer in which plural colored layers which constitute a color filter are stacked may be appropriately disposed between a counter substrate and counter electrodes so that the portions other than display regions (the gap between each pixel electrode) and a driver circuit may be shielded from light.

An FPC 89 made of a base film and lines is stuck to the external input terminal by an anisotropic conductive resin. Moreover, the mechanical strength of the external input terminal is increased with an reinforcing plate.

The liquid crystal display device fabricated in the above-described manner can be used for the display sections of various kinds of electronic apparatus.

Figure 10:
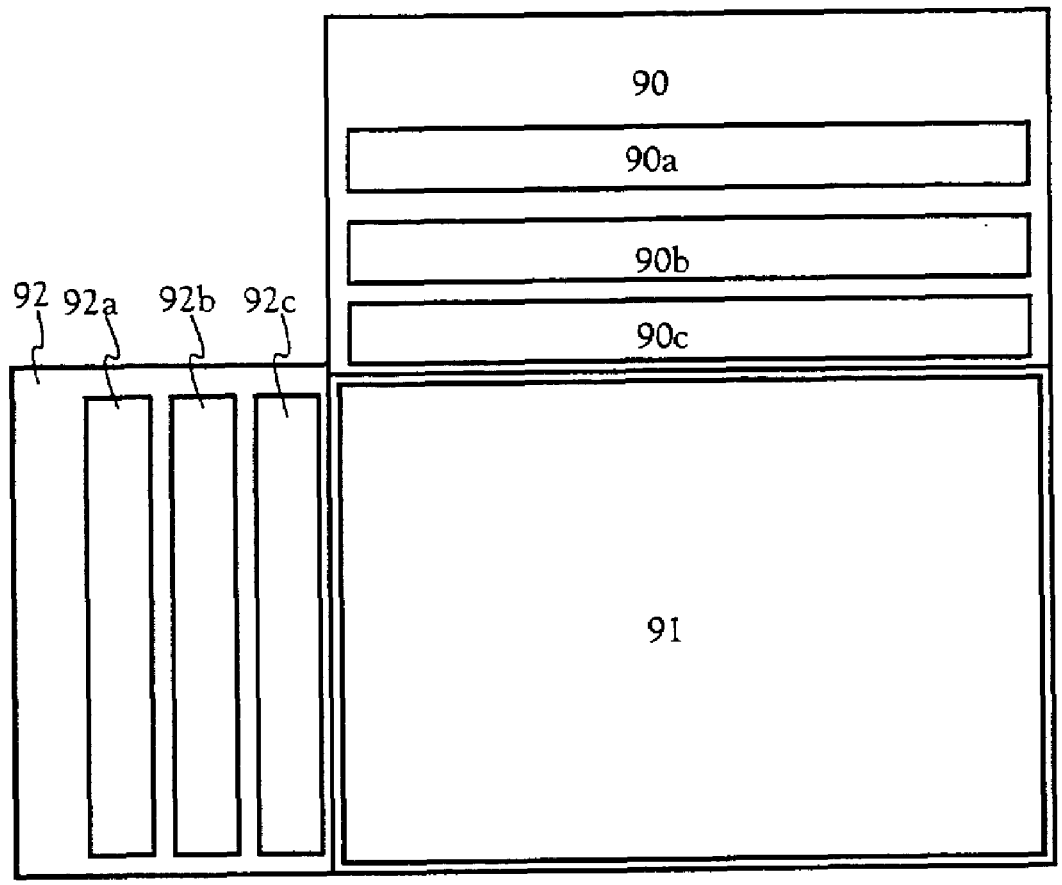
FIG. 10 is a block diagram of a liquid crystal display device of Embodiment 3.

FIG. 10 is a block diagram of the above-described liquid crystal display device. FIG. 10 shows a circuit construction for effecting analog driving. In Embodiment 3, the circuit construction has a source-side driver circuit 90, a pixel section 91 and a gate-side driver circuit 92. Incidentally, the term "driver circuit" used herein is a generic term representative of a source-side processing circuit and a gate-side driving circuit.

The source-side driver circuit 90 is provided with a shift register 90a, a buffer 90b and a sampling circuit (transfer gate) 90c. The gate-side driver circuit 92 is provided with a shift register 92a, a level shifter 92b and a buffer 92c. If necessary, a level shifter circuit may also be provided between the sampling circuit 90c and the shift register 90a.

In Embodiment 3, the pixel section 91 includes plural pixels, and the plural pixels are provided with TFT elements, respectively.

The source-side driver circuit 90 and the gate-side driver circuit 92 are formed of N-channel type TFTs or P-channel type TFTs.

Although not shown, another gate-side driver circuit may be provided on the side of the gate-side driver circuit 92 opposite to the gate-side driver circuit 92 holding the pixel section 91.

Figure 11:
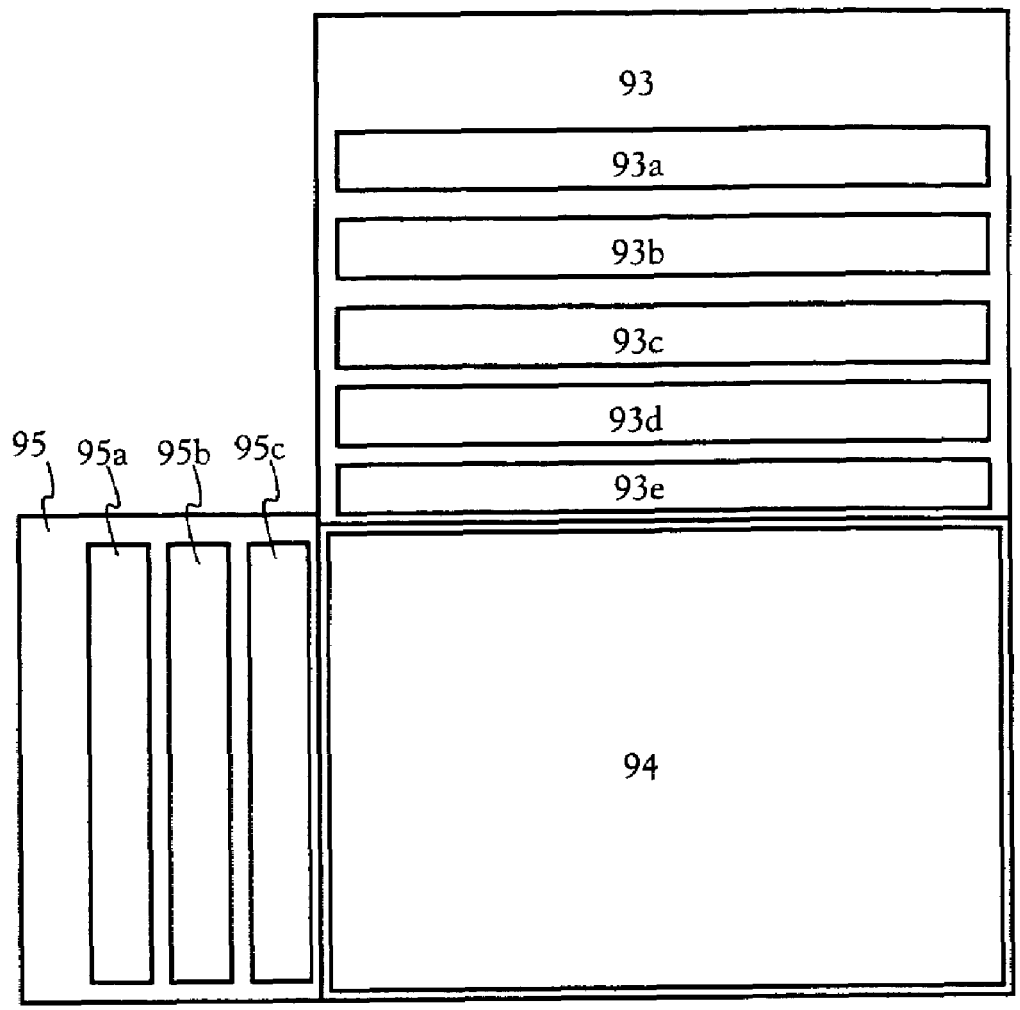
FIG. 11 is a block diagram of a liquid crystal display device of Embodiment 3.

In the case where digital driving is needed, as shown in FIG. 11, a latch (A) 93b and a latch (B) 93c may be provided instead of the sampling circuit. A source-side driver circuit 93 is provided with a shift register 93a, the latch (A) 93b, the latch (B) 93c, a D/A converter 93d and a buffer 93e. A gate-side driver circuit 95 is provided with a shifter register 95a, a level shifter 95b and a buffer 95c. If necessary, a level shifter circuit may be provided between the latch (B) 93c and the D/A converter 93d.

The above-described construction can be realized in accordance with the manufacturing process described above in connection with Embodiment 1 or 2. In accordance with the manufacturing process according to Embodiment 3, it is possible to construct far more complicated logic circuits (such as a signal dividing circuit, a D/A converter, an operational amplifier and a γ correction circuit), and it is also possible to form a memory and a microprocessor on the same substrate.

Embodiment 4

In the description of Embodiment 4, reference will be made to an example in which, in Embodiment 2, gate insulating films and semiconductor layers are continuously deposited on a substrate on which gate electrodes are provided, by a sputtering method.

Figure 18:
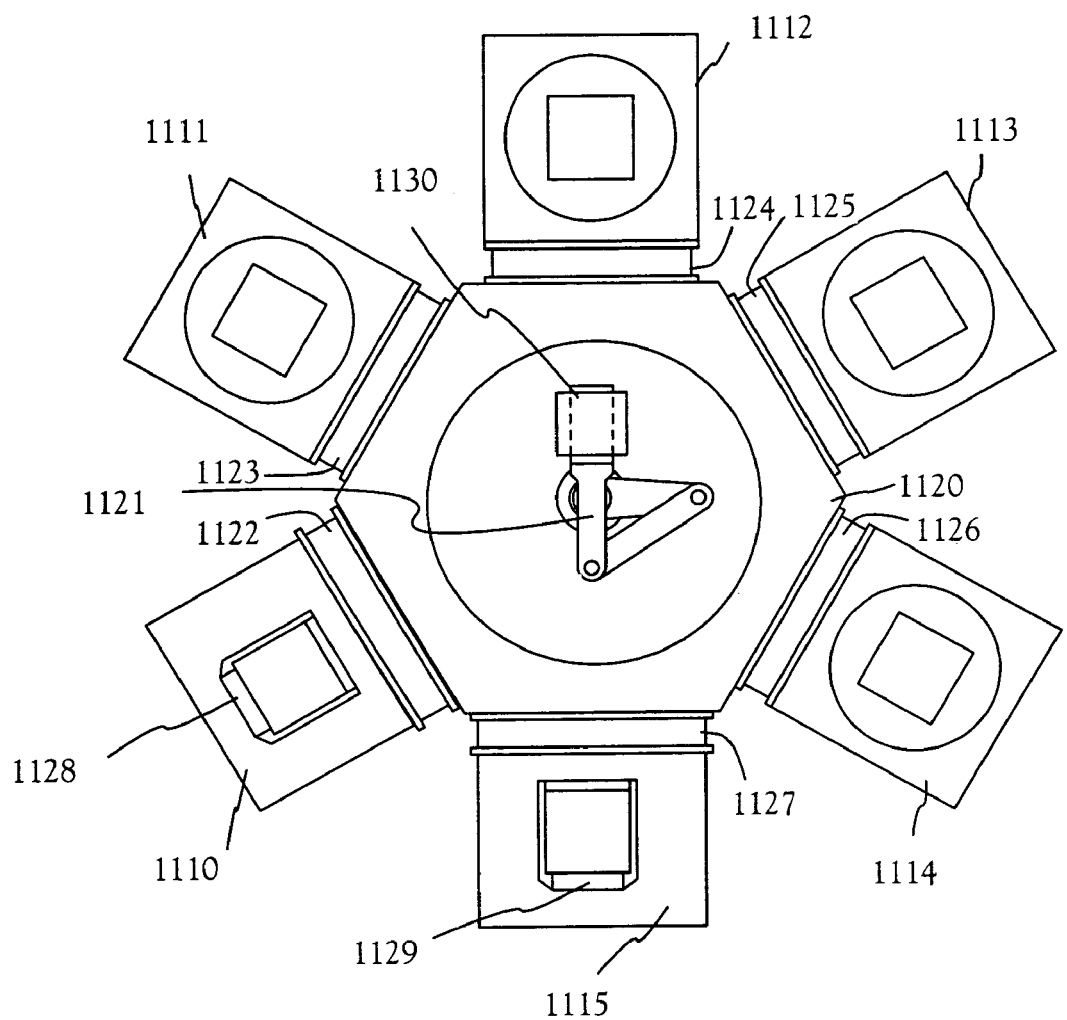
FIG. 18 is a view showing one example of a manufacturing apparatus of Embodiment 4.

First, after the gate lines 401 and 402 have been formed on the substrate 400, the lower gate insulating film 403a, the upper gate insulating film 403b, the first amorphous semiconductor film and the second amorphous semiconductor film are continuously stacked in that order. FIG. 18 shows an example of an apparatus provided with plural chambers to be used for this continuous deposition.

In Embodiment 4, since only a sputtering method can be used to perform deposition at a comparatively low temperature, it is possible to use a plastic substrate. However, it goes without saying that the invention is not limited to only Embodiment 4 and can use substrates other than the plastic substrate.

FIG. 18 is a top view schematically showing the apparatus used in Embodiment 4 (continuous deposition system). In FIG. 18, reference numerals 1110 to 1115 denote chambers each having gas tightness. An evacuation pump and an inert-gas introducing system are disposed in each of the chambers 1110 to 1115.

The chambers denoted by 1110 and 1115 are load lock chambers for loading a sample (a substrate to be treated) 1130 into the system. Reference numeral 1111 denotes a first chamber for depositing a first gate insulating film. Reference numeral 1112 denotes a second chamber for depositing a second gate insulating film. Reference numeral 1113 denotes a third chamber for depositing a first amorphous semiconductor film and a second amorphous semiconductor film. Reference numeral 1120 denotes a common sample chamber disposed in common with individual chambers. Reference numeral 1114 denotes a fourth chamber for continuously depositing insulating films on the amorphous semiconductor films to form the insulating layers 406 and 407 out of the insulating films.

An example of the operation of the apparatus will be described below.

First, after high vacuums have been drawn in all the chambers once, all the chambers are brought to the state (normal pressure) of being purged by an inert gas, in this example, nitrogen. In addition, all gate valves 1122 to 1127 are closed.

A cassette 1128 in which multiple substrates to be treated are accommodated is loaded into the load lock chamber 1110. After the cassette 1128 has been loaded, the door (not shown) of the load lock chamber 1110 is closed. During this state, a gate valve 1122 is opened and one substrate 1130 to be treated is taken out of the cassette 1128, and is, in turn, taken into the common chamber 1120 by a robot arm 1121. At this time, positioning is performed in the common chamber. Incidentally, this substrate 1130 uses a substrate on which the lines 401 and 402 are formed in accordance with Embodiment 2.

Then, the gate valve 1122 is closed, and the gate valve 1123 is opened. Then, the substrate 1130 to be treated is transported to the first chamber 1111. In the first chamber 1111, the insulating film 403*a* is obtained. In Embodiment 4, a single-layer silicon nitride film is adopted as the insulating film 403*a*, but a stacked structure made of two or more layers may be adopted. Incidentally, in Embodiment 4, although a chamber capable of a sputtering method using a target is used as the first chamber 1111, a chamber capable of a plasma CVD method may also be used.

After the completion of the deposition of the insulating film 403*a*, the substrate 1130 to be treated is retracted into the common chamber 1120 and transported to the second chamber 1112 by the robot arm 1121. In the second chamber 1112, the insulating film 403*b* is obtained through a sputtering method similar to that used in the first chamber 1111.

After the completion of the deposition of the insulating film 403*b*, the substrate 1130 is retracted into the common chamber 1120 and transported to the third chamber 1113. In the third chamber 1113, the first amorphous semiconductor film and the second amorphous semiconductor film are obtained through a sputtering method similar to that used in the second chamber 1112. Plural targets are provided in the third chamber 1113, and during the deposition of the first amorphous semiconductor film, a target made of germanium-containing silicon film is used, and during the deposition of the second amorphous semiconductor film, a target made of silicon film is used. In Embodiment 4, the first and second amorphous semiconductor films are stacked in the same chamber, but they may also be stacked in different chambers, respectively. Incidentally, the third chamber 1113 uses a chamber which enables a sputtering method using a target, but it may also use a chamber which enables a plasma CVD method.

After the completion of the deposition of the amorphous semiconductor film, the substrate 1130 is retracted into the common chamber 1120.

The treated substrate on which the four layers have been continuously formed in this manner is transported to the load lock chamber 1115 and accommodated into a cassette 1129.

Since the films are continuously deposited in this manner without exposing them to the air, impurities do not enter any of the interfaces between the gate insulating films and the amorphous semiconductor films, whereby good interfacial characteristics can be obtained.

Moreover, to continuously form insulating films on the amorphous semiconductor films to form the insulating layers 406 and 407, the treated substrate is transported to the fourth chamber 1114 and the insulating layers 406 and 407 are deposited in a similar manner followed by patterning.

It goes without saying that the apparatus shown in FIG. 18 is merely one example. In addition, Embodiment 4 can be freely combined with any one of Embodiments 1 to 3.

For instance, Embodiment 4 can be applied to the case in which the undercoat insulating film 100*a* and the amorphous semiconductor films in Embodiment 1 are continuously deposited. In this case, the lower layer of the undercoat insulating film is deposited in the first chamber, and the upper layer of the undercoat insulating film is deposited in the second chamber, and the first amorphous semiconductor film and the second amorphous semiconductor film may be deposited in the third chamber. Otherwise, the first and amorphous semiconductor film and the second amorphous semiconductor film may be deposited in different chambers. Specifically, the first amorphous semiconductor film may be formed in the third chamber, and the second amorphous semiconductor film in the fourth chamber.

Embodiment 5

An example of an EL (electroluminescence) display device fabricated by using the TFTs obtained in Embodiment 1 will be described below with reference to FIGS. 12 to 15.

Figure 12:
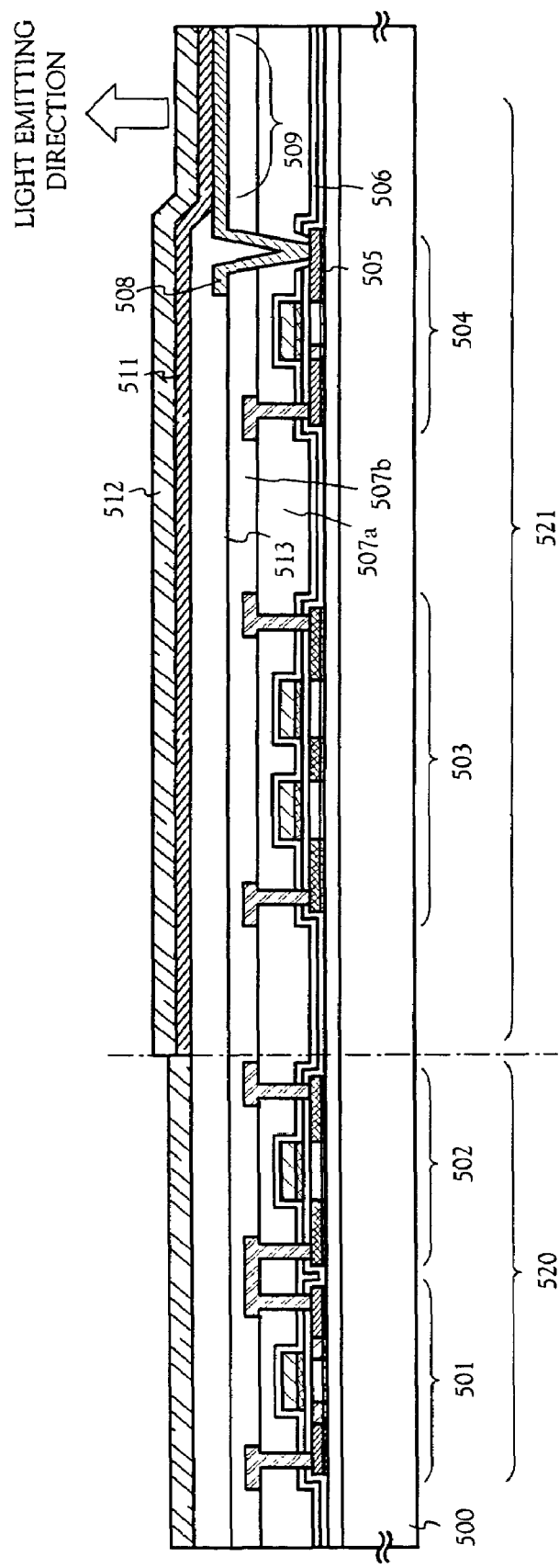
FIG. 12 is a cross-sectional view of an EL display device of Embodiment 5.

FIG. 12 shows an example of a luminescent device having an insulator on which a pixel section 521 and a driver circuit 520 for driving the pixel section are disposed (the luminescent device is in the state of being not yet sealed). In FIG. 12, a CMOS circuit which constitutes a basic unit for the driver circuit is shown in the driver circuit, and one pixel is shown in the pixel section. This CMOS circuit can be obtained in accordance with Embodiment 1.

In FIG. 12, reference numeral 500 denotes an insulator, and formed on the insulator 500 are an N-channel type TFT 501, a P-channel type TFT 502, a switching TFT 503 made of a P-channel type TFT, and a current control TFT 504 made of an N-channel type TFT.

Since the N-channel type TFT 501 and the P-channel type TFT 502 are as described previously in connection with Embodiment 1, the description of the N-channel type TFT 501 and the P-channel type TFT 502 is omitted. The switching TFT 503 has a structure (double-gate structure) which has two channel formation regions between the source region and the drain region, but the description of the switching TFT 503 is omitted since it can readily be understood by referring to the description of the structure of the P-channel type TFT in Embodiment 1. Incidentally, Embodiment 5 is not limited to only the double-gate structure, and may also be applied to a single-gate structure in which one channel formation region is formed or a triple-gate structure in which three channel formation regions are formed.

Before interlayer insulating films 507*a* and 507*b* are formed, a contact hole is formed in a protective insulating film 506 and a gate insulating film over a drain region 505 of the current control TFT 504. This contact hole is intended to facilitate an etching step for forming contact holes in the first interlayer insulating film 507*a* and the second interlayer insulating film 507*b*. The contact holes are formed in the interlayer insulating films 507a and 507b in such a manner as to reach the drain region 505, and a pixel electrode 508 is formed to be connected to the drain region 505. The pixel electrode 508 is an electrode which functions as the negative electrode of the EL element, and is formed of a conductive film containing an element which belongs to Group I or II of the periodic table. In Embodiment 5, the pixel electrode 508 uses a conductive film made of a compound of lithium and aluminum.

Then, an insulating film 513 is formed to cover an end portion of the pixel electrode 508, and is herein called a bank. The bank 513 may be formed of a silicon-containing insulating film or a resin film. In the case where a resin film is used, if carbon grains or metal grains are added so that the resistivity of the resin film becomes $1\times10^6$ Ωm to $1\times10^{12}$ Ωm (preferably $1\times10^8$ Ωm to $1\times10^{10}$ Ωm), it is possible to suppress the dielectric breakdown of the resin film during the deposition thereof An EL element 509 is made of a pixel electrode (negative electrode (cathode)) 508, an EL layer 511 and a positive electrode (anode) 512. The positive electrode 512 uses a conductive film having a large work function, representatively, an oxide conductive film. The oxide conductive film may use any one of indium oxide, zinc oxide and lead oxide, or a compound of these oxides.

The term "EL layer" used herein is defined as a lamination body in which an luminescent layer is combined with a hole injection layer, a hole transport layer, a hole blocking layer, an electron transport layer, an electron injection layer or an electron blocking layer.

Incidentally, although not shown, it is advantageous that after the positive electrode 512 has been formed, a passivation film is formed to completely cover the EL element 509. The passivation film is made of insulating films such as carbon film, silicon nitride film and silicon nitride oxide film, and uses any one of the insulating films as a single layer or any ones of the insulating films as a stacked layer in which they are combined.

The EL display device subjected to a sealing (or enclosing) step for protecting the EL element will be described below with reference to FIGS. 13A and 13B.

Figure 13A:
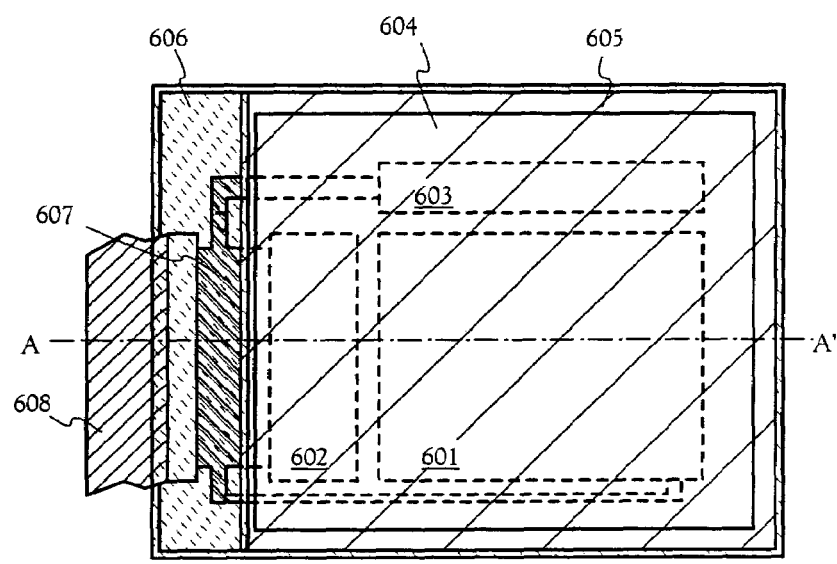
FIGS. 13A and 13B are a top plan view and a cross-sectional view showing the construction of an active matrix type EL display device, respectively, of Embodiment 5.
Figure 13B:
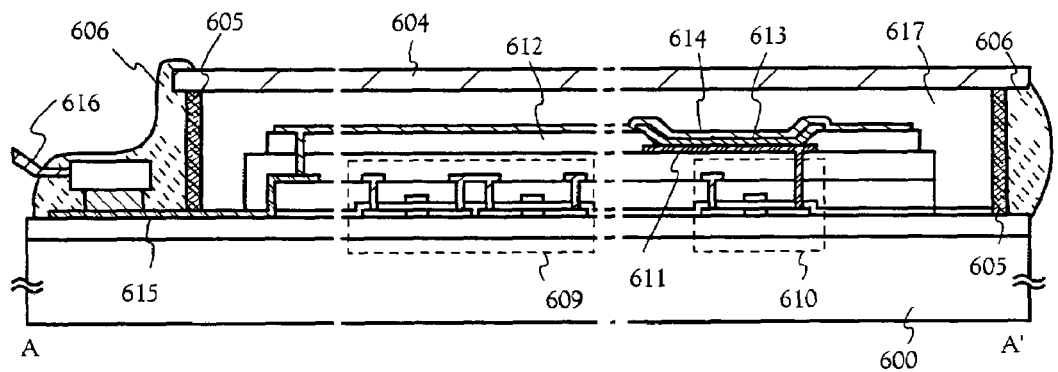

FIG. 13A is a top plan view showing the state in which the EL element is sealed in the EL display device, and FIG. 13B is a cross-sectional view taken along line A-A' of FIG. 13A. Reference numerals 601, 602 and 603 denote, respectively, a pixel section, a source-side driver circuit and a gate-side driver circuit all of which are shown by dashed lines. Reference numerals 604, 605 and 606 denote, respectively, a cover material, a first sealing material and a second sealing material.

Incidentally, reference numeral 608 denotes an FPC (flexible printed circuit) which constitutes an external input terminal and includes lines through which to transmit signals to be inputted to the source-side driver circuit 602 and the gate-side driver circuit 603. The source-side driver circuit 602 and the gate-side driver circuit 603 receive video signals or clock signals from the FPC 608. Incidentally, although only the FPC 608 is shown in FIG. 13A, a printed wiring board (PWB) may also be mounted on the FPC.

A cross-sectional structure will be described below with reference to FIG. 13B. The pixel section 601 and a source-side driver circuit 609 are formed over an insulator 600, and the pixel section 601 is formed of plural pixels each including a current control TFT 710 and a pixel electrode 611 which is electrically connected to the drain of the current control TFT 710. The source-side driver circuit 609 is formed of a CMOS circuit in which an N-channel type TFT and a P-channel type TFT are combined. Incidentally, a polarization sheet (representatively, a circular polarization sheet) may also be stuck to the insulator 600.

The bank 612 is formed at both ends of the pixel electrode 611, and an EL layer 613 and a positive electrode 614 of the EL element are formed over the pixel electrode 611. The positive electrode 614 also functions as a line common to all pixels, and is electrically connected to an FPC 616 via a connecting line 615. In addition, all elements contained in the pixel section 601 and the source-side driver circuit 609 are covered with a passivation film (not shown).

A cover material 604 is stuck to the insulator 600 by a first sealing material 605. Incidentally, spacers may also be disposed to ensure the gap between the cover material 604 and the EL element. Incidentally, a space 617 is formed on the inside of the first sealing material 605. Incidentally, it is desirable that the first sealing material 605 be a material which does not allow water or oxygen to pass through it. In addition, it is advantageous that a substance having moisture absorption effect or a substance having an oxidation prevention effect is provided in the interior of the space 617.

Incidentally, it is preferable that a carbon film (specifically, a diamond-like carbon film) of thickness 2-30 nm be formed as a protective film on each of the obverse and reverse surface of the cover material 604. This carbon film (not shown) has the role of preventing penetration of oxygen and water and mechanically protecting the surfaces of the cover material 604.

In addition, after the cover material 604 has been adhered, a second sealing material 606 is formed to cover the exposed surface of the first sealing material 605. The second sealing material 606 can use the same material as the first sealing material 605.

By sealing the EL element by the use of the above-described structure, it is possible to completely isolating the EL element from the outside, whereby a substance which promotes the degradation of the EL layer due to oxidation caused by water, oxygen or the like can be prevented from penetrating from the outside. Accordingly, it is possible to obtain a highly reliable EL display device.

Figure 14A:
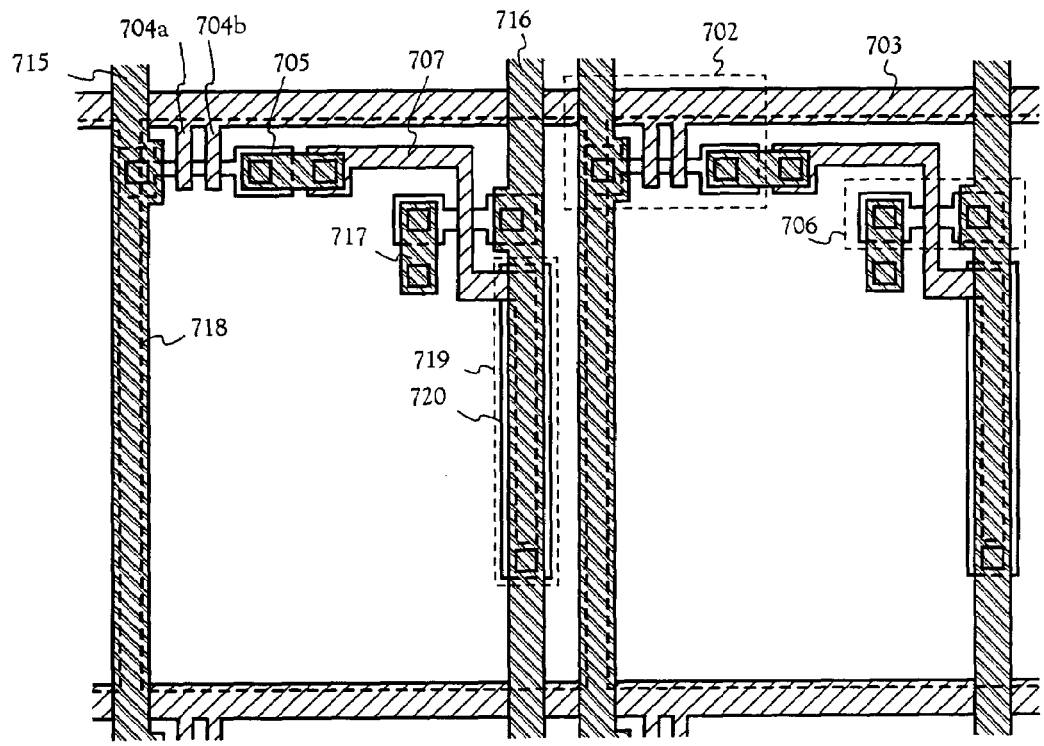
FIGS. 14A and 14B are top plan vies of pixels of the EL display device of Embodiment 5.
Figure 14B:
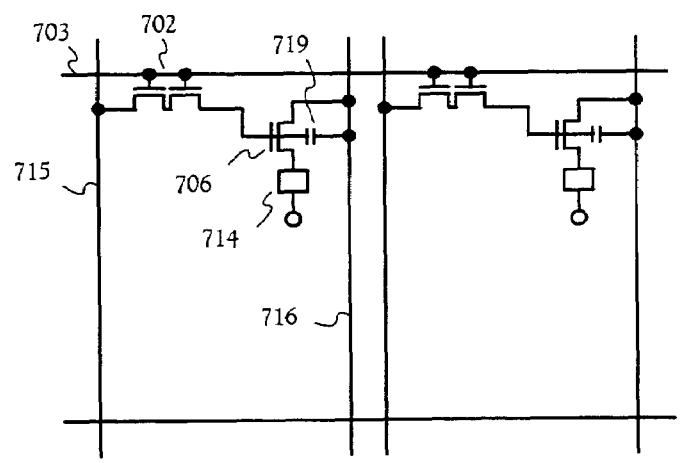

A further detailed top plan structure of the pixel section of the EL display device obtained through the above-described process is shown in FIG. 14A, and a corresponding circuit diagram is shown in FIG. 14B. In FIGS. 14A and 14B, common reference numerals are used to denote common constituent elements.

The source of a switching TFT 702 is connected to a source line 715, and the drain of the switching TFT 702 is connected to a drain line 705. The drain line 705 is electrically connected to a gate electrode 707 of a current control TFT 706. The source of the current control TFT 706 is electrically connected to a current supply line 716, and the drain of the current control TFT 706 is electrically connected to a drain line 717. The drain line 717 is electrically connected to a pixel electrode (negative electrode) 718 shown by dashed lines.

A storage capacitor is formed in an area denoted by 719. The storage capacitor 719 is formed among a semiconductor film 720 electrically connected to the current supply line 716, an insulating film (not shown) formed in the same layer as a gate insulating film, and the gate electrode 707. In addition, a capacitor which is formed by the gate electrode 707, the same layer (not shown) as the first interlayer insulating film and the current supply line 716 can be used as the storage capacitor.

Figure 15:
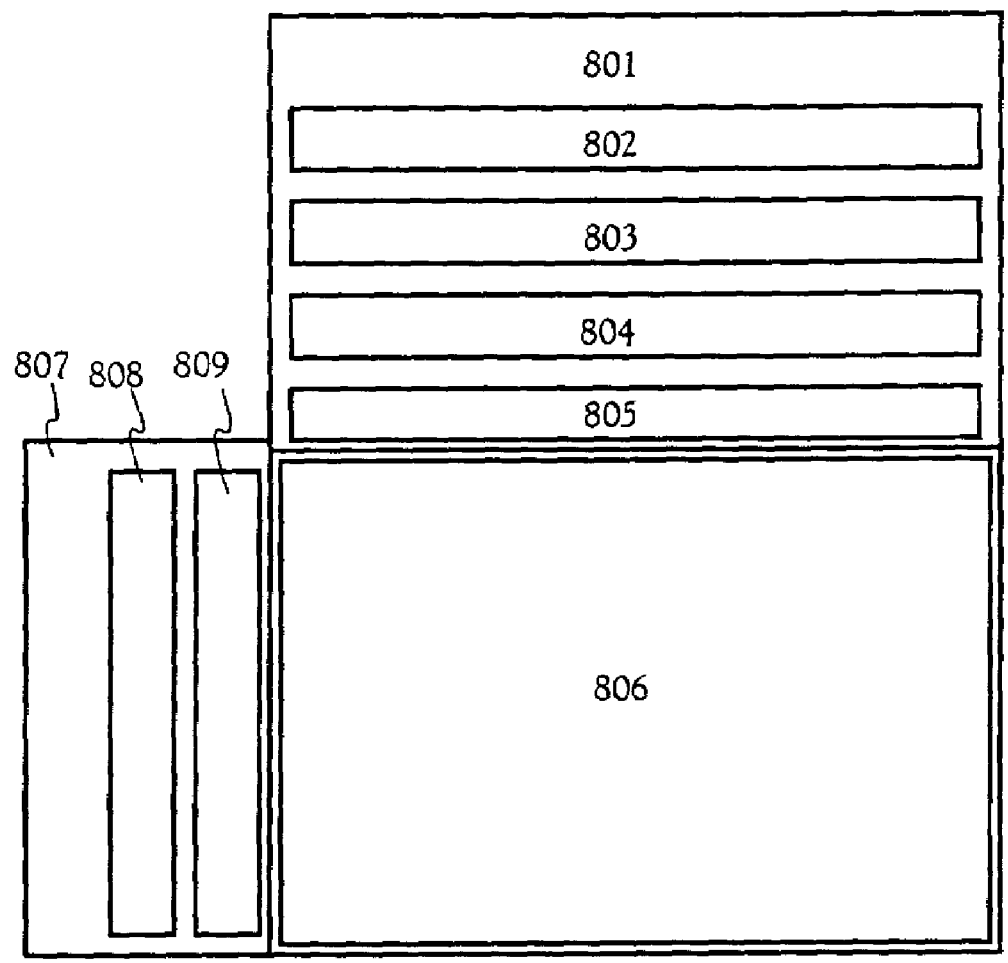
FIG. 15 is a block diagram of the EL display device of Embodiment 5.

FIG. 15 shows an example of the circuit construction of the above-described EL display device. FIG. 15 shows a circuit construction for effecting digital driving. In Embodiment 5, the circuit construction has a source-side driver circuit 801, a pixel section 806 and a gate-side driver circuit 807. Incidentally, the term "driver circuit" used herein is a generic term representative of a source-side processing circuit and a gate-side driving circuit.

The source-side driver circuit 801 is provided with a shift register 802, a latch (A) 803, a latch (B) 804, and a buffer 805. In the case of analog driving, a sampling circuit (transfer gate) may be provided instead of the latches (A) and (B). The gate-side driver circuit 807 is provided with a shift register 808 and a buffer 809.

In Embodiment 5, the pixel section 806 includes plural pixels, and the plural pixels are provided with EL elements, respectively. In this construction, it is desirable that the negative electrodes of the respective EL elements be electrically connected to the drains of the corresponding current control TFTs. The source-side driver circuit 801 and the gate-side driver circuit 807 are formed of N-channel type TFTs or P-channel type TFTs which are obtained in accordance with Embodiment 1. Incidentally, in the description of Embodiment 5, reference has been made to an example in which the source-side driver circuit 801 and the gate-side driver circuit 807 are formed of N-channel type TFTs or P-channel type TFTs, but Embodiment 5 is not particularly limited to this example. For instance, all TFTs on the same substrate can be formed of N-channel type TFTs. This construction is advantageous in that the number of masks can be reduced. Otherwise, all TFTs on the same substrate can also be formed of P-channel type TFTs.

Although not shown, another gate-side driver circuit may be provided on the side of the pixel 806 opposite to the gate-side driver circuit 807. In this case, both gate-side driver circuits are constructed to have the same structure and share the same gate lines so that even if either one of the driver circuits is broken, the other one sends out gate signals to enable the pixel section to operate correctly.

Figure 16:
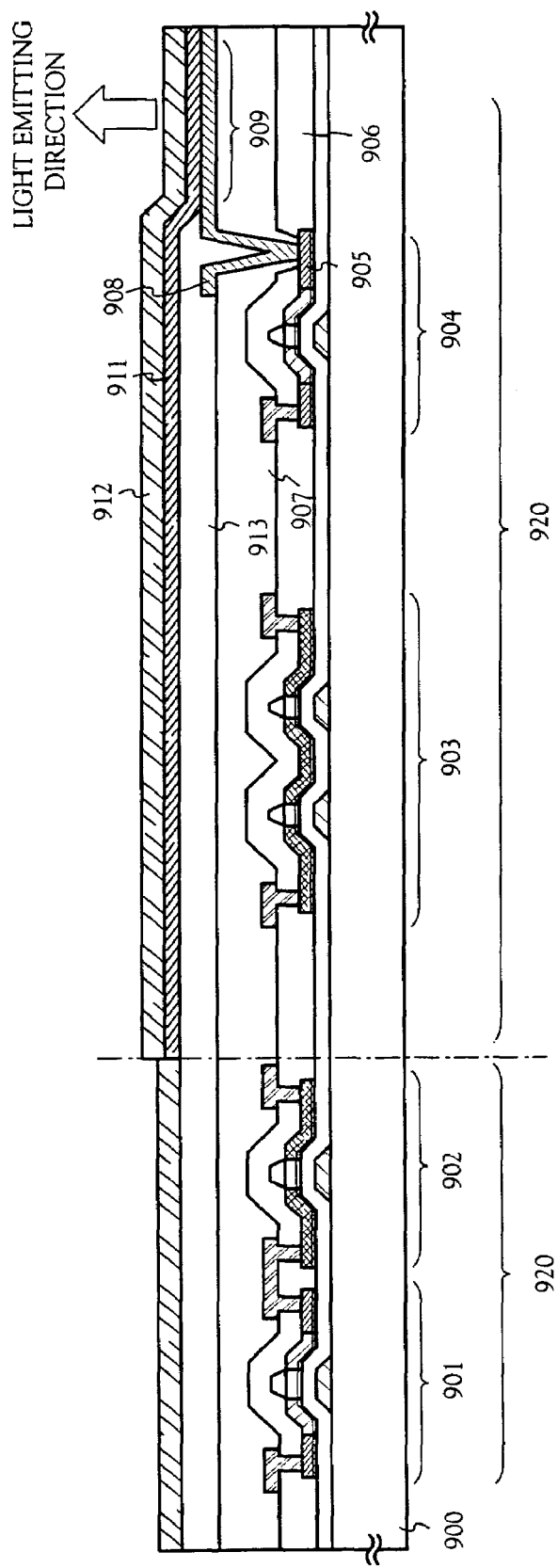
FIG. 16 is a cross-sectional view of the EL display device of Embodiment 5.

FIG. 16 shows an example in which an EL display device is fabricated by using the inverted stagger type TFTs used in Embodiment 2 described previously, instead of the TFTs of Embodiment 2. FIG. 16 is the same as FIG. 12 except for the difference between the structures of the TFTs.

In FIG. 16, reference numeral 900 denotes an insulator, and formed on the insulator 900 are an N-channel type TFT 901 and a P-channel type TFT 902 in the driver circuit 920, a switching TFT 903 made of a P-channel type TFT, and a current control TFT 904 made of an N-channel type TFT in the pixel section 921.

Since the N-channel type TFT 901 and the P-channel type TFT 902 are as described previously in connection with Embodiment 2, the description of the N-channel type TFT 901 and the P-channel type TFT 902 is omitted. The switching TFT 903 has a structure (double-gate structure) which has two channel formation regions between the source region and the drain region, but the description of the switching TFT 903 is omitted since it can readily be understood by referring to the description of the structure of the P-channel type TFT in Embodiment 2. Incidentally, Embodiment 5 is not limited to only the double-gate structure, and may also be applied to a single-gate structure in which one channel formation region is formed or a triple-gate structure in which three channel formation regions are formed.

Before the interlayer insulating films 507*a* and 507*b* are formed, a contact hole is formed in a first interlayer insulating film 906 over a drain region 905 of the current control TFT 904. This contact hole is intended to facilitate an etching step for forming a contact hole in a second interlayer insulating film 907. The contact hole is formed in the first and second interlayer insulating films 906 and 907 in such a manner as to reach the drain region 905, and a pixel electrode 908 is formed to be connected to the drain region 905. The pixel electrode 908 is an electrode which functions as the negative electrode of the EL element, and is formed of a conductive film containing an element which belongs to Group I or II of the periodic table. In Embodiment 5, the pixel electrode 908 uses a conductive film made of a compound of lithium and aluminum.

A bank 913 is formed to cover an end portion of the pixel electrode 908, and may be formed of a silicon-containing insulating film or a resin film. In the case where a resin film is used, if carbon grains or metal grains are added so that the resistivity of the resin film becomes $1 \times 10^6$ Ωm to $1 \times 10^{12}$ μm (preferably $1 \times 10^8$ Ωm to $1 \times 10^{10}$ Ωm), it is possible to suppress the dielectric breakdown of the resin film during the deposition thereof.

An EL element 909 is made of a pixel electrode (negative electrode (cathode)) 908, an EL layer 911 and a positive electrode (anode) 912. The positive electrode 912 uses a conductive film having a large work function, representatively, an oxide conductive film. The oxide conductive film may use any one of indium oxide, zinc oxide and lead oxide, or a compound of these oxides.

In addition, Embodiment 5 can be combined with Embodiment 4.

Embodiment 6

Embodiment 6 relates to an example in which crystallization is performed through a process different from those used in the above-described embodiments.

Embodiment 6 is an example in which laser treatment is performed after the patterning of semiconductor layers.

First, in a similar manner to Embodiment 1, an amorphous semiconductor film is formed on a substrate 1200, which has a stacked structure made of a germanium-containing silicon film (a first amorphous semiconductor film) 1201 and a silicon film (a second amorphous semiconductor film) 1202 (FIG. 19A). Since FIG. 19A is the same as FIG. 1, the detailed description of FIG. 19A is omitted.

Then, patterning is performed with a known photolithographic process to form an amorphous semiconductor film which has a stacked structure made of a germanium-containing silicon film 1203 and a silicon film 1204 (FIG. 19B).

Then, laser treatment is performed to cause crystallization, thereby forming a crystalline semiconductor film which has a stacked structure made of a germanium-containing silicon layer (a first crystalline semiconductor layer) 1205 and a silicon layer (a second crystalline semiconductor layer) 1206. The laser treatment is applied by the method described in the embodiment modes.

At this time, crystal nuclei are generated from the ends of the patterned crystalline semiconductor layer, and crystals grow in the lateral direction.

Elements such as TFTs using the crystalline semiconductor layers having the stacked structure obtained in this manner have superior electrical characteristics.

Incidentally, Embodiment 6 can be combined with any one of Embodiments 1 to 5.

Embodiment 7

Embodiment 7 relates to an example in which crystallization is performed through a process different from those used in the above-described embodiments.

Embodiment 7 is an example in which crystals are grown in the lateral direction by spatially modulating the intensity of laser light by means of a patterned insulating layer to form an appropriate temperature gradient.

First, an insulating film is formed on a substrate 1300, and the insulating film is patterned to form an insulating layer 1301 (FIG. 20A). Incidentally, in the description of Embodiment 7, reference is made to an example using one insulating layer, but the invention is not limited to such an example, and plural insulating layers may also be appropriately disposed.

This insulating layer 1301 can use any of a silicon oxide film, a silicon nitride film, a silicon nitride oxide film (SiOxNy), an organic-resin film (BCB (benzocyclobutene)), an acrylic film and a polyimide film, or a film in which some of them are stacked.

Then, an amorphous semiconductor film having a stacked structure which is made of a germanium-containing silicon film (a first amorphous semiconductor film) 1302 and a silicon film (a second amorphous semiconductor film) 1303 is formed to cover the insulating layer 1301. Otherwise, the amorphous semiconductor film may also be formed after an insulating film which covers the insulating layer 1301 has been formed.

Then, laser treatment is performed to cause crystallization, thereby forming a crystalline semiconductor film which has a stacked structure made of a germanium-containing silicon layer (a first crystalline semiconductor film) 1304 and a silicon layer (a second crystalline semiconductor film) 1305. Incidentally, the laser treatment may use the method described previously in connection with the above embodiments.

At this time, crystals are grown in the lateral direction by spatially modulating the intensity of laser light by means of a patterned insulating layer to form an appropriate temperature gradient in the semiconductor films being irradiated with layer light.

Elements such as TFTs using semiconductor layers formed by patterning the crystalline semiconductor layers having the stacked structure obtained in this manner have superior electrical characteristics.

Although Embodiment 7 uses the insulating layer, a metal layer may be used instead of the insulating layer, and after an insulating film has been formed on the metal layer, an amorphous semiconductor film may be formed to be crystallized by performing laser treatment.

Incidentally, Embodiment 7 can be combined with any one of Embodiments 1 to 6.

Embodiment 8

Embodiment 8 relates to an example in which crystallization is performed with a laminated structure different from those used in the above-described embodiments. Embodiment 8 uses a three-layer structure.

Figure 21A:
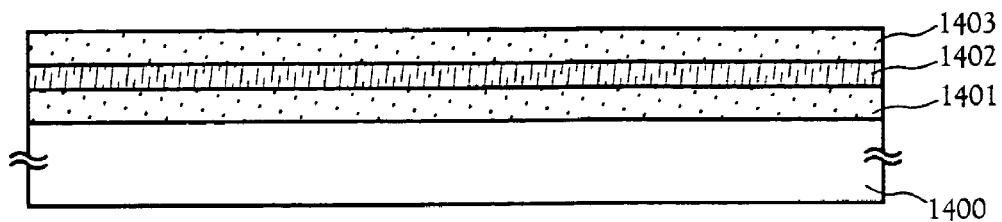
FIGS. 21A to 21C are views showing a crystallization method according to Embodiment 8.

First, a first amorphous semiconductor film 1401, a second amorphous semiconductor film 1402 and a third amorphous semiconductor film 1403 are formed to be stacked in that order on a substrate 1400 (FIG. 21A).

The first amorphous semiconductor film 1401 uses an amorphous semiconductor film (amorphous silicon film) which is formed by a plasma CVD method, a reduced-pressure CVD method or a sputtering method and contains silicon as its main component. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The second amorphous semiconductor film 1402 uses $Si_XGe_{1-X}(0<X<1)$, preferably, an amorphous semiconductor film (a germanium-containing amorphous silicon film) which contains silicon as its main component and germanium in the range of 0.1 atomic % to less than 10 atomic %, more preferably 1 to 5 atomic %. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The formation of the second amorphous semiconductor film 1402 is not limited to a particular method. The second amorphous semiconductor film 1402 may be formed by a plasma CVD method or a reduced-pressure CVD method, or by a sputtering method using a target made of germanium-containing silicon, or by implanting germanium ions into a silicon film obtained from a plasma CVD method, a reduced-pressure CVD method or a sputtering method.

The third amorphous semiconductor film 1403 uses an amorphous semiconductor film (amorphous silicon film) which contains silicon as its main component. Similarly to the first amorphous semiconductor film, each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$.

The formation of the third amorphous semiconductor film 1403 may use a plasma CVD method, a reduced-pressure CVD method or other appropriate methods.

In addition, to prevent contamination of the first amorphous semiconductor film 1401, the second amorphous semiconductor film 1402 and the third amorphous semiconductor film 1403, it is preferable to continuously deposit the first, second and third amorphous semiconductor films 1401, 1402 and 1403 without exposing them to the air.

Figure 21B:
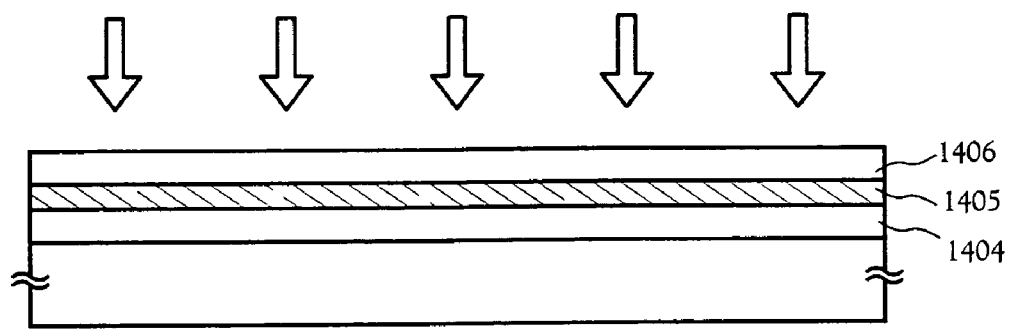

Then, laser treatment is performed to cause crystallization, thereby forming a first crystalline semiconductor film 1404, a second crystalline semiconductor film 1405 and a third crystalline semiconductor film 1406 (FIG. 21B). Incidentally, the laser treatment may use the method described previously in connection with the above embodiments.

Figure 21C:
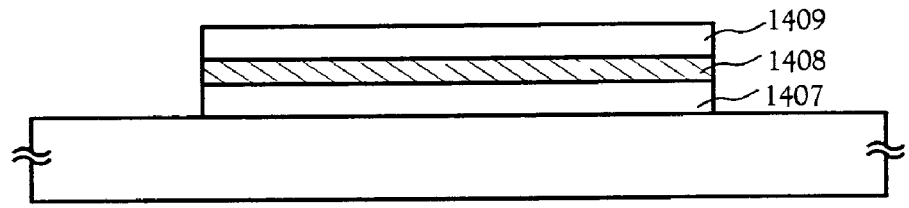

Then, patterning is performed with a known photolithographic process to form a crystalline semiconductor film which has a stacked structure made of a silicon film 1407, a germanium-containing silicon film 1408 and a silicon film 1409 (FIG. 21C).

Elements such as TFTs using the crystalline semiconductor layers having the laminated structure obtained in this manner have superior electrical characteristics.

Incidentally, Embodiment 8 can be combined with any one of Embodiments 1 to 7.

Embodiment 9

Embodiment 9 relates to an example in which crystallization is performed with a laminated structure different from those used in the above-described embodiments. Embodiment 9 uses a germanium-containing silicon film as an upper layer.

Figure 22A:
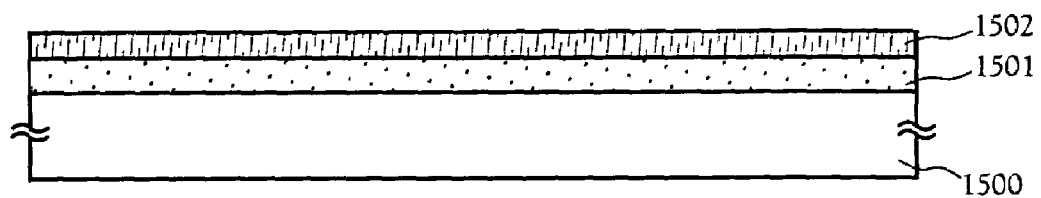
FIGS. 22A to 22C are views showing a crystallization method according to Embodiment 9.

First, a first amorphous semiconductor film 1501 and a second amorphous semiconductor film 1502 are formed to be stacked in that order on a substrate 1500 (FIG. 22A).

The first amorphous semiconductor film 1501 uses an amorphous semiconductor film (amorphous silicon film) which is formed by a plasma CVD method, a reduced-pressure CVD method or a sputtering method and contains silicon as its main component. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The second amorphous semiconductor film 1502 uses $Si_xGe_{1-x}(0<X<1)$, preferably, an amorphous semiconductor film (a germanium-containing amorphous silicon film) which contains silicon as its main component and germanium in the range of 0.1 atomic % to less than 10 atomic %, more preferably 1 to 5 atomic %. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The formation of the second amorphous semiconductor film 1502 is not limited to a particular method. The second amorphous semiconductor film 1502 may be formed by a plasma CVD method or a reduced-pressure CVD method, or by a sputtering method using a target made of germanium-containing silicon, or by implanting germanium ions into a silicon film obtained from a plasma CVD method, a reduced-pressure CVD method or a sputtering method.

In addition, to prevent contamination of the first amorphous semiconductor film 1501 and the second amorphous semiconductor film 1502, it is preferable to continuously deposit the first and second amorphous semiconductor films 1501 and 1502 without exposing them to the air.

Figure 22B:
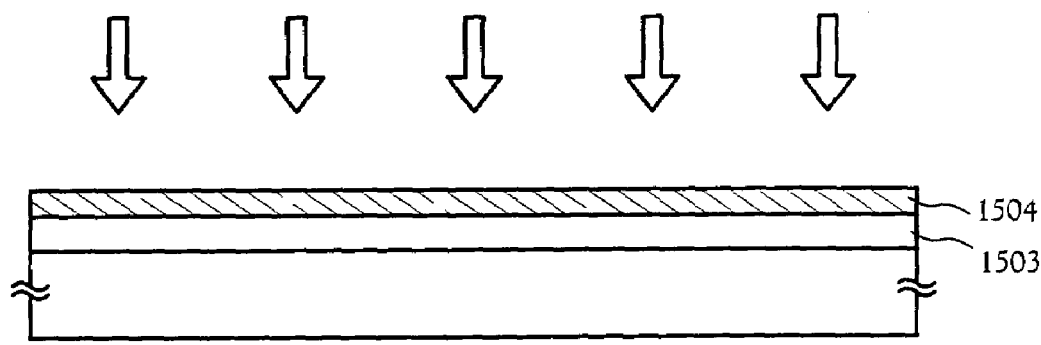

Then, laser treatment is performed to cause crystallization, thereby forming a first crystalline semiconductor film 1503 and a second crystalline semiconductor film 1504 (FIG. 22B). Incidentally, the laser treatment may use the method described previously in connection with the above embodiments.

Figure 22C:
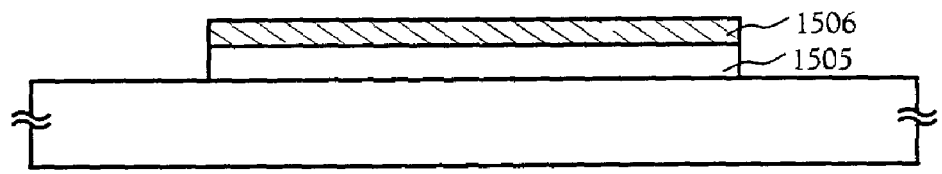

Then, patterning is performed with a known photolithographic process to form a crystalline semiconductor film which has a stacked structure made of a silicon film 1505 and a germanium-containing silicon film 1506 (FIG. 22C).

Elements such as TFTs using the crystalline semiconductor layers having the stacked structure obtained in this manner have superior electrical characteristics.

Incidentally, Embodiment 9 can be combined with any one of Embodiments 1 to 7.

Embodiment 10

Embodiment 10 relates to an example in which crystallization is performed with a stacked structure different from those used in the above-described embodiments. Embodiment 10 uses a three-layer structure.

Figure 23A:
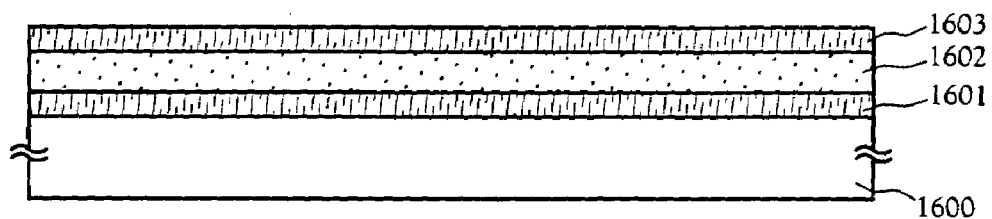
FIGS. 23A to 23C are views showing a crystallization method according to Embodiment 10.

First, a first amorphous semiconductor film 1601, a second amorphous semiconductor film 1602 and a third amorphous semiconductor film 1603 are formed to be laminated in that order on a substrate 1600 (FIG. 23A).

The first amorphous semiconductor film 1601 uses $Si_xGe_{1-x}(0<X<1)$, preferably, an amorphous semiconductor film (a germanium-containing amorphous silicon film) which contains silicon as its main component and germanium in the range of 0.1 atomic % to less than 10 atomic %, more preferably 1 to 5 atomic %. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The formation of the first amorphous semiconductor film 1601 is not limited to a particular method. The first amorphous semiconductor film 1601 may be formed by a plasma CVD method or a reduced-pressure CVD method, or by a sputtering method using a target made of germanium-containing silicon, or by implanting germanium ions into a silicon film obtained from a plasma CVD method, a reduced-pressure CVD method or a sputtering method.

The second amorphous semiconductor film 1602 is an amorphous semiconductor film (amorphous silicon film) which is formed by a plasma CVD method, a reduced-pressure CVD method or a sputtering method and contains silicon as its main component. Each of the concentrations of nitrogen and carbon contained in the amorphous semiconductor film is preferably made less than $5\times10^{18}/cm^3$, while the concentration of oxygen contained in the amorphous semiconductor film is preferably made less than $1\times10^{19}/cm^3$, in order to prevent an adverse influence from being exerted on the electrical characteristics of a crystalline semiconductor film to be fabricated in a later process of crystallization of the amorphous semiconductor film.

The third amorphous semiconductor film 1603 uses an amorphous semiconductor film (a germanium-containing silicon film) similar to the first amorphous semiconductor film 1601. Similarly to the first amorphous semiconductor film 1601, each of the concentrations of nitrogen and carbon contained in the third amorphous semiconductor film is preferably made less than $5\times10^{18}/cm^3$, while the concentration of oxygen contained in the amorphous semiconductor film is preferably made less than $1\times10^{19}/cm^3$.

The formation of the third amorphous semiconductor film 1603 may use the same method as the first amorphous semiconductor film 1601.

In addition, to prevent contamination of the first amorphous semiconductor film 1601, the second amorphous semiconductor film 1602 and the third amorphous semiconductor film 1603, it is preferable to continuously deposit the first, second and third amorphous semiconductor films 1601, 1602 and 1603 without exposing them to the air.

Figure 23B:
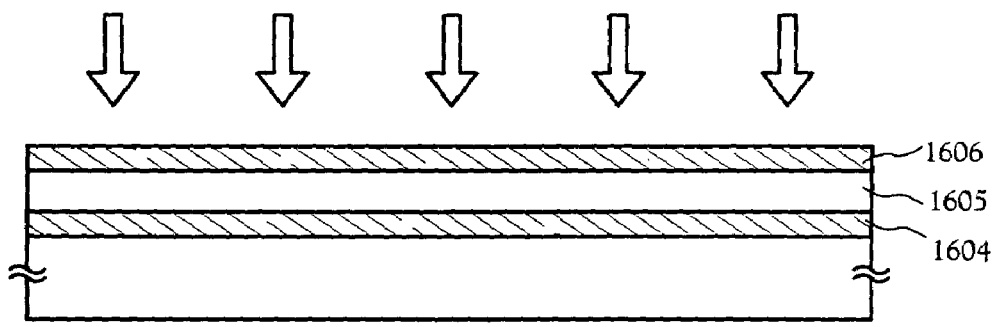

Then, laser treatment is performed to cause crystallization, thereby forming a first crystalline semiconductor film 1604, a second crystalline semiconductor film 1605 and a third crystalline semiconductor film 1606 (FIG. 23B). Incidentally, the laser treatment may use the method described previously in connection with the above embodiments.

Figure 23C:
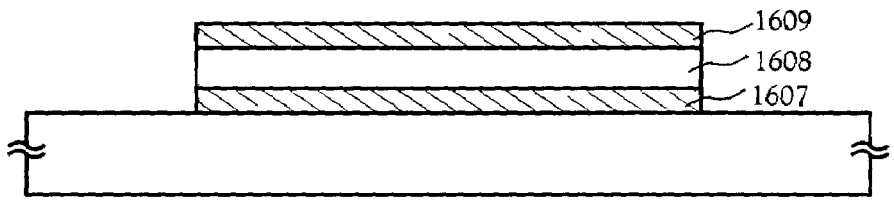

Then, patterning is performed with a known photolithographic process to form a crystalline semiconductor film which has a laminated structure made of a germanium-containing silicon film 1607, a silicon film 1608 and a germanium-containing silicon film 1609 (FIG. 23C).

Elements such as TFTs using the crystalline semiconductor layers having the stacked structure obtained in this manner have superior electrical characteristics.

Incidentally, Embodiment 10 can be combined with any one of Embodiments 1 to 7.

Embodiment 11

Figure 24:
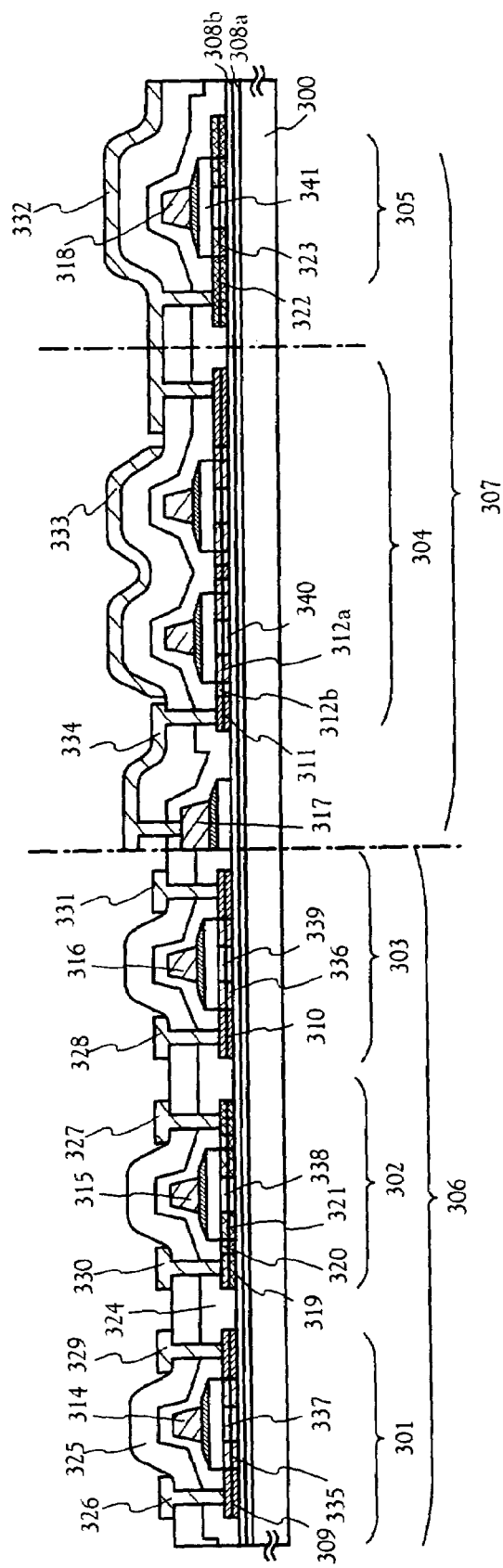
FIG. 24 is a view showing a cross-sectional structure of an active matrix type of display device of Embodiment 11.

Embodiment 11 will be described below with reference to FIG. 24 which shows the construction of an active matrix substrate fabricated by a method different from that according to Embodiment 1.

First, in accordance with the above-described embodiment modes and Embodiment 1, undercoat insulating films 308a and 308b are formed on a substrate 300, and active layers for TFTs 301-304 and a semiconductor layer for a semiconductor layer for a storage capacitor 305 are formed on the undercoat insulating films 308a and 308b.

Then, a gate insulating film, a first conductive film (TaN) and a second conductive film (W) are formed in a stacked manner. In the description of Embodiment 11, reference is made to an example in which TaN and W are used for the first conductive film and the second conductive film, respectively, but it goes without saying that Embodiment 11 is not limited to a particular example.

Then, a mask made of a resist is formed by using a photolithographic process, thereby performing a first etching treatment for forming electrodes and lines. In Embodiment 11, an ICP etching method was used and $CF_4$ and $Cl_2$ were used as etching gases, and etching was performed by generating plasma by feeding 500 W RF power (13.56 MHz) to coil-type electrodes under a pressure of 1 Pa.

Through the first etching treatment, the end portions of the first conductive layer and the second conductive layer are formed into tapered shapes owing to the effect of bias voltage applied to the substrate. The angles of the tapered portions are 15-45°. The first conductive film and the second conductive film are etched in this manner, to form conductive layers of first shape (the first conductive layer and the second conductive layer). During the first etching treatment, the gate insulating film is etched to a depth of about 20-50 nm in an area which is not covered with the conductive layers of first shape.

Then, a second etching treatment is performed without removing the mask made of a resist. In the second etching treatment, $CF_4$, $Cl_2$ and $O_2$ were used as etching gases, and etching was performed by generating plasma by feeding 500W RF power (13.56 MHz) to coil-type electrodes under a pressure of 1 Pa.

Through the second etching treatment, the W film is anisotropically etched, and the TaN film which forms the first conductive layers is slightly etched at a slower etching speed than the W film, whereby the conductive layers of second shape (the first conductive layer and the second conductive layer) are formed. Incidentally, during the second etching treatment as well, the gate insulating film is further etched and thinned in an area which is not covered with the conductive layers of second shape.

Then, a first doping treatment is performed. In the first doping treatment, an impurity element (phosphorus or arsenic) which imparts n-type conductivity is doped under the condition of high acceleration voltage, thereby forming impurity regions (A) in a self-aligned manner. The doping uses the second conductive layers as a mask against the impurity element and is effected so that the impurity element can also be added to the semiconductor layers under the tapered portions of the first conductive layers.

Then, after the mask made of a resist has been removed, the conductive layers of second shape are used as a mask to selectively remove the gate insulating film, thereby forming an insulating layer.

Then, after a mask made of a resist has been formed by using a photolithographic process, a second doping treatment is performed. In this case, the dosage of the second doping treatment is made larger than that of the first doping treatment, and an impurity element which imparts n-type conductivity is doped into the semiconductor layers under the condition of low acceleration voltage, thereby forming impurity regions (B). In this manner, impurity regions (B) 309, 310 and 311 which become the source regions or the drain regions of N-channel type TFTs are formed. In addition, in the pixel section 307, a region 312b which is not superposed on a conductive layer of second shape (gate electrode) 313 is formed between an impurity region (A) 312a which is superposed on the conductive layer of second shape (gate electrode) 313 and an impurity region (B) 311. This region 312b functions as an LDD region.

Then, after the mask made of a resist has been removed, a mask made of a resist is newly formed to cover the N-channel type TFTs, and a third doping treatment is performed. Through this third doping treatment, an impurity element which imparts the opposite conductivity type to the aforesaid conductivity type is added to the semiconductor layers which constitute the active layers of the P-channel type TFTs, whereby impurity regions (C) 319-323 are formed in a self-aligned manner. In Embodiment 11, the impurity regions (C) are formed by an ion doping method using diborane ($B_2H_6$). Incidentally, phosphorus is added to each of the impurity regions (C) 319-323 at a different concentration, but the doping treatment is performed so that the concentration of the impurity element to impart p-type conductivity is made $2\times10^{20}$ to $2\times10^{21}$ atoms/cm$^3$ in any of the impurity regions (C) 319-323, whereby there is no problem as to the functions of the source regions and the drain regions of the p-channel type TFTs.

Then, the mask made of a resist is removed, and a first interlayer insulating film 324 is formed to cover the whole surface of the substrate 300.

Then, the step of activating the impurity elements added to the respective semiconductor layers is performed.

Through the above-described steps, the impurity regions are formed in the respective semiconductor layers. Conductive layers 313-316 of second shapes superposed on the respective semiconductor layers function as gate electrodes. A layer 317 functions as a source line, and a layer 318 functions as an electrode which forms a storage capacitor.

Moreover, heat treatment of 300-550° C. for 1-12 hours is performed in an atmosphere containing 3% hydrogen, thereby performing the step of hydrogenating the semiconductor layers.

Then, a second interlayer insulating film 325 made of an organic resin material is formed on the first interlayer insulating film 324. Then, patterning is performed to form a contact hole which reaches the source line 317, contact holes which reach the respective impurity regions (B) 309, 310 and 311, and contact holes which reach the respective impurity regions (C) 319 and 322.

Then, in a driver circuit 306, lines 326-331 are formed to be electrically connected to the impurity regions (B) 309, 310 and 311 and the impurity regions (C) 319 and 322, respectively.

In addition, in a pixel section 307, a pixel electrode 332, a gate line 333 and a connecting electrode 334 are formed. The source line 317 is electrically connected to the pixel TFT by this connecting electrode 334. The gate line 333 is electrically connected to the gate electrode (the conductive layer 313 of second shape). The pixel electrode 332 is electrically connected to the drain region of the pixel TFT, and is also electrically connected to the semiconductor layer which functions as one electrode to form a storage capacitor.

In the above-described manner, the driver circuit 306 which has the n-channel type TFT 301, the p-channel type TFT 302 and the n-channel type TFT 303 and the pixel section 307 which has the pixel TFT 304 and the storage capacitor 305 can be formed on the same substrate.

The semiconductor layer of the n-channel type TFT 301 of the driver circuit 306 has a channel formation region 337, an impurity region (A) 335 (GOLD region) superposed on the conductive layer 314 of second shape which forms the gate electrode, and the impurity region (B) 309 which functions as the source or the drain region. The semiconductor layer of the p-channel type TFT 302 has a channel formation region 338, the impurity region (C) 321 superposed on the conductive layer 315 of second shape which forms the gate electrode, and impurity regions (C) 319 and 320 which function as the source region or the drain region. The semiconductor layer of the N-channel type TFT 303 has a channel formation region 339, an impurity region (A) 336 (GOLD region) superposed on the conductive layer 316 of second shape which forms the gate electrode, and the impurity region (B) 310 which functions as the source region or the drain region.

The semiconductor layer of the pixel TFT 304 of the pixel section 307 has a channel formation region 340, the impurity region (A) 312a (GOLD region) superposed on the conductive layer 313 of second shape which forms the gate electrode, the impurity region (LDD region) 312b which is formed outside the gate electrode, and the impurity region (B) 311 which functions as the source region or the drain region. An impurity element which imparts p-type conductivity is added to each of the semiconductor layers 322 and 323 which function as one electrode of the storage capacitor 305, at the same concentration as the impurity regions (C). The storage capacitor 305 uses an insulating layer 341 (the same film as the gate insulating film) as a dielectric, and is formed of the electrode 318 and the semiconductor layers 322 and 323.

Since the subsequent steps are as described above in connection with Embodiment 1, the same description is omitted.

Embodiment 12

Embodiment 12 relates to an example in which crystallization is performed through a process different from the laser treatments used in the above-described embodiments.

Embodiment 12 is an example in which a thin metal sheet is disposed on an optical path of laser and the intensity of laser light is spatially modulated to form an appropriate temperature gradient in a semiconductor film being irradiated with laser light, thereby growing crystals in the lateral direction.

Figure 25A:
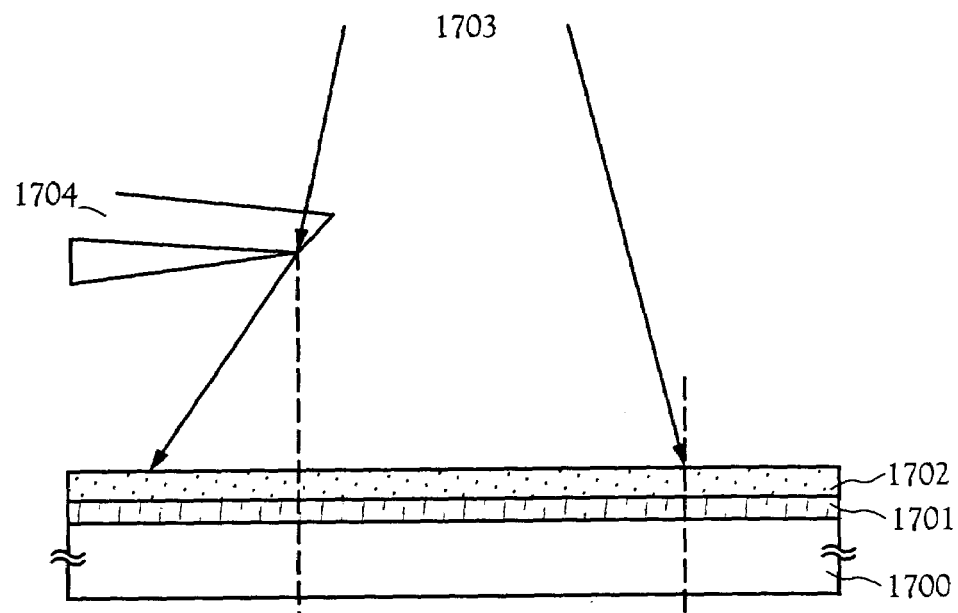
FIGS. 25A and 25B are showing a crystallization method according to Embodiment 12.
Figure 25B:
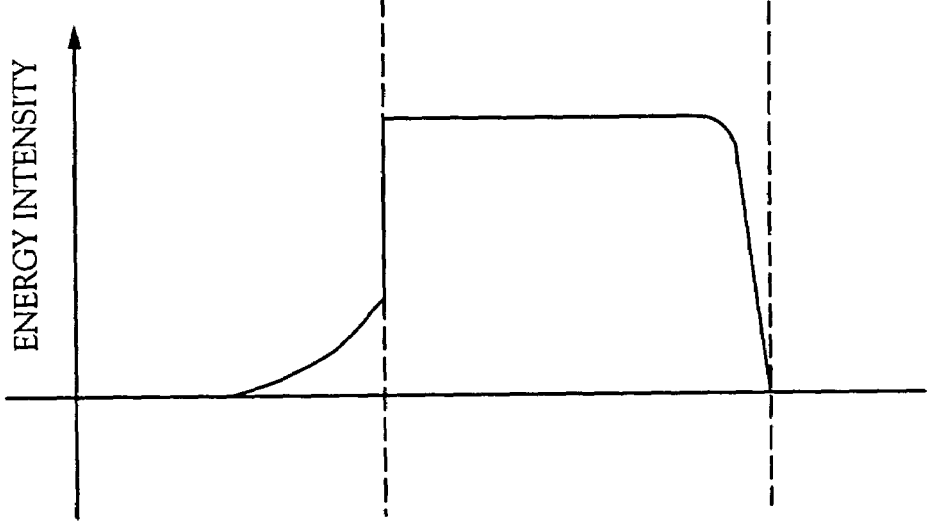

FIG. 25 is a view schematically showing laser treatment according to Embodiment 12.

In FIG. 25, reference numeral 1700 denotes a substrate, 1701 denotes a first amorphous semiconductor film (germanium-containing silicon film), and reference numeral 1702 denotes a second amorphous semiconductor film (amorphous silicon film).

Laser light is 1703 irradiated onto the first amorphous semiconductor film 1701 and the second amorphous semiconductor film 1702, and undergoes diffraction due to a thin metal sheet 1704 disposed at a location in the optical path of the laser light, whereby a change is given to the energy intensity of the laser light is given a change. Specifically, the intensity of the laser light is spatially modulated to form an appropriate temperature gradient in the semiconductor films being irradiated with laser light. In this manner, crystals are grown in the lateral direction, whereby a good crystalline semiconductor film can be formed.

In Embodiment 12, a thin metal sheet is used as means for spatially modulating the intensity of laser light. However, the thin metal sheet is not a limiting example, and the intensity of laser light may also be spatially modulated by using a lens, an optical film or the like.

Incidentally, Embodiment 12 can be freely combined with any one of Embodiments 1 to 11.

Embodiment 13

A fabrication method for a crystalline semiconductor film which will be described below with reference to FIGS. 26A to 26D is a method of forming on an insulating surface a first amorphous semiconductor film which contains silicon as its main component and germanium, and a second amorphous semiconductor film which contains silicon as its main component, and effecting crystallization by adding a metal element which promotes crystallization of silicon, to the entire surface of the second amorphous semiconductor film. First, in the step shown in FIG. 26A, a glass substrate 3201 uses a glass substrate which is represented by the #1737 glass substrate of Corning Incorporated. A silicon nitride oxide film of thickness 50-200 nm is formed as a blocking layer 3202 on the surface of the substrate 3201 by a plasma CVD method using $SiH_4$ and $N_{20}$. An example of the blocking layer 3202 is a two-layer structure in which a 50-nm-thick silicon nitride oxide film fabricated from $SiH_4$, $NH_3$ and $N_{20}$ by a plasma CVD method and a 100-nm-thick silicon nitride oxide film fabricated from $SiH_4$ and $N_{20}$ by a plasma CVD method are stacked, or a two-layer structure in which a silicon nitride film and a silicon oxide film fabricated of TEOS (Tetraethyl Ortho Silicate) are stacked. The blocking layer 3202 is formed so that an alkali metal contained in the glass substrate 3201 is prevented from diffusing in a semiconductor film to be formed on the blocking layer 3202.

A first amorphous semiconductor film 3203 which contains silicon as its main component and germanium is fabricated by a plasma CVD method which introduces a $GeH_4$ gas diluted with $SiH_4$ and $H_2$ to 10% into a reaction chamber and decomposes the resultant gas by glow discharge, thereby depositing the first amorphous semiconductor film 3203 on the substrate 3201. The fabrication conditions of the first amorphous semiconductor film 3203 conform to Table 1. The total flow rate of the $SiH_4$ gas and the $GeH_4$ gas diluted with $H_2$ to 10% is made 100 SCCM, and the flow rate of the $GeH_4$ gas diluted with $H_2$ to 10% is changed within the range of 5-50 SCCM, thereby forming the first amorphous semiconductor film 3203.

Then, a second amorphous semiconductor film 3204 which contains silicon as its main component is formed by using a $SiH_4$ gas. The first amorphous semiconductor film 3203 is formed to a thickness of 5-30 nm, and the second a morphous semiconductor film 3204 is formed to a thickness of 15-70 nm.

Figure 26A:
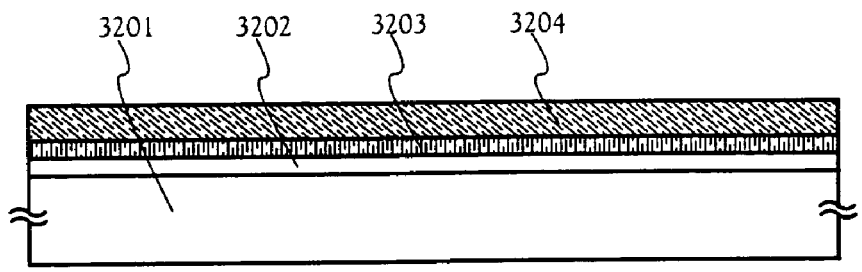
FIGS. 26A to 26D are views for explaining a method of fabricating a crystalline semiconductor film according to Embodiment 13.
Figure 26B:
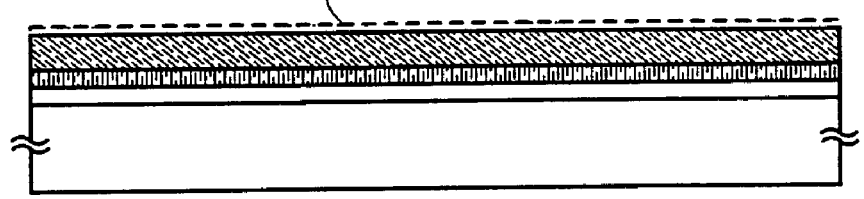

Then, in the step shown in FIG. 26B, a nickel acetate salt solution which contains 10 ppm of nickel by weight is applied by a spinner, to form a nickel-containing layer 3205. In this case, to improve the adherence of the solution, the second amorphous semiconductor film 3204 is subjected to the surface treatment of forming a very thin oxide film from an ozone-containing aqueous solution, then etching the oxide film with a mixture of hydrofluoric acid and hydrogen peroxide-containing water to form a clean surface, and subsequently again processing the clean surface with an ozone-containing aqueous solution to form a very thin oxide film. Since the surface of silicon is originally hydrophobic, the nickel acetate solution can be uniformly applied by the oxide film being formed in this manner.

Figure 26C:
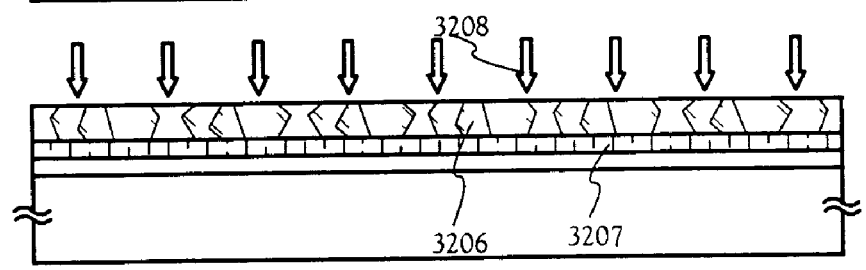
Figure 26D:
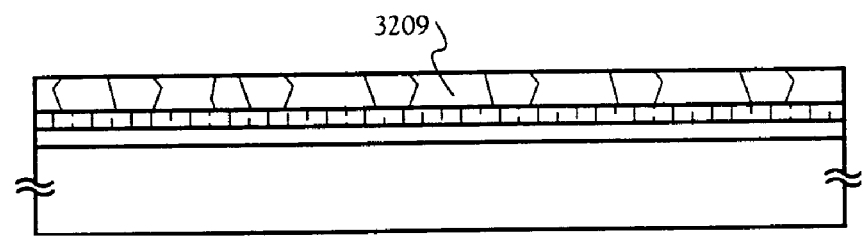

Then, 1-hour heat treatment is performed at 500° C. to emit hydrogen from the first amorphous semiconductor film 3203 and the second amorphous semiconductor film 3204. Then, 4-hour heat treatment is performed at 550° C. In this manner, it is possible to obtain a first crystalline semiconductor film 3206 and a second crystalline semiconductor film 3207 as shown in FIG. 26C. As described above, crystallization starts at the first amorphous semiconductor film 3203, and the second amorphous semiconductor film 3204 is crystallized while reflecting the crystal orientation of the first crystalline semiconductor film 3206.

Moreover, in order to increase the crystallization ratio (the proportion of crystal components in the whole volume of the film) and fix defects remaining in the crystal grains, the laser treatment that irradiates laser light 3208 onto the first crystalline semiconductor film 3206 and the second crystalline semiconductor film 3207. The laser light 3208 uses excimer laser light which oscillates at 30 Hz with a wavelength of 308 nm. The laser light is condensed to 400-600 mJ/cm$^2$ by an optical system and effects the laser treatment with an overlap percentage of 90-95 %. In this manner, the crystalline semiconductor film 3209 shown in FIG. 26D can be obtained.

Embodiment 14

Figure 27A:
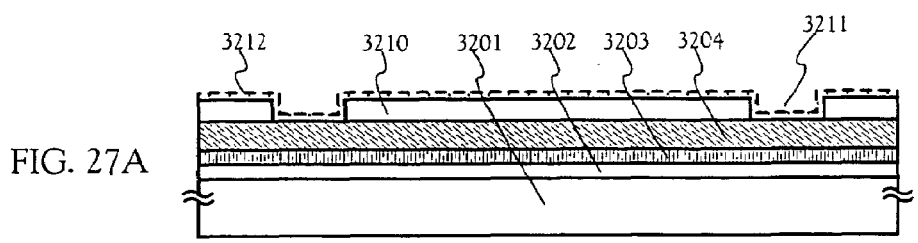
FIGS. 27A to 27C are views for explaining a method of fabricating a crystalline semiconductor film according to Embodiment 14.
Figure 27B:
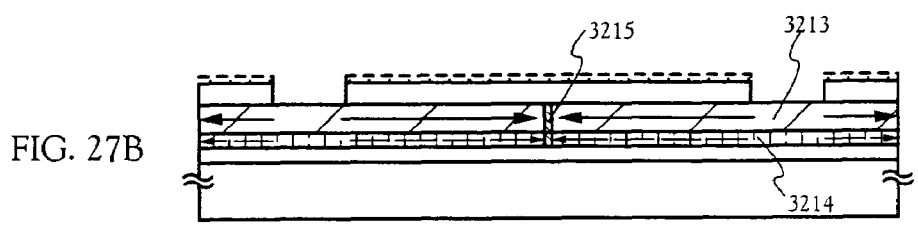
Figure 27C:
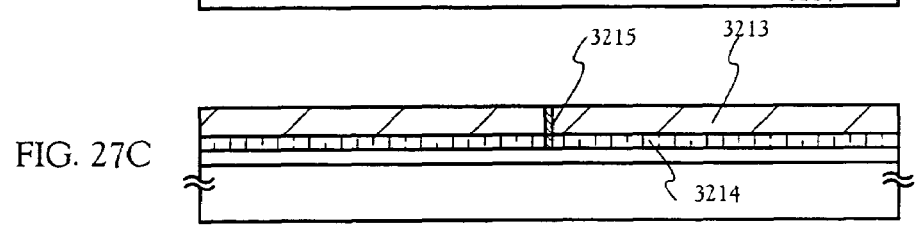

A method of selectively forming a metal element which promotes crystallization of an amorphous semiconductor film will be described below with reference to FIGS. 27A to 27C. In the step shown in FIG. 27A, a substrate 3201 adopts a glass substrate or quartz substrate. If the glass substrate is used, the blocking layer 3202 similar to that of Embodiment 13 is formed.

The first amorphous semiconductor film 3203 which contains silicon as its main component and germanium, and the second amorphous semiconductor film 3204 which contains silicon as its main component are formed as in the case of Embodiment 13. It is also possible to adopt a method of decomposing $Si_2H_6$ and $GeH_4$ at temperatures of 450-500° C. and forming the amorphous semiconductor films by a reduced-pressure CVD method instead of a plasma CVD method.

Then, a silicon oxide film 3210 of thickness 150 nm is formed on the second amorphous semiconductor film 3204. The method of fabricating the silicon oxide film 3210 includes, but not limited to, for example, the steps of mixing $O_2$ and tetraethyl ortho silicate (TEOS) and effecting a discharge at a high frequency (13.56 MHz) power density of 0.5-0.8 W/cm$^2$ under a reaction pressure of 40 Pa at a substrate temperature of 300-400° C., thereby forming the silicon oxide film 3210.

Then, an aperture portion 3211 is formed in the silicon oxide film 3210, and a nickel acetate solution which contains 10 ppm of nickel by weight is applied to form a nickel-containing layer 3212. In this manner, the nickel-containing layer 3212 is brought into contact with the second amorphous semiconductor film 3204, only at the bottom of the aperture portion 3211.

Crystallization is performed by heat treatment at temperatures of 500-650° C. for 4-24 hours, for example, at 570° C. for 14 hours. Nickel is diffused into the second and first amorphous semiconductor films 3204 and 3203 from the portion of contact between the nickel-containing layer 3212 and the second amorphous semiconductor film 3204, and nuclei due to $NiSi_2$ are formed. Crystallization proceeds from the nuclei in a direction parallel to the surface of the substrate. In a first crystalline semiconductor film 3214 and a second crystalline semiconductor film 3213 which have been formed in this manner, rod- or needle-shaped crystals are aggregated and each of the crystals is grown in a particular direction as viewed in broad perspective. Reference numeral 3215 denotes the growth ends of the respective crystals which have grown in mutually opposite directions, and in this portion 3215, nickel exists at a high concentration compared to the other regions. After that, the crystalline semiconductor film shown in FIG. 27C can be obtained by removing the silicon oxide film 3210.

Embodiment 15

The element used during crystallization for the purpose of promoting the crystallization of silicon remains in the crystalline semiconductor film fabricated by the method described above in Embodiment 13 or 14. The element may not be uniformly distributed in the film, but it exists at a concentration which exceeds averagely $1 \times 10^{19}$ atoms/cm$^3$. As a matter of course, even in such a state, the crystalline semiconductor film can be used in the channel formations regions of various kinds of semiconductor devices such as TFTs. However, it is preferable to remove the remaining metal element by gettering.

Figure 28A:
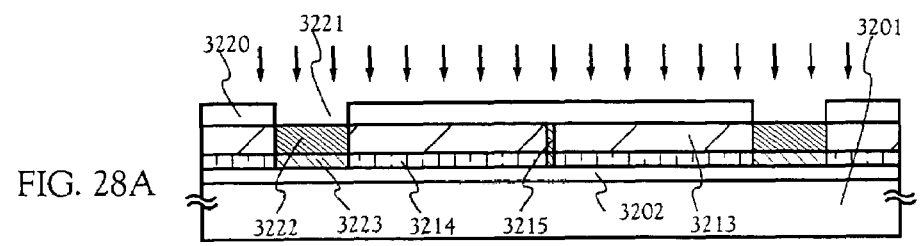
FIGS. 28A to 28C are views for explaining a method of fabricating a crystalline semiconductor film according to Embodiment 15.

One example of a gettering method according to Embodiment 15 will be described with reference to FIGS. 28A to 28C. In the step shown in FIG. 28A, the substrate 3201 adopts the glass substrate or quartz substrate used in Embodiment 13 or 14. If the glass substrate is used, the blocking layer 3202 similar to Embodiment 13 is formed. The first crystalline semiconductor film 3214 and the second crystalline semiconductor film 3213 may be fabricated by the method according to either of Embodiments 13 or 14. A masking silicon oxide film 3220 is formed to a thickness of 150 nm on the surface of the second crystalline semiconductor film 3213, and an aperture 3221 is formed in the silicon oxide film 3220, thereby forming an area in which the second crystalline semiconductor film 3213 is exposed. In a case according to Embodiment 14, the silicon oxide film 3210 shown in FIG. 27A can be used without modification, and the process of Embodiment 15 can also be executed continuously after the step shown in FIG. 27B. Then, phosphorus is added by an ion doping method, to form a region 3222 to which phosphorus is added at a concentration of $1 \times 10^{19}$ atoms/cm$^3$ to $1 \times 10^{22}$ atoms/cm$^3$.

Figure 28B:
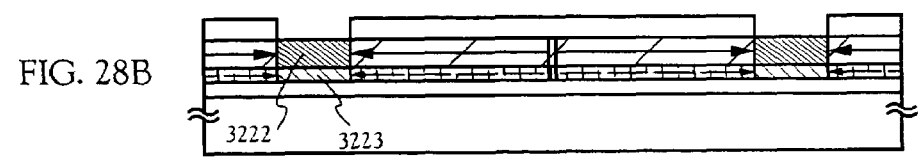

Then, as shown in FIG. 28B, when heat treatment is performed in a nitrogen atmosphere at 550-800° C. for 5-24 hours, for example, at 600° C. for 12 hours, the phosphorus-added region 3222 works as a gettering site so that the catalytic element remaining in the first crystalline semiconductor film 3214 and the second crystalline semiconductor film 3213 can be segregated in the phosphorus-added region 3222.

Figure 28C:
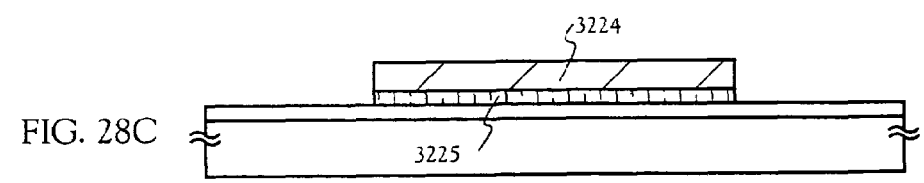

After that, as shown in FIG. 28C, the masking silicon oxide film 3220 and the phosphorus-added region 3222 are removed by etching, whereby it is possible to obtain a first crystalline semiconductor film 3225 and a second crystalline semiconductor film 3224 in each of which the concentration of the metal element used in the crystallization step is reduced to $1 \times 10^{17}$/cm$^3$ or less.

Embodiment 16

Figure 29A:
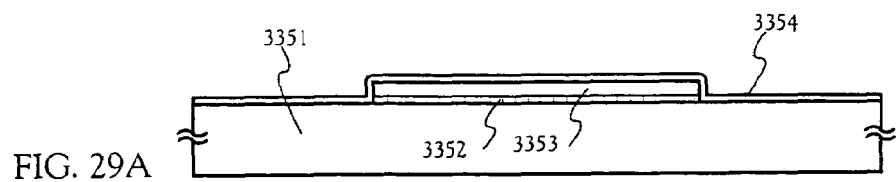
FIGS. 29A and 29B are views for explaining a method of fabricating a crystalline semiconductor film according to Embodiment 16.

Embodiment 16 provides a method which reduces defects in crystal grains or the interface level between an insulating film and a crystalline semiconductor film and can be suitably used for TFTs or the like. The crystal semiconductor film fabricated in Embodiment 13 or 14 is applied to either of a first crystalline semiconductor film 3352 and a second crystalline semiconductor film 3353, which are shown in FIG. 29A. Otherwise, the first crystalline semiconductor film 3352 and the second crystalline semiconductor film 3353 may be subjected to the gettering treatment described above in Embodiment 15. However, in Embodiment 16, a substrate having a heat resistance of at least approximately 700-1,000° C. is needed and a quartz substrate 3351 is adopted.

An insulating film 3354 on the second crystalline semiconductor film 3353 is formed of a material which contains silicon oxide as its main component. For example, a silicon oxide film or a silicon nitride oxide fabricated by a plasma CVD method is formed to a thickness of 50 nm.

Figure 29B:
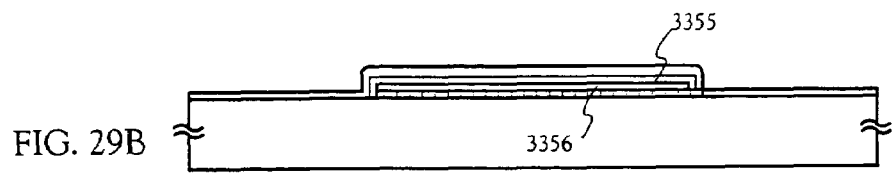

When the insulating film 3354 is formed, heat treatment is performed in an atmosphere which contains halogen (representatively, chlorine) and oxygen, as shown in FIG. 29B. In Embodiment 16, the heat treatment is performed at 950° C. for 30 minutes. Incidentally, the treatment temperature may be selected from the range of 700 to 1,100° C., and the treatment time can be selected from the range of 10 minutes to 8 hours.

An oxide film 3355 of thickness about 20 nm is formed at the interface between the second crystalline semiconductor film 3353 and the insulating film 3354 by the above-described heat treatment, and a second crystalline semiconductor film 3356 which has a reduced thickness is formed. In the process of oxidation in the halogen atmosphere, from among the impurity elements contained in the insulating film 3354 and the first and second crystalline semiconductor films 3352 and 3353, a metallic impurity element in particular forms a compound with halogen and can be removed into a vapor phase. Moreover, the interface between the oxide film 3355 and the second crystalline semiconductor film 3356, both of which are obtained through the above-described treatment, is lowered in interface level density and is improved to a great extent.

Embodiment 17

Embodiment 17 provides an example of the method of fabricating TFTs by using a crystalline semiconductor film containing germanium according to the invention. FIGS. 30A to 30D are views for explaining a fabrication process according to Embodiment 17, and show the process of fabricating N-channel type TFTs. Of course, it is also possible to fabricate P-channel type TFTs by a similar process.

Figure 30A:
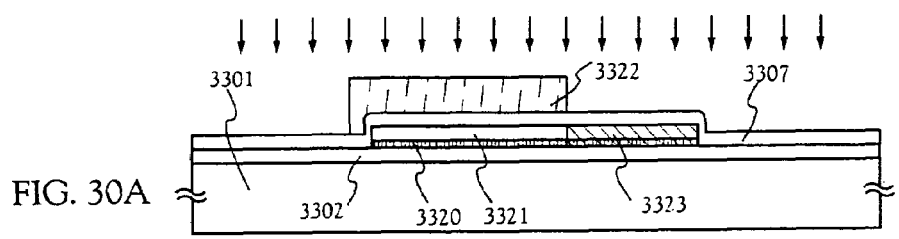
FIGS. 30A to 30D are cross-sectional views for explaining the process of fabricating a TFT using a crystalline semiconductor film according to Embodiment 17.

In the step shown in FIG. 30A, a first crystalline semiconductor film 3320 which contains silicon as its main component and germanium and a second crystalline semiconductor film 3321 which contains silicon as its main component are formed on a substrate 3301, and these crystalline semiconductor films 3320 and 3321 adopt the crystalline semiconductor film fabricated by any of the methods described above in Embodiments 13 to 16. Before the fabrication of a TFT, the crystalline semiconductor films 3320 and 3321 are etched to predetermined sizes and divided into islands for the purpose of separating elements. If the substrate 3301 is a glass substrate, a blocking layer 3302 is provided.

An insulating film 3307 is used as a gate insulating film in the TFT, and is formed to a thickness of 30-200 nm. The insulating film 3307 is formed of a silicon nitride oxide film fabricated from $SiH_4$ and $N_2O$ by a plasma CVD method, or a silicon nitride oxide film fabricated from TEOS and $N_2O$. In Embodiment 17, the former is selected, and is formed to a thickness of 70 nm. Otherwise, the insulating film 3307 may be formed by the method described above in Embodiment 16.

If a lightly doped drain (LDD) region is to be formed, during this step, a mask 3322 is formed and one conductivity type of impurity is added to the first and second crystalline semiconductor films 3320 and 3321 by the ion doping method or the ion implantation method, thereby forming a first impurity region 3323. In the case of an N-channel type TFT, phosphorus is added, and the average concentration of phosphorus in the first impurity region 3323 is in the range of $1 \times 10^{16}$ to $1 \times 10^{19}$ atoms/cm$^3$.

Figure 30B:
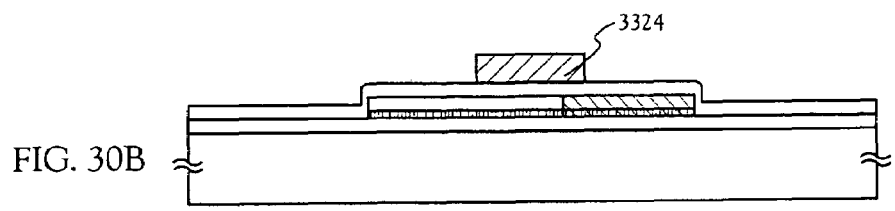

As shown in FIG. 30B, a gate electrode 3324 is formed on the insulating film 3307 from a conductive material containing one or plural kinds of elements selected from among tantalum, tungsten, titanium, aluminum and molybdenum.

Figure 30C:
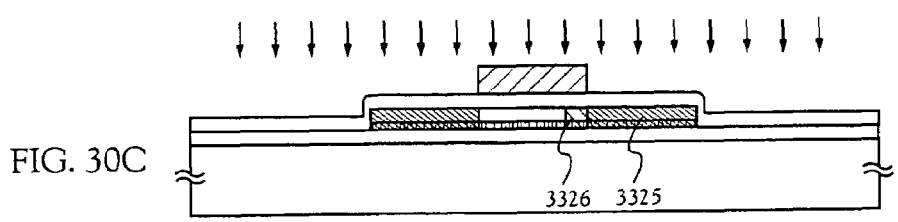

Then, a second impurity region 3325 in which to form the source and drain regions of the TFT is formed as shown in FIG. 30C. The second impurity region 3325 is formed by an ion doping method, and if the TFT is an n-channel type TFT, a group XV element of the periodic table which is represented by phosphorus, arsenic is added, while if the TFT is a p-channel type TFT, a group XIII element of the periodic table which is represented by boron is added.

Figure 30D:
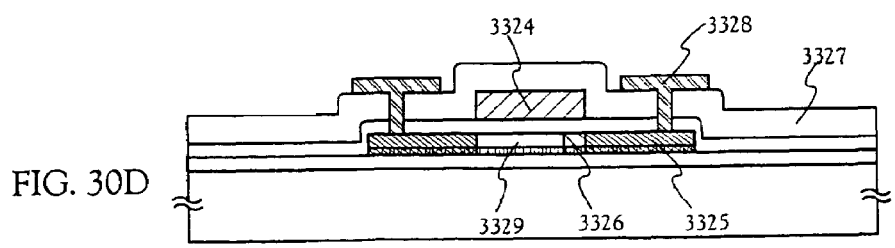

After that, as shown in FIG. 30D, an interlayer insulating film 3327 is formed from a silicon nitride film and a silicon oxide nitride film which are fabricated by a plasma CVD method. The added impurity element needs heat treatment at 350-500° C. for the purpose of activation, but this heat treatment is performed after the formation of the interlayer insulating film 3327 so that hydrogen contained in the silicon nitride film and the silicon oxide nitride film is emitted and diffused in the first and second crystalline semiconductor films 3320 and 3321, whereby the defects in the first and second crystalline semiconductor films 3320 and 3321 can be compensated for by hydrogen. Moreover, source and drain electrodes 3328 are formed to obtain the TFT.

The N-channel type TFT fabricated in this manner has a channel formation region 3329, an LDD region (first impurity region) 3326, and source or drain regions (third impurity region) 3325 formed of the first and second crystalline semiconductor film 3320 and 3321. As shown in FIG. 30C, the LDD region 3326 can be formed to overlap the gate electrode 3324. Of course, it is also possible to form a single-drain structure or an LDD region. TFTs which are fabricated in this manner can be used as TFTs required to fabricate an active matrix type of liquid crystal display device or an EL display device, or TFTs which realize a thin film integrated circuit instead of LSIs fabricated on a related art semiconductor substrate.

Embodiment 18

Embodiment 18 will be described below with reference to FIG. 31 which shows an example of fabrication of a CMOS type of TFT in which an N-channel type TFT 3340 and a P-channel type TFT 3341 are complementarily combined with each other.

In the step shown in FIG. 31A, a first crystalline semiconductor film 3303 which contains silicon as its main component and germanium and a second crystalline semiconductor film 3304 which contains silicon as its main component are formed on the substrate 3301, and these crystalline semiconductor films 3303 and 3304 can adopt the crystalline semiconductor film fabricated by any of the methods described above in Embodiments 13 to 16. If the substrate 3301 is a glass substrate, the blocking layer 3302 is provided. The crystalline semiconductor films 3303 and 3304 are etched to predetermined sizes and divided into islands and semiconductor layer 3305, 3306 are formed for the purpose of separating elements.

A first insulating film 3307 is used as a gate insulating film in the TFT, and is formed to a thickness of 30-200 nm. The first insulating film 3307 is formed of a silicon nitride oxide film fabricated from $SiH_4$ and $N_2O$ by a plasma CVD method, or a silicon nitride oxide film fabricated from TEOS and $N_2O$. In Embodiment 18, the former is selected, and is formed to a thickness of 75 nm. Otherwise, the first insulating film 3307 may be formed by the method described above in Embodiment 16.

Gate electrodes 3308 and 3309 are formed on the first insulating film 3307 from a conductive material containing one or plural kinds of elements selected from among tantalum, tungsten, titanium, aluminum and molybdenum.

Then, to form a lightly doped drain (LDD) region for an n-channel type TFT, phosphorus is doped by an ion doping method as shown in FIG. 31B. The doping gas uses phosphine ($PH_3$) diluted with $H_2$ to 0.1-5%. Although the conditions of doping are appropriately determined, phosphorus is doped so that the average concentration of phosphorus becomes $1\times10^{17}$ to $1\times10^{19}$ atoms/cm$^3$ in each of the first and second impurity regions 3310 and 3311 formed in the semiconductor layers 3305 and 3306. At this time, the gate electrodes 3308 and 3309 serve as masks against phosphorus to be doped, where the impurity regions 3310 and 3311 are formed in a self-aligned manner.

Then, as shown in FIG. 31C, a mask 3312 using a photoresist is formed, and phosphorus is again doped by an ion doping method. The average concentration of phosphorus in each of second impurity regions 3313 and 3314 fabricated by this doping is $1\times10^{20}$ to $1\times10^{21}$ atoms/cm$^3$. In this manner, first impurity regions 3315 formed in the semiconductor layer 3305 become LDD regions, and second impurity regions 3313 become source and drain regions.

Regarding a p-channel type TFT, as shown in FIG. 31D, a mask 3316 using a photoresist is formed and the semiconductor layer 3306 is doped with boron. The doping gas uses diborane ($B_2H_6$) diluted with $H_2$ to 0.1-5%. Boron is doped at a concentration 1.5-3 times as high as the concentration of phosphorus so that n-type conductivity is inverted to p-type conductivity in third impurity regions 3317 to be formed in the semiconductor layer 3306. The average concentration of boron in each of the third impurity regions 3317 is $1.5\times10^{20}$ to $3\times10^{21}$ atoms/cm$^3$. The third impurity regions 3317 formed in the semiconductor layer 3306 in this manner become the source and drain regions of the p-channel type TFT 3314.

After that, an interlayer insulating film 3318 is formed from a silicon nitride film and a silicon nitride oxide film which are fabricated by a plasma CVD method. The added impurity element needs heat treatment at 350-500° C. for the purpose of activation, but this heat treatment is performed after the formation of the interlayer insulating film 3318 so that hydrogen contained in the silicon nitride film and the silicon nitride oxide film is emitted and diffused in the semiconductor layers 3305 and 3306, whereby the defects in the semiconductor layers 3305 and 3306 as well as the surfaces thereof can be compensated for. Moreover, source and drain electrodes 3319 and 3320 are formed to obtain the TFT.

Through the above-described process, it is possible to obtain the CMOS type of TFT in which the n-channel type TFT 3340 and the p-channel type TFT 3341 are complementarily combined with each other. In the n-channel type TFT 3340, the LDD region 3315 is formed between the channel formation region 3321 and each of the source and drain regions 3313, thereby preventing the concentration of electric fields at the drain end. This CMOS type of TFT makes it possible to form a driver circuit for an active matrix type of liquid crystal display device or an EL display device. In the p-channel type TFT 3341, the channel formation region 3322 and the source or drain regions 3317 are formed. This n-channel type TFT or p-channel type TFT can be applied to a transistor which forms a pixel section. Moreover, the n-channel type TFT and the p-channel type TFT can be used as TFTs which realize a thin film integrated circuit instead of LSIs fabricated on a related art semiconductor substrate.

Embodiment 19

By using the TFT fabricating methods described above in Embodiments 17 and 18, it is possible to fabricate an active matrix type of display device having a driver circuit and a pixel section formed on one substrate. One example of such an active matrix type of display device is shown in FIGS. 32 and 33.

Figure 32:
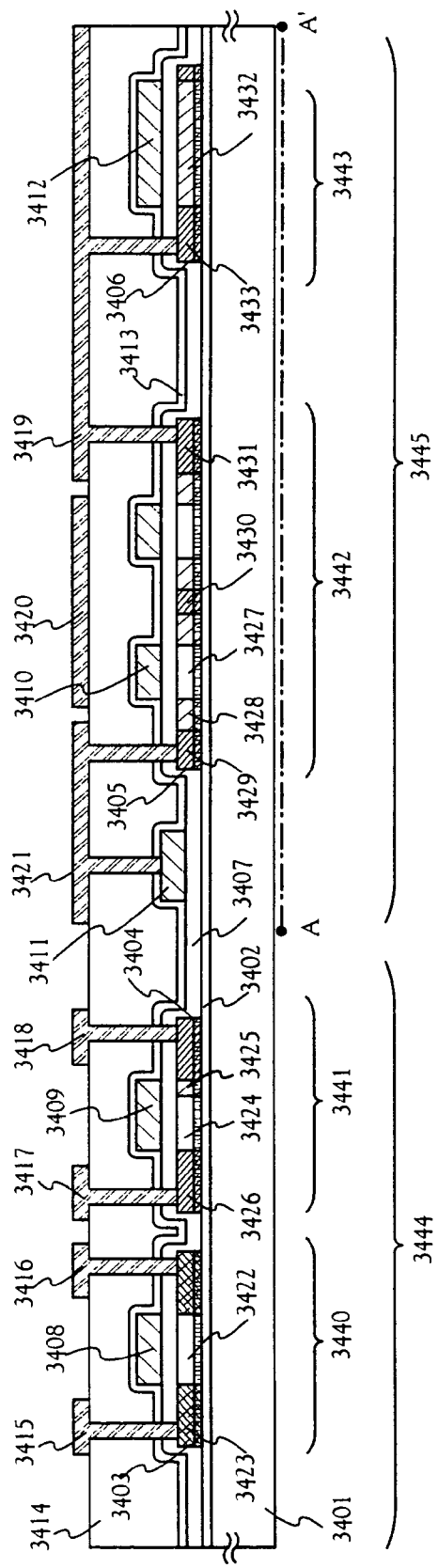
FIG. 32 is a cross-sectional view for explaining the structure of a liquid crystal display device using a crystalline semiconductor film according to Embodiment 19.
Figure 33:
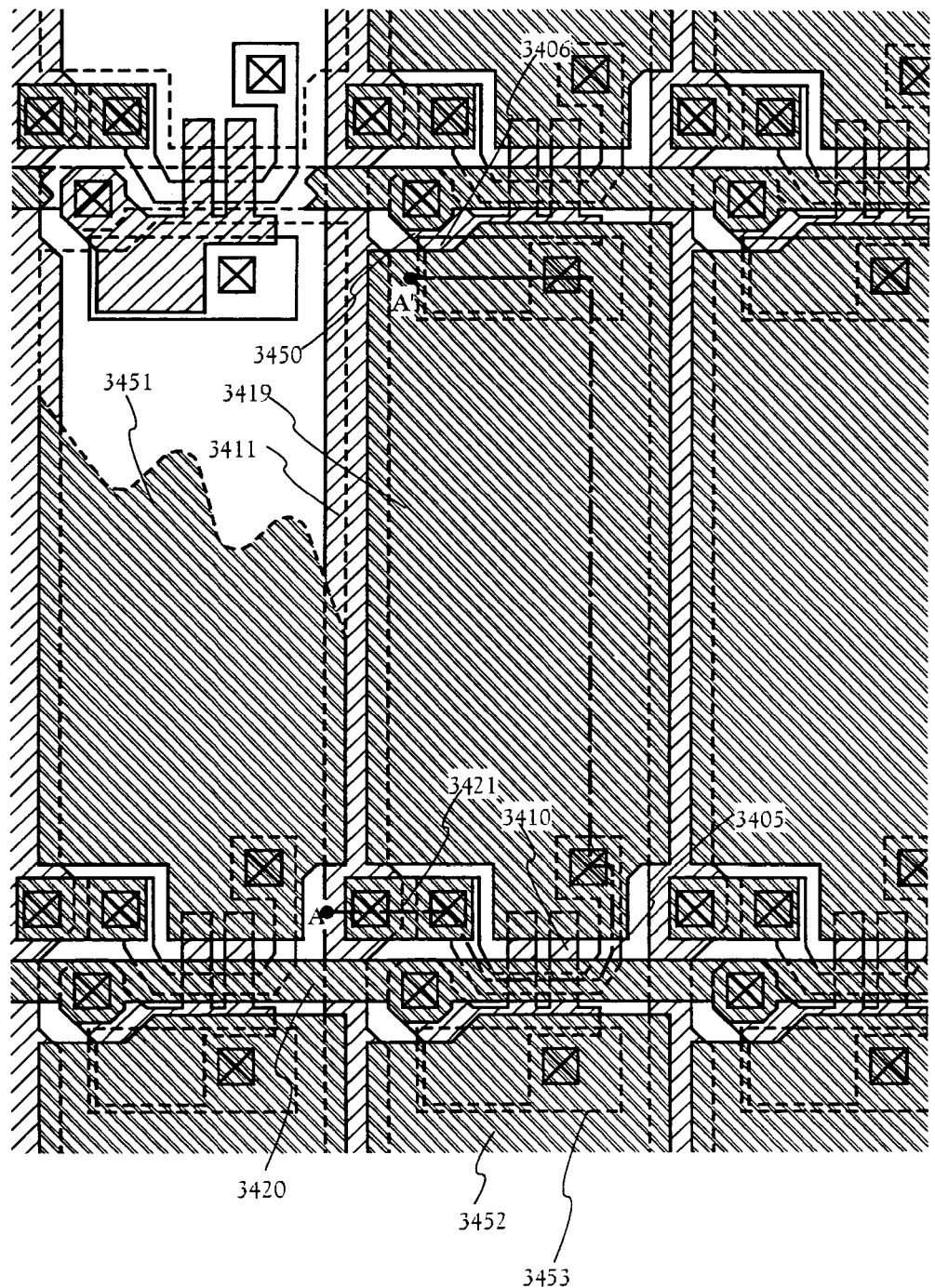
FIG. 33 is a top plan view of a pixel structure in a pixel section of Embodiment 19.

FIG. 32 is a cross-sectional view of a driver circuit 3444 and a pixel section 3445 which are formed on a substrate 3401. A pixel TFT (switching TFT) 3442 in a pixel section 3445 and an n-channel type TFT 3441 and a p-channel type TFT 3440 in a driver circuit 3444 are fabricated by the method described above in any one of Embodiments 13 to 16.

The substrate 3401 shown in FIG. 32 can suitably use a glass substrate such as barium boro-silicate glass or alumina boro-silicate glass. Otherwise, a quartz substrate may also be used. If the glass substrate is used, a blocking layer 3402 is formed.

The structures of the switching pixel TFT 3442 in the pixel section 3445 and the n-channel type TFT 3441 and the p-channel type TFT 3440 in the driver circuit 3444 are not particularly limited, and Embodiment 19 will be described by using TFTs fabricated by a method according to Embodiment 17 or 18.

Source or drain lines 3415 to 3418 are formed in the driver circuit 3444. In the pixel section 3445, a pixel electrode 3419, a gate line 3420, a connecting electrode 3421 and a source line 3411 are formed. A passivation film 3413 formed to overlie gate electrodes 3408 to 3410 is formed to a thickness of 50-200 nm made of a silicon nitride film or a silicon nitride oxide film. An interlayer insulating film 3414 is formed to a thickness of 500-2000 nm out of an inorganic insulating material such as silicon oxide or an organic insulating material such as polyimide or acrylic.

The p-channel type TFT 3440 of the driver circuit 3444 has a channel formation region 3422 and p-type impurity regions 3423 in a semiconductor layer 3403, and the p-type impurity regions 3423 function as the source or drain regions of the p-channel type TFT 3440.

The n-channel type TFT 3441 has in a semiconductor layer 3404 a channel formation region 3424, an n-type impurity region 3425 (GOLD region: Gate Overlapped Drain) which overlaps the gate electrode 3409, and n-type impurity regions 3426 which function as the source or drain regions of the n-channel type TFT 3441.

The pixel TFT 3442 has in a semiconductor layer 3405 a channel formation region 3427, an n-type impurity region (LDD region) 3428 formed outside the gate electrode 3410, and n-type impurity regions 3429, 3430 and 3431 which function as source or drain regions. Further, n-type impurity regions 3432 and 3433 are formed in a semiconductor layer 3406 which functions as one electrode of a storage capacitor 3443.

In the pixel section 3445, the source line 3411 is electrically connected to the source or drain region 3429 of the pixel TFT 3442 by the connecting electrode 3421. The gate line 3420 is electrically connected to the gate electrode 3410. The pixel electrode 3419 is electrically connected to the source or drain region 3431 of the pixel TFT 3442, and is also electrically connected to the impurity region 3433 of the semiconductor layer 3406 which functions as one electrode of the storage capacitor 3443.

The cross-sectional view of the pixel section 3445 shown in FIG. 32 corresponds to a cross section taken along line A-A' of FIG. 33. The gate electrode 3410 serves also as one electrode of a storage capacitor of an adjacent pixel, and forms the storage capacitor in a portion which overlaps a semiconductor layer 3453 connected to a pixel electrode 3452. The arrangement relationship between the source line 3411, the pixel electrode 3419 and an adjacent pixel electrode 3451 is such that the edge portions of the pixel electrodes 3419 and 3451 are disposed on the source line 3411 to form an overlap portion, thereby shielding stray light to enhance light-shielding performance.

Embodiment 20

Embodiment 20 will be described below with reference to FIG. 43 which shows another example of a liquid crystal display device of the monolithic type in which a pixel section and a driver circuit are formed on one substrate. Crystalline semiconductor films to be used for a pixel TFT (switching TFT) 3855 in a pixel section 3852 and an n-channel type TFT 3854 and a p-channel type TFT 3853 in a driver circuit 3851 are fabricated by the method described above in any one of Embodiments 13 to 15.

Figure 43:
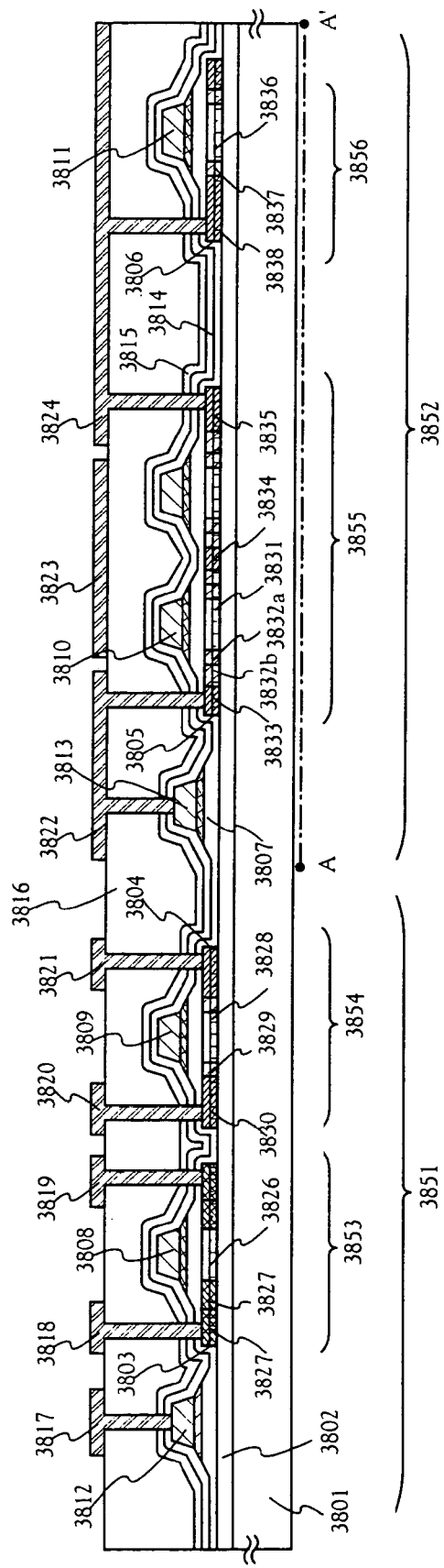
FIG. 43 is a cross-sectional view showing the structure of a liquid crystal display device using a crystalline semiconductor film according to Embodiment 20.

The substrate 3801 shown in FIG. 43 suitably uses a glass substrate such as barium boro-silicate glass or alumina boro-silicate glass. Otherwise, a quartz substrate may also be used. If the glass substrate is used, a blocking layer 3802 is formed. Reference numerals 3814 and 3815 denote passivation films formed of a silicon nitride film or a silicon nitride oxide film. Reference numeral 3816 denotes an interlayer insulating film formed of an inorganic insulating material such as silicon oxide or an organic insulating material such as polyimide or acrylic.

The switching pixel TFT 3855 in the pixel section 3852 and the n-channel type TFT 3854 and the p-channel type TFT 3853 of the driver circuit 3851 have impurity regions formed in a self-aligned manner by using their respective gate electrodes.

Formed in the driver circuit 3851 are lines 3812 and 3817 as well as source and drain lines 3818 to 3821. Formed in the pixel section 3852 are a pixel 3824, a gate line 3823, a connecting electrode 3822 and a source line 3813.

The p-channel type TFT 3853 of the driver circuit 3851 has a channel formation region 3826 and p-type impurity regions 3827 in a semiconductor layer 3803, and the p-type impurity regions 3827 function as the source or drain regions of the p-channel type TFT 3853. The p-type impurity regions 3827 is formed in a self-aligned manner by using a gate electrode 3808.

The n-channel type TFT 3854 has in a semiconductor layer 3804 a channel formation region 3828, an n-type impurity region 3829 which overlaps the gate electrode 3809, and n-type impurity regions 3830 which function as the source or drain regions of the n-channel type TFT 3854. The n-type impurity region 3829 is formed in a self-aligned manner by using the gate electrode 3809.

The pixel TFT 3855 has in a semiconductor layer 3805 a channel formation region 3831, an n-type impurity region 3832a which overlaps the gate electrode 3810, an n-type impurity region (LDD region) 3832b formed outside the gate electrode 3810, and n-type impurity regions 3833, 3834 and 3835 which function as source or drain regions. The n-type impurity regions 3832a are formed in a self-aligned manner by using the gate electrode 3810, and the n-type impurity regions 3832b are formed in a non-self-aligned manner by using a mask. A semiconductor layer 3806 which functions as one electrode of a storage capacitor 3856 is formed in n-type impurity regions 3837 and 3838 as well as a region 3836 to which no impurity is added.

In the pixel section 3852, the source line 3813 is electrically connected to the source or drain region 3833 of the pixel TFT 3855 by the connecting electrode 3822. The gate line 3823 is electrically connected to the gate electrode 3810. The pixel electrode 3824 is electrically connected to the source or drain region 3835 of the pixel TFT 3855 as well as the impurity region 3838 of the semiconductor layer 3806 which constitutes one electrode of the storage capacitor 3856.

The cross-sectional view of the pixel section 3855 taken along line A-A' of FIG. 43 corresponds to the top plan view of the pixels shown in FIG. 33. By using TFTs having the above-described structure, it is possible to form a driver circuit for an active matrix type of liquid crystal display device or an EL display device. This n-channel type TFT or p-channel type TFT can be applied to a transistor which forms a pixel section. Moreover, the n-channel type TFT and the p-channel type TFT can be used as TFTs which realize a thin film integrated circuit instead of LSIs fabricated on a related art semiconductor substrate.

Embodiment 21

An example of an EL (electroluminescence) display device fabricated by using the TFTs obtained in Embodiment 17 or 18 will be described below with reference to FIG. 34.

Figure 34:
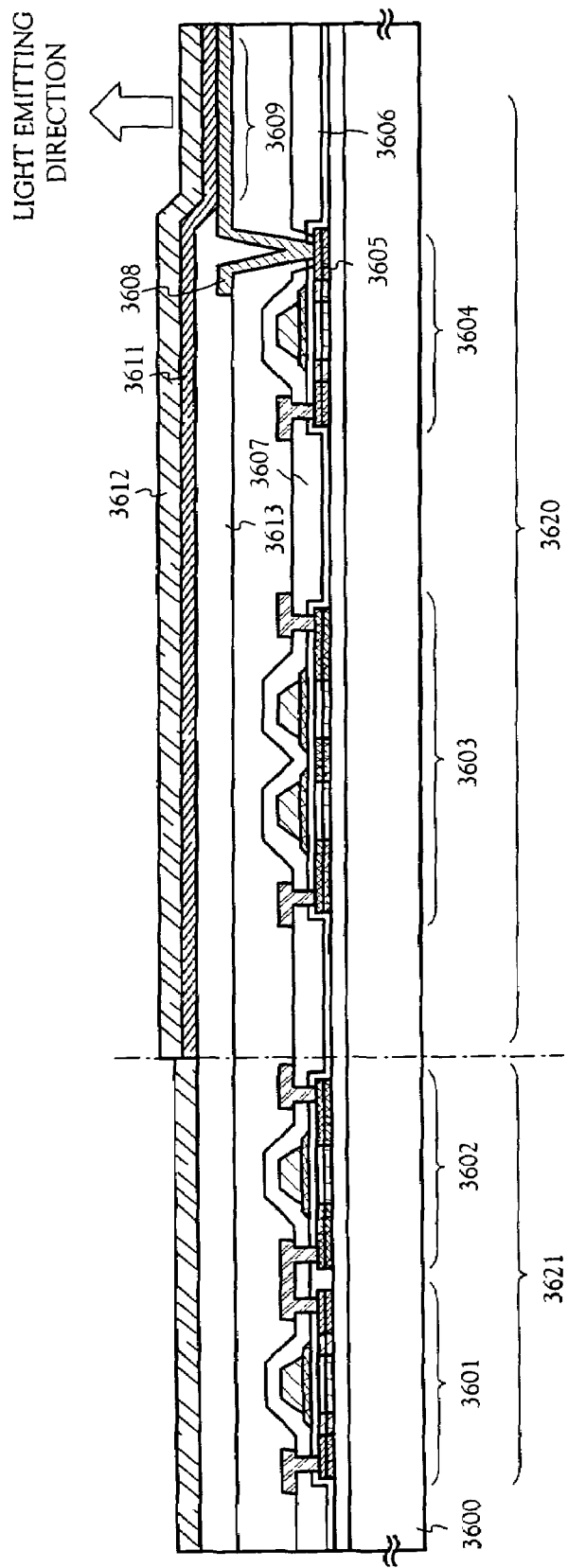
FIG. 34 is a cross-sectional view for explaining the structure of an EL display device using a crystalline semiconductor film according to Embodiment 21.

FIG. 34 shows an example of a light emitting device having an insulator on which a pixel section 3620 and a driver circuit 3621 for driving the pixel section are disposed (the light emitting device is in the state of being not yet sealed). In FIG. 34, a CMOS circuit which constitutes a basic unit for the driver circuit is shown in the driver circuit 3621, and one pixel is shown in the pixel section 3620. This CMOS circuit can be obtained in accordance with Embodiment 18.

In FIG. 34, reference numeral 3600 denotes an insulator, and formed on the insulator 3600 are an n-channel type TFT 3601, a p-channel type TFT 3602, a switching TFT 3603 made of a p-channel type TFT, and a current control TFT 3604 made of an n-channel type TFT. The channel formation regions of these TFTs are formed of a crystalline semiconductor film fabricated on the basis of the invention, and a specific fabrication method is as described above in connection with Embodiments 13 to 16.

Since the n-channel type TFT 3601 and the p-channel type TFT 3602 are as described previously in connection with Embodiment 18, the description of the n-channel type TFT 3601 and the p-channel type TFT 3602 is omitted. The switching TFT 3603 has a structure (double-gate structure) which has two channel formation regions between the source region and the drain region, but the description of the switching TFT 3603 is omitted since it can readily be understood by referring to the description of the structure of the p-channel type TFT in Embodiment 14. Incidentally, Embodiment 21 is not limited to only the double-gate structure, and may also be applied to a single-gate structure in which one channel formation region is formed or a triple-gate structure in which three channel formation regions are formed.

Before a second interlayer insulating film 3607 is formed over a drain region 3605 of the current control TFT 3604, a contact hole is formed in a first interlayer insulating film 3606. This contact hole is intended to facilitate an etching step for forming contact holes in the second interlayer insulating film 3607. The contact holes are formed in the second interlayer insulating film 3607 in such a manner as to reach the drain region 3605, and a pixel electrode 3608 is formed to be connected to the drain region 3605. The pixel electrode 3608 is an electrode which functions as the negative electrode (cathode) of the EL element, and is formed of a conductive film containing an element which belongs to Group I or II of the periodic table. In Embodiment 21, the pixel electrode 3608 uses a conductive film made of a compound of lithium and aluminum.

Then, an insulating film 3613 is formed to cover an end portion of the pixel electrode 3608, and is herein called a bank. The bank 3613 may be formed of a silicon-containing insulating film or a resin film. In the case where a resin film is used, if carbon grains or metal grains are added so that the resistivity of the resin film becomes $1 \times 10^6$ $\Omega$m to $1 \times 10^{12}$ $\Omega$m (preferably $1 \times 10^8$ $\Omega$m to $1 \times 10^{10}$ $\Omega$m), it is possible to suppress the dielectric breakdown of the resin film during the deposition thereof.

An EL element 3609 is made of a pixel electrode (negative electrode) 3608, an EL layer 3611 and a positive electrode (anode) 3612. The positive electrode 3612 uses a conductive film having a large work function, representatively, an oxide conductive film. The oxide conductive film may use any one of indium oxide, zinc oxide and lead oxide, or a compound of these oxides. The term "EL layer" used herein is defined as a stacked body in which an light emitting layer is combined with a hole injection layer, a hole transport layer, a hole blocking layer, an electron transport layer, an electron injection layer or an electron blocking layer.

Incidentally, although not shown, it is advantageous that after the positive electrode 3612 has been formed, a passivation film is formed to completely cover the EL element 3609. The passivation film is made of insulating films such as carbon film, silicon nitride film and silicon nitride oxide film, and uses any one of the insulating films as a single layer or any ones of the insulating films as a stacked layer in which they are combined.

Embodiment 22

Figure 39:
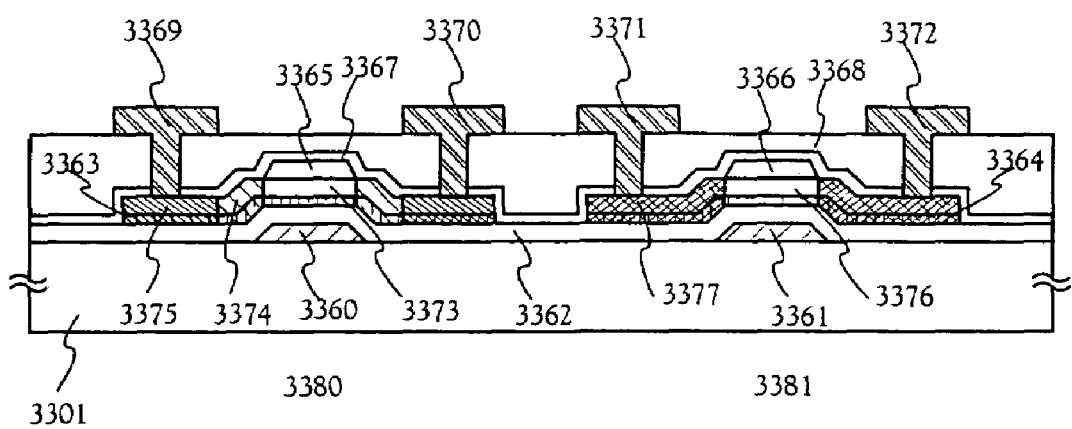
FIG. 39 is a cross-sectional view for explaining the structure of a reversed staggered type of TFT using a crystalline semiconductor film according to Embodiment 22.
Figure 42A:
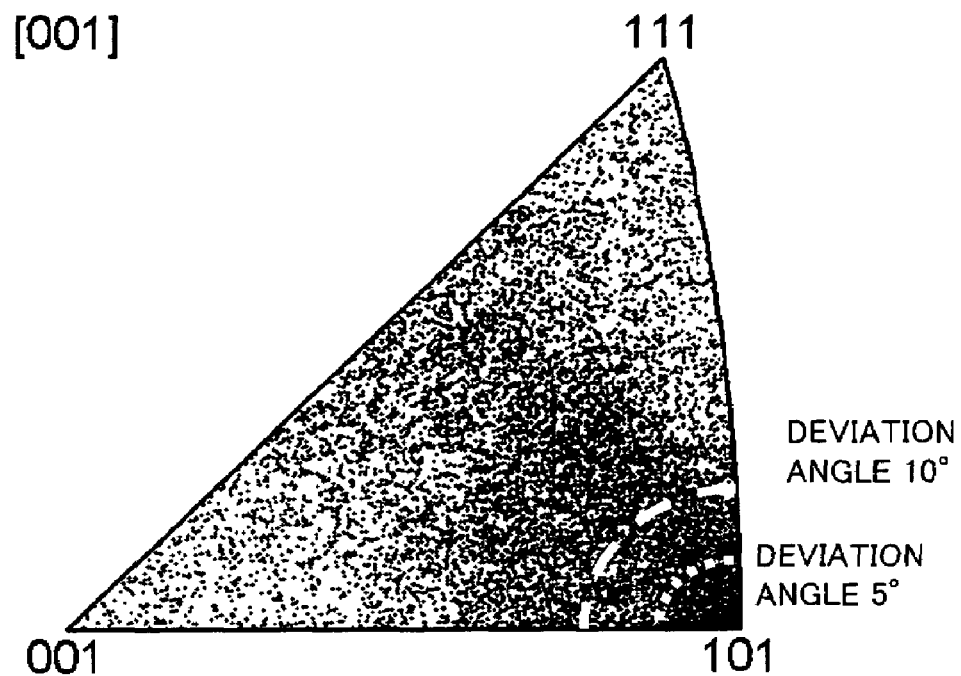
FIGS. 42A and 42B are views showing an example of an inverse pole figure obtainable from an EBSP method of the present invention.
Figure 42B:
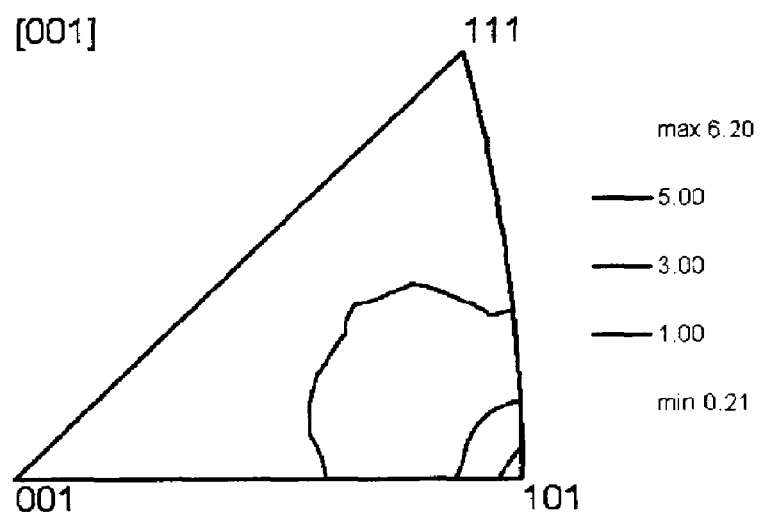

FIG. 39 is a cross-sectional view of a inverted stagger type TFTs fabricated by using a crystalline semiconductor film according to the invention. A first crystalline semiconductor film which contains silicon as its main component and germanium and a second crystalline semiconductor film which contains silicon as its main component can be formed on the insulating surface of a gate insulating film 3362 which is formed to overlie gate electrodes 3360 and 3361 formed on a substrate 3301 such as glass or quartz. The formation of the first and second crystalline semiconductor films can use the fabrication method described above in connection with any of Embodiments 13 to 16.

Each of island-shaped semiconductor layers 3363 and 3364 is formed of a stacked layer which is made of the first crystalline semiconductor film which contains germanium and the second crystalline semiconductor film which contains silicon as its main component. An n-channel type TFT 3380 is fabricated by using the semiconductor layer 3363, and a channel formation region 3373, an LDD region 3374 fabricated by doping an n-type impurity (donor), and source or drain regions 3375 are formed in the n-channel type TFT 3380. A p-channel type TFT 3381 is fabricated by using the semiconductor layer 3364, and a channel formation region 3376 and source or drain regions 3377 formed by doping a p-type impurity (acceptor) are formed in the p-channel type TFT 3381.

Channel protecting films 3365 and 3366 are respectively formed on the channel formation regions 3373 and 3376, and source or drain electrodes 3369-3372 are formed to extend through a passivation film 3367 and an interlayer insulating film 3368. By using the above-described inverted stagger TFT, it is possible to form an active matrix type of liquid crystal display device or an EL display device. In addition, such n-channel type TFTs or p-channel type TFTs can be applied to transistors which forms a pixel section. Moreover, such n-channel type TFTs or p-channel type TFTs can be used as TFTs which realize a thin film integrated circuit instead of LSIs fabricated on a related art semiconductor substrate.

Embodiment 23

Another example of an active matrix type display device fabricated by using a crystalline semiconductor film according to the invention will be described below with reference to FIGS. 40A through 41F. For the sake of simplicity of description, there are shown a CMOS circuit and an n-channel type TFT.

In FIG. 40A, reference numeral 3701 denotes a substrate having heat resistance, and the substrate 3701 may use a quartz substrate, a silicon substrate, a ceramics substrate, or a metal substrate (representatively, a stainless substrate). Whichever of the substrates may be used, an undercoat film (preferably, an insulating film containing silicon as its main component) may also be formed as required.

A semiconductor film having an amorphous structure is formed to a thickness of 20-150 nm (preferably 30-80 nm) by a plasma CVD method, a sputtering method or a reduced-pressure CVD method. In Embodiment 23, a first amorphous semiconductor film which contains silicon as its main component as well as germanium is formed to a thickness of 10 nm, and a second amorphous semiconductor film which contains silicon as its main component is formed to a thickness of 40 nm. If a blocking layer is to be formed, the blocking layer can be formed by the same deposition method as such an amorphous semiconductor film, and both the blocking layer and the amorphous semiconductor film can be continuously formed. After the blocking layer has been formed, the blocking layer is not exposed to the air, whereby it is possible to prevent contamination of the surface of the blocking layer and it is possible to reduce differences among the characteristics of fabricated TFTs or variations in the threshold voltages thereof.

Crystallization is performed by using the method according to Embodiment 13 or Embodiment 14, thereby forming a first crystalline semiconductor film 3702 which contains silicon as its main component and germanium, and a second crystalline semiconductor film 3703 which contains silicon as its main component.

Then, as shown in FIG. 40B, a protective insulating film 3704 of thickness 130 nm made of a silicon oxide film is formed on a second crystalline semiconductor film 3703. Then, to form a gettering region in the first and second crystalline semiconductor films 3702 and 3703, an aperture is formed in the protective insulating film 3704.

A metal element which has been added in the process of crystallization to promote crystallization of silicon is removed by using a gettering effect with phosphorus. As shown in FIG. 40C, phosphorus is implanted into the first and second crystalline semiconductor films 3702 and 3703 by an ion doping method, thereby forming a phosphorus-added region 3705. At this time, the acceleration voltage of doping and the thickness of the protective insulating film 3704 made of the oxide film are optimized to substantially prevent phosphorus from penetrating the protective insulating film 3704. The doping is adjusted so that the concentration of phosphorus becomes $1\times10^{20}$ to $1\times10^{21}$ atoms/cm$^3$.

After that, heat treatment is performed in a nitrogen atmosphere at 600° C. for 1-12 hours (in Embodiment 23, 12 hours), thereby performing gettering of the element. Through this heat treatment, the element (represented by nickel) which promotes crystallization of silicon can be segregated in the phosphorus-added region 3705.

Then, as shown in 40D, the phosphorus-added region 3705 is etched by using the protective insulating film 3704 as a mask. Then, after the protective insulating film 3704 has been removed, a silicon oxide film 3706 is formed to cover the first and second crystalline semiconductor films 3702 and 3703. In Embodiment 23, the silicon oxide film 3706 is formed to a thickness of 20 nm. Then, the silicon oxide film 3706 is thermally oxidized at 950° C. in an oxygen atmosphere, thereby growing a silicon oxide film 3707 as shown in FIG. 40E. Consequently, the thickness of the second crystalline semiconductor film 3709 is decreased by approximately 15 nm. With the growth of this silicon oxide film, excess silicon is forced into the second crystalline semiconductor film 3709, whereby the second crystalline semiconductor film 3709 can be made fine.

Then, as shown in FIG. 40F, the silicon oxide film 3707 is removed to form a mask 3710 which covers a portion in which to form a p-channel type TFT. Regions in which to form n-channel type TFTs in the first and second crystalline semiconductor films 3702 and 3703 are doped with boron (B) as a p-type impurity element for the purpose of controlling the threshold voltages (Vth) of the TFTs. Doping is performed at an acceleration voltage of approximately 30 keV, thereby forming a channel doped region 3711 in which the concentration of boron (B) is approximately $5\times10^{16}$ to $5\times10^{17}$ atoms/cm$^3$. The addition of boron (B) in this step is not necessarily needed, but it can suitably be used as means for accommodating the threshold voltages of the n-channel type TFTs in a predetermined range.

After that, the mask 3710 is removed, and the first and second crystalline semiconductor films 3702 and 3703 are etched to form island-shaped semiconductor layers 3712 to 3714 as shown in FIG. 40G. Although not described in detail, in this step, phosphorus is selectively added to the semiconductor layer 3714 in which to form a storage capacitor in a pixel section, thereby forming an impurity region 3715. Doping is performed at an acceleration voltage of approximately 10 keV, and is adjusted so that the concentration of phosphorus (P) becomes approximately $1\times10^{19}$ to $1\times10^{20}$ atoms/cm$^3$. In Embodiment 23, doping was performed with an ion doping apparatus so that the concentration of phosphorus (P) became approximately $5\times10^{19}$ atoms/cm$^3$.

Then, as shown in FIG. 40H, a first gate insulating film 3716 is formed to cover the semiconductor layers 3712 to 3714. Representatively, the first gate insulating film 3716 may be formed to a thickness of 5-200 nm (preferably, 100-150 nm) out of a silicon nitride film or a silicon nitride oxide film. In Embodiment 23, the first gate insulating film 3716 is formed to a thickness of 40 nm made of a film which contains a silicon oxide film or silicon oxide as its main component.

Then, by etching a portion (storage capacitor) of the first gate insulating film 3716, the semiconductor layer 3714 is partly exposed. After that, a second gate insulating film 3717 is formed. Representatively, the thickness of the second gate insulating film 3717 may be 5-200 nm (preferably, 100-150 nm). In Embodiment 23, the second gate insulating film 3717 is formed to a thickness of 20 nm out of a silicon nitride film.

Then, as shown in FIG. 401, first conductive layers made of n-type polycrystalline silicon and second conductive layers made of a high melting point metal are formed. Then, gate electrodes 3718-3720 (stacked bodies which are respectively made of first conductive layers 3718a-3720a and second conductive layers 3718b-3720b) as well as a storage capacitor 3721 (a stacked body made of a first conductive layer 3721a and a second conductive layer 3721b) are formed from these conductive layers.

Each of the first conductive films is a crystalline semiconductor film having an n-type impurity, and is formed to a thickness of 150 nm by using a CVD method. In this case, each of the second conductive films is a tungsten silicide film, and is formed to a thickness of 150 nm by a sputtering method. In this case, the stacked structure of the silicide film and the polycrystalline silicon film is slightly higher in resistance than a metal film, but is a useful structure which has a high heat resistance and a strong oxidation resistance. Incidentally, the first conductive films may be formed of tantalum nitride (TaN), tungsten nitride (WN), titanium nitride (TiN), molybdenum nitride (MoN), tungsten silicide, titanium silicide or molybdenum silicide, and the second conductive films may be formed of an element selected from among tantalum (Ta), titanium (Ti), molybdenum (Mo) and tungsten (W), or an alloy containing the element as its main component, or an alloy film formed by a combination of arbitrary ones of the elements (representatively, Mo—W alloy film or Mo—Ta alloy film).

Then, as shown in FIG. 41A, the gate electrodes 3718 to 3720 and the storage capacitor 3721 are used as masks, whereby the semiconductor layers 3712 and 3713 and part of the semiconductor layer 3714 are doped with an n-type impurity (donor), thereby forming impurity regions 3722 to 3724. Phosphorus (P) or arsenic (As) may be employed as the n-type impurity (donor). In this step, an ion doping method using phosphine (PH$_3$) was applied for the purpose of adding phosphorus (P). Doping is performed at an acceleration voltage of approximately 40 keV, and is adjusted so that the concentration of phosphorus (P) becomes approximately $5\times10^{17}$ to $5\times10^{18}$ atoms/cm$^3$. In Embodiment 23, doping was performed with an ion doping apparatus so that the concentration of phosphorus (P) in each of the impurity regions 3722-3724 became approximately $1\times10^{18}$ atoms/cm$^3$.

Then, as shown in FIG. 41B, resist masks 3725 to 3727 are formed to cover the semiconductor layer 3712 which becomes a p-channel type TFT as well as part of the semiconductor layers 3713 and 3714 which become n-channel type TFTs. Then, the resist masks 3725 to 3727 are used to dope an n-type impurity into part of the semiconductor layers 3713 and 3714, thereby forming impurity regions 3728 and 3729. The formation of the impurity regions 3728 and 3729 uses an ion doping method using phosphine (PH$_3$). Doping is performed at an acceleration voltage of approximately 40 keV, and is adjusted so that the concentration of phosphorus (P) becomes approximately $5\times10^{19}$ to $5\times10^{20}$ atoms/cm$^3$. In Embodiment 23, the impurity regions 3728 and 3729 are formed so that the concentration of phosphorus (P) in each of the impurity regions 3728 and 3729 become approximately $1\times10^{20}$ atoms/cm$^3$.

In the step shown in FIG. 41C, the resist masks 3725 to 3727 are removed, and portions which become the n-channel type TFTs and a portion which becomes the storage capacitor are covered with a resist mask 3730. Then, the semiconductor layer 3712 is doped with a p-type impurity (acceptor). In Embodiment 23, an impurity region 3731 is formed by an ion doping method using diborane ($B_2H_6$). Doping is performed at an acceleration voltage of approximately 40 keV, and is adjusted so that the concentration of boron (B) becomes approximately $5 \times 10^{19}$ to $5 \times 10^{20}$ atoms/cm$^3$. In Embodiment 23, doping is performed so that the concentration of boron (B) in the impurity region 3731 becomes approximately $1 \times 10^{20}$ atoms/cm$^3$. The impurity region 3731 previously contains phosphorus (P) or boron (B) added in the previous step, but since boron (B) is added at a fully high concentration fully compared to phosphorus (P) or boron (B) added in the previous step, the conductivity type of the impurity region 3731 is reversed and p-type conductivity is ensured.

Then, after the resist mask 3730 has been removed, the insulating film 3732 shown in FIG. 41D is formed. The insulating film 3732 is made of a silicon nitride film, and is formed to a thickness of 70 nm by a CVD method.

Then, by heating under the conditions of 850° C. for 30 minutes in a nitrogen atmosphere, the impurities contained in the impurity regions 3722, 3723, 3724 and 3731 are diffused and spread into portions under the corresponding gate electrodes 3718-3720. In this manner, impurity regions 3747-3749 are respectively formed to be positioned under the gate electrodes 3718-3720. These impurity regions 3745-3747 are so-called LDD regions, and since the respective impurity regions 3747-3749 are formed to overlap the gate electrodes 3718-3720, it is possible to reduce high electric field regions at drain ends and effectively prevent degradation due to hot carriers. The impurity regions are activated by the above-described heat treatment.

Then, as shown in FIG. 41E, a first interlayer insulating film 3733 is formed to a thickness of 500-1500 nm by silicon oxide or silicon nitride oxide. In Embodiment 23, the first interlayer insulating film 3733 is formed to a thickness of 1,000 nm by using silicon nitride oxide. After that, contact holes which reach the source or drain regions formed in the respective semiconductor layers are formed, and source or drain lines 3734-3739 are formed. Incidentally, although not shown, in Embodiment 23, each of the source and drain lines 3734-3739 has a four-layer stacked structure obtained by continuously forming a Ti film 60 nm thick, a nitrogen-containing Ti film 40 nm thick, a Si-containing aluminum film 300 nm thick, and a Ti film 100 nm thick, by a sputtering method.

Moreover, as shown in FIG. 41F, a passivation film 3740 made of a silicon nitride film is formed to a thickness of 100 nm on the first interlayer insulating film 3733 so as to cover the source or drain lines 3734-3739. Then, a second interlayer insulating film 3741 is formed to cover the passivation film 3740. This second interlayer insulating film 3741 is formed of an acrylic resin and has a thickness of 800 nm.

After the second interlayer insulating film 3741 made of an acrylic resin has been heated under the conditions of 150° C. for 0.3 hours, a light-shielding film 3742 of thickness 100 nm which is made of a Ti film or contains Ti at its main component is formed on the second interlayer insulating film 3741. Then, a third interlayer insulating film 3743 is formed on the second interlayer insulating film 3741 so as to cover the light-shielding film 3742. The third interlayer insulating film 3743 is formed of an acrylic resin and has a thickness of 500-1,000 nm. In Embodiment 23, the thickness of the third interlayer insulating film 3743 is made 800 nm.

After that, a pixel electrode 3744 is formed on the third interlayer insulating film 3743, and is connected to the source or drain electrode 3739 via a contact hole. In Embodiment 23, the pixel electrode 3744 is formed to a thickness of 2.8 μm.

The pixel electrode 3744 uses a transparent conductive film. The active matrix type of display device fabricated in the above-described manner has various features in the driver circuit and the pixel section, and can provide a bright high-resolution picture by the synergistic effect of these features, whereby it is possible to provide an electrooptical device having high operating performance and reliability. Thus, high-performance performance electronic equipment provided with such an electrooptical device as a component is obtained.

Embodiment 24

Although the description of Embodiment 15 has referred to an example in which a semiconductor film to which an phosphorus element is added is used as a gettering site, Embodiment 24 provides one example of a gettering method which uses a gettering site a semiconductor film containing a rare gas element or a semiconductor film to which a rare gas element is added. Incidentally, gettering is generally known as a technique which enables a metal impurity incorporated in a semiconductor to be segregated in a gettering site with a certain energy to decrease the impurity concentration of the active region of the element.

The gettering method will be described below with reference to FIGS. 44A to 44E.

First, a crystalline semiconductor film having a high orientation rate with respect to a {101} plane is obtained in accordance with Embodiment 13.

An undercoat insulating film 4001 is formed on a substrate 4000 having an insulating surface, and the undercoat insulating film 4001 is made of insulating film such as silicon oxide film, silicon nitride film or silicon nitride oxide film ($SiO_xN_y$). In Embodiment 24, a glass substrate is used as the substrate 4000, and the undercoat insulating film 4001 has a two-layer structure in which the first silicon nitride oxide film and the second silicon nitride oxide film are formed in a stacked manner, and the first silicon nitride oxide film is deposited to a thickness of 50-100 nm by using $SiH_4$, $NH_3$ and $N_2O$ as reaction gases, while the second silicon nitride oxide film is deposited to a thickness of 100-150 nm by using $SiH_4$ and $N_2O$ as reaction gases. A single layer of silicon nitride film is preferably used as the undercoat insulating film 4001. If a silicon nitride film is used, the silicon nitride film has not only the effect of a blocking layer for preventing an alkali metal contained in the glass substrate from diffusing in a semiconductor film to be formed later, but also the effect of improving gettering efficiency in a gettering step to be performed later. During gettering, since nickel is apt to easily move to a region in which the oxygen concentration is high, it is extremely advantageous to use a silicon nitride film as the undercoat insulating film in contact with the semiconductor film. Otherwise, the undercoat insulating film 4001 may use a stacked structure in which a silicon nitride oxide film and a silicon nitride film are stacked in this order. Otherwise, the undercoat insulating film 4001 may use a three-layer structure in which the first silicon nitride oxide film, the second silicon nitride oxide film and a silicon nitride film are stacked in this order.

Figure 44A:
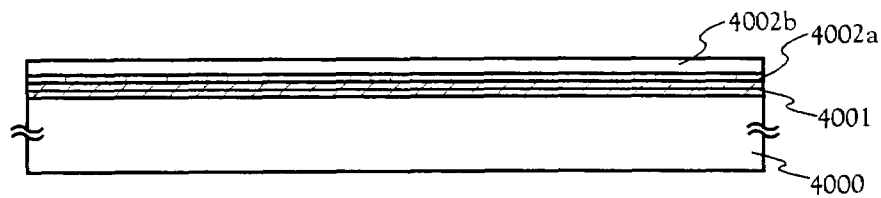
FIGS. 44A to 44E are views showing one example of a gettering method of Embodiment 24.

Then, in accordance with Embodiment 13, a stacked film of amorphous semiconductor films is formed on the undercoat insulating film 4001 by a plasma CVD method, a reduced-pressure CVD method or a sputtering method, and crystallization is performed on the stacked amorphous semiconductor films, thereby forming a first crystalline silicon film 4002a which contains germanium (thickness: 5-30 nm) and a second crystalline silicon film (thickness: 15-70 nm) (FIG. 44A).

Incidentally, during later gettering treatment, since nickel is apt to easily move to a region in which the oxygen concentration is high, it is desirable to form each of the germanium-containing crystalline silicon films 4002a and 4002b so that the oxygen concentration (SIMS analysis) in each of the films 4002a and 4002b becomes $5\times10^{18}$ atoms/cm$^3$ or less.

In addition, after the above-described crystallization, segregated metal elements may be removed or diminished with an etchant containing hydrofluoric acid, for example, rare hydrofluoric acid or FPM (a mixture of hydrofluoric acid, hydrogen peroxide-containing water and pure water). In addition, if the surface of the crystalline semiconductor film is etched with the etchant containing hydrofluoric acid, it is desirable to irradiate the surface with strong light from a lamp light source and flatten the surface.

After the crystallization, the surface may be irradiated with the laser light or the strong light from the lamp light source to improve the crystallization to a further extent. The laser light may use excimer laser light of wavelength 400 nm or less, or the second harmonic and the third harmonic of a YAG or YVO$_4$ laser. After the irradiation with the laser light of the strong light from the lamp light source for improving the crystallization, the segregated metal element may also be removed or diminished with an etchant containing hydrofluoric acid, and further, the surface may be flattened by being irradiated with strong light from the lamp light source.

Then, to remove the metal element contained in the crystalline silicon films 4002a and 4002b which contain germanium, gettering treatment is performed. First, a barrier layer 4003 is formed on the second crystalline silicon film 4002b. As the barrier layer 4003, a porous film is formed which allows the metal element (in Embodiment 24, mainly nickel) to pass to a gettering site through the porous film and can resist penetration of an etching solution to be used in the step of removing the gettering site. In Embodiment 24, a chemical oxide film or a silicon oxide film (SiOx) may be used which is formed by treatment with ozone water. In the present specification, films having such nature are referred to as porous films. The barrier layer 4003 may be a very thin layer or a natural oxidation film, or it may also be an oxide film which is oxidized by ozone being generated by irradiation with ultraviolet rays in an oxygen-containing atmosphere. Otherwise, an oxide film which is formed when irradiation with laser light for improving crystallization after the crystallization is performed may be used as part of the barrier layer 4003.

Figure 44B:
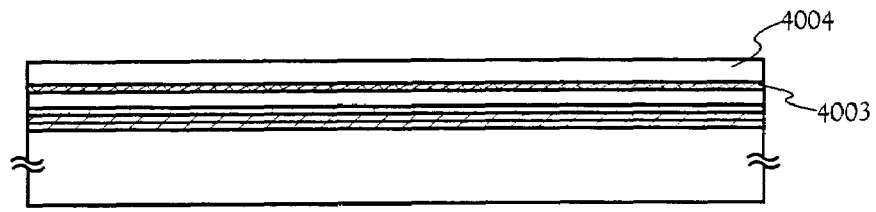

Then, a semiconductor film 4004 which functions as a gettering site during a later gettering treatment is formed on the barrier layer 4003 (FIG. 44B). This semiconductor film 4004 may be a semiconductor film having an amorphous structure formed by using a plasma CVD method, a reduced-pressure CVD method or a sputtering method, or a semiconductor film having a crystalline structure formed by using such a method. The thickness of the semiconductor film 4004 is made 5-50 nm, preferably 10-20 nm. During the later gettering treatment, since nickel is apt to easily move to a region in which the oxygen concentration is high, it is desirable to improve the gettering efficiency by causing the semiconductor film 4004 to contain oxygen (at a concentration of $5\times10^{18}$ atoms/cm$^3$ or more, preferably $1\times10^{19}$ atoms/cm$^3$ or more, by an SIMS analysis). Otherwise, a semiconductor film deposited under the condition of containing a rare gas element may also be applied.

Figure 44C:
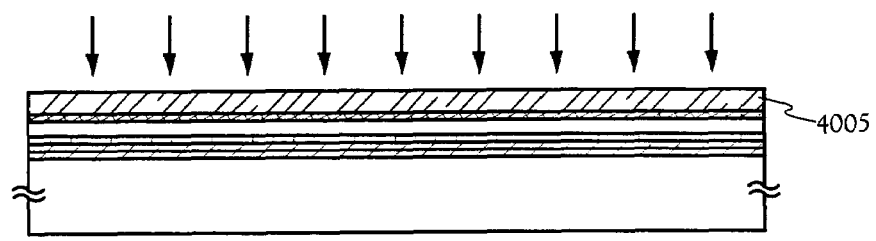

In this step, an amorphous semiconductor film (gettering site) 4005 which contains a rare gas element is formed by a sputtering method (FIG. 44C). In this step, a semiconductor film may be formed which contains a rare gas element at a concentration of $1\times10^{20}$ to $5\times10^{21}$ atoms/cm$^3$, preferably $1\times10^{20}$ to $1\times10^{21}$ atoms/cm$^3$. Incidentally, after deposition has been performed by a plasma CVD method, a sputtering method or the like, a semiconductor film which contains a rare gas element may be formed by adding a rare gas element by an ion doping method or an ion implantation method. Incidentally, the treatment time required to add the rare gas element needs only to be as short as 1 or 2 minutes because a high concentration of rare gas element can be added to the semiconductor film for such a short time. Accordingly, the throughput of the gettering according to Embodiment 24 is remarkably improved compared to the throughput of gettering using phosphorus.

The rare gas element is of one or plural kinds selected from among He, Ne, Ar, Kr and Xe, and by implanting these gas ions into the semiconductor film by accelerating them by an electric field, it is possible to form dangling bonds and lattice strains, thereby forming a gettering site. Among those gas elements, it is desirable to use Ar which is an inexpensive gas.

In addition to the rare gas element, it is possible to add one or plural kinds selected from among H, H$_2$, O, O$_2$, P and B. By adding such plural kinds of elements, the gettering effect can be synergistically obtained.

Then, gettering is performed by heat treatment or by irradiation with strong light from a lamp light source. If gettering is to be performed by heat treatment, heat treatment may be performed in a nitrogen atmosphere at 450-800° C. for 1-24 hours, for example, at 550° C. for 14 hours. If gettering is to be performed by irradiation with strong light from a lamp light source, a heating lamp light source is lit for 1-60 seconds, preferably 30-60 seconds, and this cycle is repeated by 1-10 times, preferably 2-6 times. The emission intensity of the lamp light source may be arbitrary, but it is desirable to instantaneously heat the semiconductor film at 600-1,000° C., preferably, approximately 700-750° C. At the same time as heat treatment, strong light from the lamp light source may also be irradiated.

Figure 44D:

By this gettering, nickel moves in the (vertical) direction of the arrows shown in FIG. 44D, thereby effecting removal of the metal element contained in the crystalline semiconductor film 4002 which is covered with the barrier layer 4003 and contains germanium, or a reduction in the concentration of the metal element. Gettering using the addition of the rare gas element is very advantageous compared to gettering using phosphorus, and since the rare gas element can be added at a far higher concentration, for example, $1\times10^{20}$ to $5\times10^{21}$ atoms/cm$^3$, it is possible to increase the amount of addition of a metal element to be used for crystallization. In other words, by increasing the amount of addition of a metal element to be used for crystallization, it is possible to make far shorter the treatment time of crystallization. On the other hand, if the treatment time of crystallization is not changed, crystallization can be effected at a far lower temperature by increasing the amount of addition of a metal element to be used for crystallization. In addition, by increasing the amount of addition of a metal element to be used for crystallization, it is possible to reduce the occurrence of natural nuclei and form a good crystalline semiconductor film.

After the above-described gettering, a gettering site 4005 made of the semiconductor film is selectively removed by etching. The method of etching is dry etching which does not use plasma due to ClF$_3$, or wet etching using an alkali solution such as an aqueous solution which contains hydrazine or tetraethyl ammonium hydroxide (chemical formula: (CH$_3$)$_4$NOH). During this time, the barrier layer 4003 functions as an etching stopper. The barrier layer 4003 may be removed by hydrofluoric acid at a later time.

Figure 44E:

After that, the obtained crystalline semiconductor film containing germanium is etched into a desired shape, thereby forming a semiconductor layer 4006 which is separated in an island-like shape (FIG. 44E).

Subsequently, a TFT can be finished by a process according to Embodiment 17. The germanium-containing crystalline semiconductor film which is obtained in Embodiment 24 has a high orientation rate with respect to the [101] plane and is fully reduced in the concentration of the metal element in the film, whereby if the film is used as the active layer of the TFT, it is possible to realize superior TFT electrical characteristics.

In the description of Embodiment 24, reference has been made to an example which uses the crystallization of Embodiment 13, but this example is not limitative and the crystallization referred to in Embodiment 14 may also be used.

In addition to the gettering treatment according to Embodiment 24, the gettering treatment referred to in Embodiment 15 may be performed.

Embodiment 24 can be combined with any one of Embodiments 13 to 23.

Embodiment 25

Although the description of Embodiment 15 has referred to an example of the gettering method of adding phosphorus, a rare gas element may be added instead of phosphorus. Incidentally, since all the conditions other than the condition of addition are the same, the detailed description thereof is omitted.

In Embodiment 25, a rare gas element is selectively added to the crystalline silicon film obtained according to Embodiment 13 or Embodiment 14. In Embodiment 25, argon is added by an ion doping method (for example, with a dosage of $5\times10^{15}/cm^2$ or less) to form a region to which argon is added (gettering site). It is desirable that the concentration of a rare gas element added to the gettering site be $1\times10^{20}$ to $5\times10^{21}$ atoms/cm$^3$.

After the gettering site has been formed, it is possible to reduce or remove the metal element contained in the crystalline silicon film by heat treatment or by irradiation with strong light from a lamp light source.

Embodiment 25 can be combined with any one of Embodiments 13 to 24.

Embodiment 26

Driver circuits and pixel sections formed by embodying the invention can be used in various electrooptical devices (active matrix type liquid crystal displays, active matrix type EL displays or active matrix type EC displays). Specifically, the invention can be embodied in electronic equipment of any type in which such an electrooptical device is incorporated in a display part.

Such electronic equipment is a video camera, a digital camera, a digital still camera, a projector (rear type or front type), a head-mounted display (goggle type display), a car navigation system, a car stereo, a personal computer, a television receiving equipment or a mobile information terminal (such as a mobile computer, a mobile telephone or an electronic book). FIGS. 45A-45F, 46A-46D, and 47A-47C show one of its examples.

FIG. 45A shows a personal computer which includes a body 2001, an image input part 2002, a display part 2003, a keyboard 2004 and the like. The invention can be applied to the image input part 2002, the display part 2003 or other driver circuits.

FIG. 45B shows a video camera which includes a body 2101, a display part 2102, a sound input part 2103, operating switches 2104, a battery 2105, an image receiving part 2106 and the like. The invention can be applied to the image receiving part 2106 and other driver circuits.

FIG. 45C shows a mobile computer which includes a body 2201, a camera part 2202, an image receiving part 2203, an operating switch 2204, a display part 2205 and the like. The invention can be applied to the display part 2205 and other driver circuits.

FIG. 45D shows a goggle type display which includes a body 2301, a camera part 2302, arm parts 2303 and the like. The invention can be applied to the display part 2205 and other driver circuits.

FIG. 45E shows a player using a recording medium on which a program is recorded (hereinafter referred to as the recording medium), and the player includes a body 2401, a display part 2402, speaker parts 2403, a recording medium 2404, operating switches 2405 and the like. This player uses a DVD (Digital Versatile Disc), a CD and the like as the recording medium, and enables a user to enjoy music, movies, games and the Internet. The invention can be applied to the display part 2402 and other driver circuits.

FIG. 45F shows a digital camera which includes a body 2501, a display part 2502, an eyepiece part 2503, operating switches 2504, an image receiving part (not shown) and the like. The invention can be applied to the display part 2502 and other driver circuits.

FIG. 46A shows a front type projector which includes a projection device 2601, a screen 2602 and the like. The invention can be applied to a liquid crystal display device 2808 which constitutes part of the projection device 2601 as well as other driver circuits.

FIG. 46B shows a rear type projector which includes a body 2701, a projection device 2702, a mirror 2703, a screen 2704 and the like. The invention can be applied to the liquid crystal display device 2808 which constitutes part of the projection device 2702 as well as other driver circuits.

FIG. 46C shows one example of the structure of each of the projection devices 2601 and 2702 which are respectively shown in FIGS. 46A and 46B. Each of the projection devices 2601 and 2702 is made of a light source optical system 2801, mirrors 2802 and 2804-2806, a dichroic mirror 2803, a prism 2807, a liquid crystal display device 2808, a phase difference plate 2809 and a projection optical system 2810. The projection optical system 2810 is made of an optical system including a projection lens. Embodiment 26 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 46C.

FIG. 46D is a view showing one example of the structure of the light source optical system 2801 shown in FIG. 26C. In Embodiment 26, the light source optical system 2801 is made of a reflector 2811, a light source 2812, lens arrays 2813 and 2814, a polarizing conversion element 2815 and a condenser lens 2816. Incidentally, the light source optical system shown in FIG. 46D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 46A to 46D is of the type using a transparent type of electrooptical device, but there is not shown an example in which the invention is applied to a reflection type of electrooptical device and an EL display device.

Figure 47A:
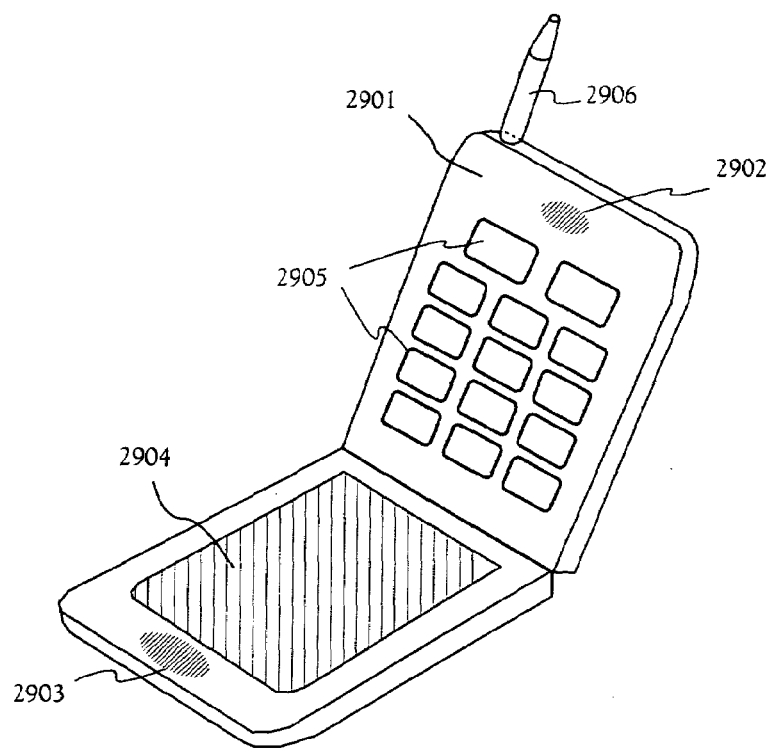
FIGS. 47A to 47C views showing different examples of electronic apparatus of Embodiment 26.
Figure 47B:
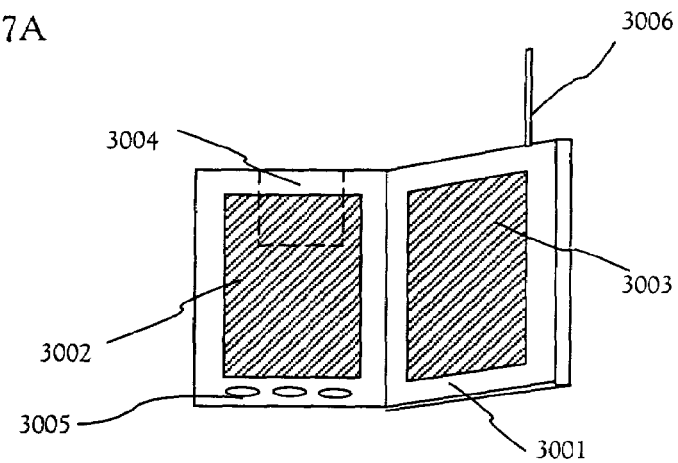

FIG. 47A shows a mobile telephone which includes a body 2901, a sound output part 2902, a sound input part 2903, a display part 2904, operating switches 2905, an anntenna 2906 and the like. The invention can be applied to the sound output part 2902, the sound input part 2903, the display part 2904 and other driver circuits.

FIG. 17B shows a mobile book (electronic book) which includes body 3001, display parts 3002 and 3003, a storage medium 3004, operating switches 3005, an anntenna 3006 and the like. The invention can be applied to the display parts 3002 and 3003 and other driver circuits.

Figure 47C:
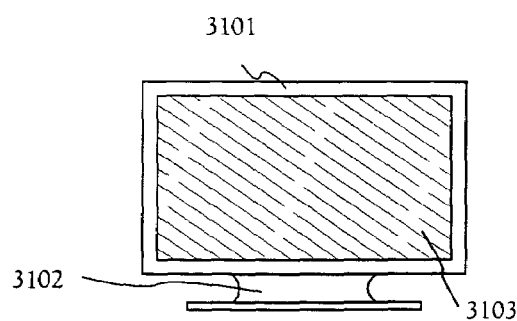

FIG. 47C shows a display which includes a body 3101, a support base 3102, a display part 3103 and the like. The invention can be applied to the display part 3103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 25.

In accordance with the invention, a first amorphous semiconductor film which contains silicon as its main component and germanium the content of which is 0.1 atomic % or more and 10 atomic % or less, and a second amorphous semiconductor film which contains silicon as its main component are stacked and are in turn crystallized by laser treatment, whereby it is possible to obtain good crystalline semiconductor films and it is also possible to form channel formation regions of thin film transistors by using such a crystalline semiconductor film.

TFTs using such a crystalline semiconductor film can be used as TFTs required to fabricate an active matrix type of liquid crystal display device or an EL display device. In addition, TFTs according to the invention can be used as TFTs which realize a thin film integrated circuit instead of LSIs fabricated on a related art semiconductor substrate.

$$\{101\} \text{ ORIENTATION RATIO} = \frac{\text{NUMBER OF MEASURED POINTS WITHIN ALLOWABLE ANGLE BETWEEN LATTICE PLANE } \{101\} \text{ AND FILM SURFACE}}{\text{TOTAL NUMBER OF MEASURED POINTS}} \quad [\text{EQUATION 1}]$$

TABLE 1

| ITEMS | | FIRST AMORPHOUS SEMICONDUCTOR FILM | SECOND AMORPHOUS SEMICONDUCTOR FILM |
|---|---|---|---|
| SiH₄ FLOW AMOUNT | [sccm] | 50~95 | 100 |
| GeH₄(H₂-BASE 10%) FLOW AMOUNT | [sccm] | 50~5 | 0 |
| RF POWER | [W/cm²] | 0.35 | ← |
| PULSE FREQUENCY | [KHz] | 10 | ← |
| DUTY | [%] | 30 | ← |
| PRESSURE | [Pa] | 33.25 | ← |
| SUBSTRATE TEMPERATURE (Tsub) | [° C.] | 300 | ← |
| ELECTRODE GAP (GAP) | [mm] | 35 | ← |

What is claimed is:

1. A method of manufacturing a semiconductor device comprising the steps of:
   forming a first amorphous semiconductor film comprising silicon and germanium on an insulating surface wherein a concentration of the germanium is within a range of 0.1 atom % to 10 atom %;
   forming a second amorphous semiconductor film comprising silicon on the first amorphous semiconductor film;
   providing a metal element in contact with the first amorphous semiconductor film or the second amorphous semiconductor film;
   crystallizing each of the first and second amorphous semiconductor films by heating to form a first crystalline semiconductor film and a second crystalline semiconductor film, respectively;
   forming a semiconductor film containing a rare gas element over the second crystalline semiconductor film;
   performing a heat treatment in a nitrogen atmosphere to remove or reduce the concentration of the metal element in the second crystalline semiconductor film, after forming the semiconductor film containing the rare gas element; and
   forming a gate insulating film on the second crystalline semiconductor film after crystallizing each of the first and second amorphous semiconductor films.

2. A method according to claim 1, further comprising the step of:
irradiating with a laser light to obtain a higher crystallinity of each of the first and second crystalline semiconductor films after the crystallizing step.

3. A method according to claim 1, further comprising the step of:
irradiating with a light from one selected from the group consisting of a halogen lamp, a xenon lamp, a mercury lamp, a metal halide lamp as a light source to obtain a higher crystallinity of each of the first and second crystalline semiconductor films after the crystallizing step.

4. A method according to claim 1,
wherein each of the first and second semiconductor films is formed by a plasma CVD method.

5. A method according to claim 1 further comprising the step of patterning the first amorphous semiconductor film and the second amorphous semiconductor film before crystallizing each of the first amorphous semiconductor film and the second amorphous semiconductor film.

6. A method according to claim 1,
wherein a concentration of oxygen, nitrogen and carbon in the first and second amorphous semiconductor films are less than $1 \times 10^{19}/cm^3$.

7. A method according to claim 1,
wherein the metal element is at least one selected from the group consisting of Fe, Ni, Co, Ru, Rh, Pd, Os, Ir, Pt, Cu and Au.

8. A method according to claim 1,
wherein the first amorphous semiconductor film is thinner than the second semiconductor film.

9. A method according to claim 1, wherein the second amorphous semiconductor film is formed so that a combined thickness of the first and second amorphous semiconductor films is within a range of 20-100 nm.

10. A method of manufacturing a semiconductor device comprising the steps of:
forming a first amorphous semiconductor film comprising silicon and an element having a larger atomic radius than silicon on an insulating surface wherein a concentration of said element is within a range of 0.1 atom % to 10 atom %;
forming a second amorphous semiconductor film comprising silicon on the first amorphous semiconductor film;
providing a metal element in contact with the first amorphous semiconductor film or the second amorphous semiconductor film;
crystallizing each of the first and second amorphous semiconductor films by heating to form a first crystalline semiconductor film and a second crystalline semiconductor film, respectively;
forming a semiconductor film containing a rare gas element over the second crystalline semiconductor film;
performing a heat treatment in a nitrogen atmosphere to remove or reduce the concentration of the metal element in the second crystalline semiconductor film, after forming the semiconductor film containing the rare gas element; and
forming a gate insulating film on the second crystalline semiconductor film after crystallizing each of the first and second amorphous semiconductor films.

11. A method according to claim 10, further comprising the step of:
irradiating with a laser light to obtain a higher crystallinity of each of the first and second crystalline semiconductor films after the crystallizing step.

12. A method according to claim 10, further comprising the step of:
irradiating with a light from one selected from the group consisting of a halogen lamp, a xenon lamp, a mercury lamp, a metal halide lamp as a light source to obtain a higher crystallinity of each of the first and second crystalline semiconductor films after the crystallizing step.

13. A method according to claim 10,
wherein each of the first and second semiconductor films is formed by a plasma CVD method.

14. A method according to claim 10 further comprising the step of patterning the first amorphous semiconductor film and the second amorphous semiconductor film before crystallizing each of the first amorphous semiconductor film and the second amorphous semiconductor film.

15. A method according to claim 10,
wherein a concentration of oxygen, nitrogen and carbon in the first and second amorphous semiconductor films are less than $1 \times 10^{19}/cm^3$.

16. A method according to claim 10,
wherein the metal element is at least one selected from the group consisting of Fe, Ni, Co, Ru, Rh, Pd, Os, Ir, Pt, Cu and Au.

17. A method according to claim 10,
wherein the first amorphous semiconductor film is thinner than the second semiconductor film.

18. A method according to claim 10, wherein the second amorphous semiconductor film is formed so that a combined thickness of the first and second amorphous semiconductor films is within a range of 20-100 nm.

19. A method of manufacturing a semiconductor device comprising the steps of:
forming a first amorphous semiconductor film comprising silicon and germanium on an insulating surface wherein a concentration of the germanium is within a range of 0.1 atom % to 10 atom %;
forming a second amorphous semiconductor film comprising silicon on the first amorphous semiconductor film;
providing a metal element in contact with the first amorphous semiconductor film or the second amorphous semiconductor film;
crystallizing each of the first and second amorphous semiconductor films by irradiating with a laser light;
forming a semiconductor film containing a rare gas element over the second crystalline semiconductor film;
performing a heat treatment in a nitrogen atmosphere to remove or reduce the concentration of the metal element in the second crystalline semiconductor film, after forming the semiconductor film containing the rare gas element; and
forming a gate insulating film on the crystallized second amorphous semiconductor film after crystallizing each of the first and second amorphous semiconductor films.

20. A method according to claim 19 further comprising the step of patterning the first amorphous semiconductor film and the second amorphous semiconductor film before crystallizing each of the first amorphous semiconductor film and the second amorphous semiconductor film.

21. A method according to claim 19,
wherein a concentration of oxygen, nitrogen and carbon in the first and second amorphous semiconductor films are less than $1 \times 10^{19}/cm^3$.

22. A method according to claim 19,
wherein the metal element is at least one selected from the group consisting of Fe, Ni, Co, Ru, Rh, Pd, Os, Ir, Pt, Cu and Au.

23. A method according to claim 19,
wherein the first amorphous semiconductor film is thinner than the second semiconductor film.

24. A method according to claim 19, wherein the second amorphous semiconductor film is formed so that a combined thickness of the first and second amorphous semiconductor films is within a range of 20-100 nm.

25. A method of manufacturing a semiconductor device comprising the steps of:
  forming at least an electrode on an insulating surface;
  forming a gate insulating film covering the electrode;
  forming a fist amorphous semiconductor film comprising silicon and germanium on the gate insulating film wherein a concentration of the germanium is within a range of 0.1 atom % to 10 atom %;
  forming a second amorphous semiconductor film comprising silicon on the first amorphous semiconductor film;
  providing a metal element in contact with the first amorphous semiconductor film or the second amorphous semiconductor film;
  crystallizing each of the first and second amorphous semiconductor films by irradiating with a laser light;
  forming a semiconductor film containing a rare gas element over the second crystalline semiconductor film;
  performing a heat treatment in a nitrogen atmosphere to remove or reduce the concentration of the metal element in the second crystalline semiconductor film, after forming the semiconductor film containing the rare gas element; and
  forming an interlayer insulating film on the crystallized second amorphous semiconductor film after crystallizing each of the first and second amorphous semiconductor films.

26. A method according to claim 25 further comprising the step of patterning the first amorphous semiconductor film and the second amorphous semiconductor film before crystallizing each of the first amorphous semiconductor film and the second amorphous semiconductor film.

27. A method according to claim 25,
wherein a concentration of oxygen, nitrogen and carbon in the first and second amorphous semiconductor films are less than $1\times10^{19}/cm^3$.

28. A method according to claim 25,
wherein the metal element is at least one selected from the group consisting of Fe, Ni, Co, Ru, Rh, Pd, Os, Ir, Pt, Cu and Au.

29. A method according to claim 25,
wherein the first amorphous semiconductor film is thinner than the second semiconductor film.

30. A method according to claim 25, wherein the second amorphous semiconductor film is formed so that a combined thickness of the first and second amorphous semiconductor films is within a range of 20-100 nm.

31. A method of manufacturing a semiconductor device comprising the steps of:
  forming a first amorphous semiconductor film comprising silicon and germanium on an insulating surface wherein a concentration of the germanium is within a range of 0.1 atom % to 10 atom %;
  forming a second amorphous semiconductor film comprising silicon on the first amorphous semiconductor film;
  providing a metal element in contact with the first amorphous semiconductor film or the second amorphous semiconductor film;
  crystallizing each of the first and second amorphous semiconductor films by irradiating with an excimer laser light;
  forming a semiconductor film containing a rare gas element over the second crystalline semiconductor film;
  performing a heat treatment in a nitrogen atmosphere to remove or reduce the concentration of the metal element in the second crystalline semiconductor film, after forming the semiconductor film containing the rare gas element; and
  forming a gate insulating film on the crystallized second amorphous semiconductor film after crystallizing each of the first and second amorphous semiconductor films.

32. A method according to claim 31, further comprising the step of:
  irradiating with a laser light to obtain a higher crystalliity of each of the first and second crystalline semiconductor films after the crystallizing step.

33. A method according to claim 31, further comprising the step of:
  irradiating with a light from one selected from the group consisting of a halogen lamp, a xenon lamp, a mercury lamp, a metal halide lamp as a light source to obtain a higher crystallinity of each of the first and second crystalline semiconductor films after the crystallizing step.

34. A method according to claim 31,
wherein each of the first and second semiconductor films is formed by a plasma CVD method.

35. A method according to claim 31 further comprising the step of patterning the first amorphous semiconductor film and the second amorphous semiconductor film before crystallizing each of the first amorphous semiconductor film and the second amorphous semiconductor film.

36. A method according to claim 31,
wherein a concentration of oxygen, nitrogen and carbon in the first and second amorphous semiconductor films are less than $1\times10^{19}/cm^3$.

37. A method according to claim 31,
wherein the metal element is at least one selected from the group consisting of Fe, Ni, Co, Ru, Rh, Pd, Os, Ir, Pt, Cu and Au.

38. A method according to claim 31,
wherein the first amorphous semiconductor film is thinner than the second semiconductor film.

39. A method according to claim 31, wherein the second amorphous semiconductor film is formed so that a combined thickness of the first and second amorphous semiconductor films is within a range of 20-100 nm.

40. A method of manufacturing a semiconductor device comprising the steps of:
  forming at least an electrode on an insulating surface;
  forming a gate insulating film covering the electrode;
  forming a first amorphous semiconductor film comprising silicon and germanium on the gate insulating film wherein a concentration of the germanium is within a range of 0.1 atom % to 10 atom %;
  forming a second amorphous semiconductor film comprising silicon on the first amorphous semiconductor film;
  providing a metal element in contact with the first amorphous semiconductor film or the second amorphous semiconductor film;
  crystallizing each of the first and second amorphous semiconductor films by irradiating with an excimer laser light;
  forming a semiconductor film containing a rare gas element over the second crystalline semiconductor film;
  performing a heat treatment in a nitrogen atmosphere to remove or reduce the concentration of the metal element in the second crystalline semiconductor film, after forming the semiconductor film containing the rare gas element; and forming an interlayer insulating film on the crystallized second amorphous semiconductor film after crystallizing each of the first and second amorphous semiconductor films.

41. A method according to claim 40, further comprising the step of:

irradiating with a laser light to obtain a higher crystallinity each of the first and second crystalline semiconductor films after the crystallizing step.

42. A method according to claim 40, further comprising the step of:

irradiating with a light from one selected from the group consisting of a halogen lamp, a xenon lamp, a mercury lamp, a metal halide lamp as a light source to obtain a higher crystallinity of each of the first and second crystalline semiconductor films after the crystallizing step.

43. A method according to claim 40, wherein each of the first and second semiconductor films is formed by a plasma CVD method.

44. A method according to claim 40 further comprising the step of patterning the first amorphous semiconductor film and the second amorphous semiconductor film before crystallizing each of the first amorphous semiconductor film and the second amorphous semiconductor film.

45. A method according to claim 40, wherein a concentration of oxygen, nitrogen and carbon in the first and second amorphous semiconductor films are less than $1\times10^{19}/cm^3$.

46. A method according to claim 40, wherein the metal element is at least one selected from the group consisting of Fe, Ni, Co, Ru, Rh, Pd, Os, Ir, Pt, Cu and Au.

47. A method according to claim 40, wherein the first amorphous semiconductor film is thinner than the second semiconductor film.

48. A method according to claim 40, wherein the second amorphous semiconductor film is formed so that a combined thickness of the first and second amorphous semiconductor films is within a range of 20-100 nm.

* * * * *